(12) United States Patent
Saeki

(10) Patent No.: US 6,380,774 B2
(45) Date of Patent: Apr. 30, 2002

(54) CLOCK CONTROL CIRCUIT AND CLOCK CONTROL METHOD

(75) Inventor: Takanori Saeki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/815,846

(22) Filed: Mar. 23, 2001

(30) Foreign Application Priority Data

Mar. 24, 2000 (JP) .......................................... 12-083579

(51) Int. Cl.[7] .............................................. H03B 19/00
(52) U.S. Cl. ........................ 327/119; 327/116; 327/120
(58) Field of Search ............................... 327/116, 119, 327/120, 121, 231, 233, 235, 236, 291, 293; 377/47, 48

(56) References Cited

U.S. PATENT DOCUMENTS

| 6,031,886 A | * | 2/2000 | Nah et al. .................... 375/375 |
| 6,052,004 A | * | 4/2000 | Saeki ......................... 327/119 |
| 6,259,259 B1 | * | 7/2001 | Kriz et al. .................. 327/269 |

* cited by examiner

Primary Examiner—Timothy P. Callahan
Assistant Examiner—An T. Luu

(57) ABSTRACT

A clock control circuit which includes a frequency multiplying interpolator for generating and outputting multiphase clocks by frequency multiplying an input clock; a switch for outputting two of the multiphase clocks input thereto from the frequency multiplying interpolator; a fine adjusting interpolator, to which the two outputs from the switch are applied, for outputting a signal obtained by internally dividing the phase difference between the two outputs; and a control circuit for controlling the switching of the switch and varying the internal-division ratio of the fine adjusting interpolator.

44 Claims, 27 Drawing Sheets

7: CONTROL SIGNAL
5: 4-PHASE-CLOCK FREQUENCY MULTIPLYING CIRCUIT

PULSE-WIDTH CORRECTION CIRCUIT

MULTIPLEXING CIRCUIT

TIMING-DIFFERENCE
DIVIDING CIRCUIT 4a1

TIMING-DIFFERENCE
DIVIDING CIRCUIT 4a2

FIG. 13(a) DIRECT CLOCK-CYCLE INTERNAL-DIVISION METHOD
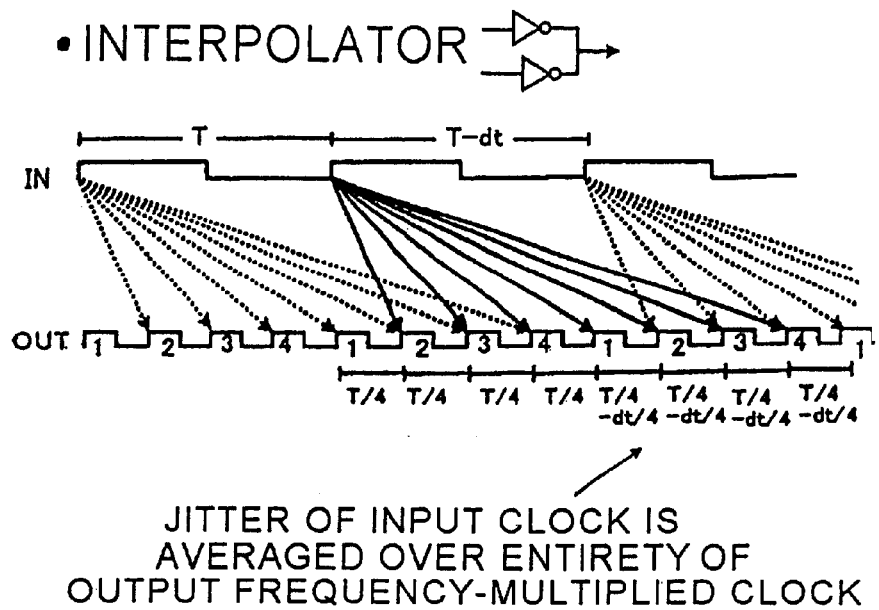
JITTER OF INPUT CLOCK IS AVERAGED OVER ENTIRETY OF OUTPUT FREQUENCY-MULTIPLIED CLOCK
FIG. 13(b)
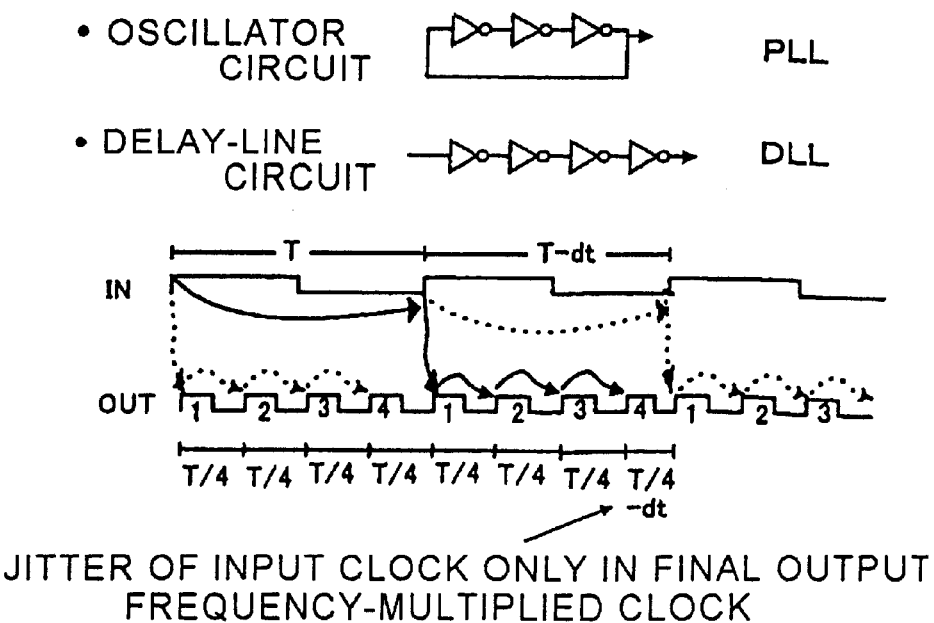
JITTER OF INPUT CLOCK ONLY IN FINAL OUTPUT FREQUENCY-MULTIPLIED CLOCK

CLOCK CONTROL CIRCUIT AND CLOCK CONTROL METHOD

FIELD OF THE INVENTION

This invention relates to clock control technology and, more particularly, to a clock control circuit and method using an interpolator for frequency multiplication.

BACKGROUND OF THE INVENTION

In order to deal with an increase in the scale of circuitry that can be integrated on a single chip and in order to handle higher operating frequencies, semiconductor integrated circuits which include a synchronizing circuit that operates upon being supplied with a clock are provided with a clock control circuit for controlling phase and frequency of clocks externally and internally of the chip.

A PLL (Phase-Locked Loop) or a DLL (Delay-Locked Loop) is used conventionally as such a clock control circuit. In semiconductor circuits having system-scale circuitry on a single chip such as an LSI chip (referred to also as a "system on silicon"), it is now necessary to provide a clock control circuit for phase and frequency control for each macroblock within the chip, by way of example.

In addition to use of a PLL or DLL as the conventional clock control circuit, as set forth above, it is also known to use a combination of a PLL or DLL and an interpolator.

FIG. 25 is a block diagram illustrating the structure of a clock control circuit, which comprises a combination of a PLL and an interpolator, described in Reference 1 (ISSC 1993 pp. 160–161, Mark Horowitz et al., "PLL Design for a 500 MB/s Interface"). As shown in FIG. 25, a PLL 50 outputs multiphase clock signals P0 to Pn synchronized to an input clock 1. The multiphase clock signals P0 to Pn are input to a switch (selector) 20A. Two mutually adjacent signals (of even and odd phases) selected by the switch 20A enter an interpolator (a phase interpolator) 30A, which delivers an output signal OUT obtained by internally dividing the phase difference between these two input signals. The switch 20A that selects the pair of signals input to the interpolator 30A comprises an even-phase selector, a shift register for supplying a selection control signal to the even-phase selector, an odd-phase selector and a shift register for supplying a selection control signal to the odd-phase selector.

In the arrangement described in Reference 1, the interpolator 30A has an analog structure comprising a differential circuit that receives two inputs. A control circuit 40A has an FSM (Finite State Machine) circuit for monitoring phase to check which of the two signals is earlier in phase and for outputting a count signal to an up/down counter (not shown), and a DA converter (not shown) for converting the output of the up/down counter to an analog signal. The DA circuit supplies the interpolator 30A with a current corresponding to the even/odd phase. The PLL 50 comprises a phase comparator circuit, a loop filter, a voltage-controlled oscillator to which the voltage of the loop filter is input as the control voltage, and a frequency divider for frequency dividing the output of the voltage-controlled oscillator and feeding the resultant signal back to an input of the phase comparator circuit.

FIG. 26 is a block diagram illustrating an example of a clock control circuit, which comprises a combination of a DLL and an interpolator, described in Reference 2 (ISSCC 1997 pp. 332–333, S. Sidiropoulos and Mark Horowitz et al., "A semi-digital delay locked loop with unlimited phase shift capability and 0.08–400 MHz operating range"). As shown in FIG. 26, a PLL 60 outputs multiphase clock signals P0 to Pn synchronized to the input clock 1. The multiphase clock signals P0 to Pn are input to a switch 20B. Two mutually adjacent signals enter an interpolator 30B, which delivers an output signal OUT obtained by internally dividing the phase difference between these two signals. On the basis of the result of detecting a phase difference between the output OUT and a reference clock, a control circuit 40B exercises control to vary the internal-division ratio of the interpolator 30B and controls the switching of the switch 20B. The interpolator 30B also is implemented by analog circuits.

FIG. 27 is a block diagram showing an arrangement described in Reference 3 (ISSCC 1997 pp. 238–239, Alan Fiedler, "A 1.0625 Gb/s Transceiver with 2x-Oversampling and Transmit Signal Pre-Emphasis"). This arrangement includes a voltage-controlled oscillator (VCO) 70 to which a clock is input for a adjusting the phase of multiphase clock signals, and a control circuit 40C. Multiphase clock signals Q0 to Qn are delivered from the output side of the VCO 70.

SUMMARY OF THE DISCLOSURE

The clock control circuits according to the prior art described above have a number of problems described below.

In the implementation shown in FIG. 25 using the PLL, phase adjustment requires an extended period of time and jitter is produced by the feedback loop. The jitter causes a large shift in phase, which also occurs when the PLL is unlocked. In the implementations of FIG. 25 and 27, phase error occurs owing to a fluctuation in the center frequency of the VCO.

In the implementation shown in FIG. 26 using the DLL, there are occasions where the clock signal of the final phase of the multiphase clock signals develops a large shift. Loop jitter also occurs.

As shown in (b) of FIG. 13, with a DLL or the like, input-clock jitter (jitter–dt, which causes the clock period to become T—dt) appears in the last clock signal of the output clock (the cycle of the fourth clock pulse of a clock whose frequency has been multiplied by four is T/4–d). As a consequence, the influence of jitter is great.

Accordingly, an object of the present invention, in one aspect, is to provide a clock control circuit and method as well as a semiconductor integrated circuit device in which center-frequency fluctuation caused when a PLL is used and jitter due to a feedback loop are eliminated to thereby reduce phase error to a major degree.

Another object of the present invention is to provide a clock control circuit and method whereby multiphase clock signals can be generated in an instant.

According to a first aspect of the present invention, there is provided a clock control circuit comprising:

a frequency multiplying interpolator, which includes a plurality of circuits each of which is for outputting a signal obtained by internally dividing a phase difference between two signals, for generating a plurality of frequency-multiplied clocks, which have phases that differ from one another, from an input clock; and at least one phase adjusting interpolator, to which are input two clocks from among the plurality of frequency-multiplied clocks of different phases output from the frequency multiplying interpolator, for outputting a signal obtained by internally dividing a phase difference between these two clocks.

According to a second aspect of the invention, there is provided a clock control circuit comprising:

(a) a frequency multiplying interpolator, which includes a plurality of circuits each of which is for outputting a signal obtained by internally dividing a phase difference between two signals, for generating multiphase clocks obtained by frequency multiplying an input clock;

(b) a switch, to which the multiphase clocks output from the frequency multiplying interpolator are input, for selectively outputting at least a pair of clocks from among the multiphase clocks;

(c) at least one phase adjusting interpolator, to which the pair of clocks output from the switch is input, for outputting a signal obtained by internally dividing a phase difference between the pair of clocks; and (d) a control circuit for controlling a setting of an internal-division ratio of the phase adjusting interpolator and switching of a clock output by the switch.

According to a third aspect of the present invention, there is provided a clock control circuit comprising:

(a) a frequency multiplying interpolator, which includes a plurality of circuits each of which is for outputting a signal obtained by internally dividing a phase difference between two signals, for generating multiphase clocks obtained by frequency multiplying an input clock;

(b) one or a plurality of switches, to which the multiphase clocks output from the frequency multiplying interpolator are input, for outputting pairs of clocks of combinations selected from among the multiphase clocks;

(c) a plurality of phase adjusting interpolators, to respective ones of which the plurality of pairs of clocks selectively output from the switch are input, for outputting signals obtained by internally dividing a phase difference between each pair of clocks; and (d) a control circuit for controlling a setting of an internal-division ratio of each of the phase adjusting interpolators and switching of a clock output by the switch.

According to a fourth aspect of the invention, there is provided an interpolator comprising:

a logic circuit, to which first and second input signals are applied, for outputting result of a predetermined logical operation between the first and second input signals;

a first switch element connected between a first power supply and an internal node and having an output signal of the logic circuit input to a control terminal thereof; and a buffer circuit having an input terminal connected to the internal node for inverting an output logic value if a size relationship between potential of the internal node and a threshold value reverses;

a plurality of series circuits being connected in parallel between the internal node and a second power supply, each of the series circuits comprising a first constant-current source a second switch element turned on and off by the first input signal and a third switch element turned on and off by a control signal applied to a control terminal thereof;

a plurality of series circuits being connected in parallel between the internal node and the second power supply each of the series circuits comprising a second constant-current source, a fourth switch element turned on and off by the second input signal and a fifth switch element turned on and off by a control signal applied to a control terminal thereof;

a plurality of series circuits being connected in parallel between the internal node and the second power supply, each of the series circuits comprising a sixth switch element and a capacitor;

capacitance applied to the internal node being decided by turning on and off the sixth switch element by a cycle control signal applied to a control terminal thereof;

an output signal corresponding to a phase obtained by internally dividing a phase difference between the first input signal and the second input signal being delivered from the buffer circuit in dependence upon a combination of values of the control signals applied to the control terminals of the third switch elements and to the control terminals of the fifth switch elements.

According to a 5th aspect of the present invention, there is provided a clock control method comprising the steps of:

reducing jitter of a frequency-multiplied clock by generating multiphase clocks which are obtained by frequency multiplying an input clock, using a frequency multiplying interpolator which includes a plurality of circuits each of which is for outputting a signal obtained by internally dividing a phase difference between two signals;

selecting two of the multiphase clocks, which are output from the frequency multiplying interpolator, by a switch and supplying the two clocks to a phase adjusting interpolator;

outputting from the phase adjusting interpolator a clock obtained by internally dividing a phase difference between the two clocks; and performing control to vary an internal-division ratio of the phase adjusting interpolator based upon result of a phase comparison between a predetermined reference clock and an output clock of the phase adjusting interpolator.

According to a 6th aspect of the present invention, there is provided a clock control method using first, second and third interpolators each of which outputs a signal obtained by internally dividing a phase difference between two signals input thereto, the method comprising the steps of:

inputting a common data signal, which is transferred in sync with a clock signal to the first interpolator for delaying the data signal and then outputting the same;

inputting the clock signal to the second interpolator for outputting a clock signal obtained by internally dividing a timing difference between a leading edge and a trailing edge of a clock pulse;

inputting the clock signal to the third interpolator for outputting a clock signal obtained by internally dividing a timing difference between a trailing edge of the clock pulse and a leading edge of an ensuing clock pulse; and latching data that is output from the first interpolator using a clock, which is obtained by multiplexing output signals from the second and third interpolators, as a latch timing pulse, and automatically adjusting latch timing to an optimum position with respect to the data independently of a fluctuation in duty of the clock signal.

According to a 7th aspect of the present invention, there provided a clock control circuit comprising:

a multiphase clock generating circuit for generating and outputting multiphase clocks from an input clock or generating and outputting multiphase clocks by frequency multiplying the input clock;

a plurality of switches, to which the multiphase clocks output from the frequency multiplying interpolator are input for selecting and outputting pairs of clocks;

a plurality of interpolators, to respective ones of which the pairs of clocks output from the switch are input, for outputting signals obtained by internally dividing a phase difference between respective ones of the pairs of clocks; and a control circuit for controlling a setting of an internal-division ratio of each of the interpolators and switching of a clock output by each of the switches;

a clock output from one of the interpolators being adjusted in phase so as to have a predetermined phase difference with respect to the input clock, and clocks output from the other of the interpolators being adjusted in phase so as to have a predetermined phase difference with respect to the input clock or with respect to an output clock of yet another interpolator.

According to a 8th aspect of the present invention, there is provided a clock control circuit comprising:

a multiphase clock generating circuit for generating and outputting multiphase clocks from an input clock or generating and outputting multiphase clocks by frequency multiplying the input clock;

first and second switches, to which the multiphase clocks output from the frequency multiplying interpolator are input, for selecting and outputting pairs of clocks;

a first interpolator, to which the pair of clocks output from the first switch is input, for outputting a clock signal obtained by internally dividing a phase difference between the pair of clocks and applying a phase adjustment;

a second interpolator, to which the pair of clocks output from the second switch is input, for outputting a clock signal obtained by internally dividing a phase difference between the pair of clocks and applying a phase adjustment;

a phase comparator circuit for detecting a phase difference between an output of the first interpolator and the input clock;

a filter for smoothing a signal representing the result of the phase comparison output from the phase comparator circuit;

a first counter for counting up and counting down based upon the signal representing the result of the phase comparison output from the filter; and a second counter, which is set to an offset value, for counting up and counting down based upon the signal representing the result of the phase comparison output from the filter;

setting of an internal-division ratio of the first interpolator and switching of a clock output by the first switch being performed based upon an output from the first counter; and setting of an internal-division ratio of the second interpolator and switching of a clock output by the second switch being performed based upon an output from the second counter.

According to a 9th aspect of a clock control circuit comprising:

a multiphase clock generating circuit for generating and outputting multiphase clocks from an input clock or generating and outputting multiphase clocks by frequency multiplying the input clock;

first and second switches, to which the multiphase clocks output from the frequency multiplying interpolator are input, for selecting and outputting pairs of clocks;

a first interpolator, to which the pair of clocks output from the first switch is input, for outputting a clock signal obtained by internally dividing a phase difference between the pair of clocks and applying a phase adjustment;

a second interpolator, to which the pair of clocks output from the second switch is input, for outputting a clock signal obtained by internally dividing a phase difference between the pair of clocks and applying a phase adjustment;

the second interpolator having an output to which is connected a clock transmission path supplied with a clock;

the first interpolator having an output to which is connected a dummy circuit having a delay time equivalent to that of the clock transmission path;

a phase comparator circuit for detecting a phase difference between an output of the dummy circuit and the input clock;

a filter for smoothing a signal representing the result of the phase comparison output from the phase comparator circuit;

a first counter for counting up and counting down based upon the signal representing the result of the phase comparison output from the filter;

a first decoder for decoding an output count from the first counter;

an adder circuit for adding the output count from the first counter and an input offset value; and a second decoder for decoding an output from the adder circuit;

setting of an internal-division ratio of the first interpolator and switching of a clock output by the first switch being performed based upon an output from the first decoder; and setting of an internal-division ratio of the second interpolator and switching of a clock output by the second switch being performed based upon an output from the second decoder.

According to a 10th aspect of the present invention, there is a clock control circuit comprising:

a multiphase clock generating circuit for generating and outputting multiphase clocks from an input clock or generating and outputting multiphase clocks by frequency multiplying the input clock;

first, second and third switches, to which the multiphase clocks output from the frequency multiplying interpolator are input, for selecting and outputting pairs of clocks;

first, second and third interpolators, to which the pairs of clocks output from the first, second and third switches, respectively, are input, for outputting clock signals obtained by internally dividing a phase difference between respective ones of the pairs of clocks and applying a phase adjustment;

the third interpolator having an output to which is connected a clock transmission path supplied with a clock;

a first phase comparator circuit for detecting a phase difference between an output of the first interpolator and the input clock;

a first filter for smoothing a signal representing the result of the phase comparison output from the first phase comparator circuit;

a first counter for counting up and counting down based upon the signal representing the result of the phase comparison output from the first filter;

a first decoder for decoding an output count from the first counter;

an adder circuit for adding the output count from the first counter and an input offset value;

a second decoder for decoding an output from the adder circuit;

setting of an internal-division ratio of the first interpolator and switching of a clock output by the first switch being performed based upon a decoded output from the first decoder;

setting of an internal-division ratio of the second interpolator and switching of a clock output by the second switch being performed based upon a decoded output from the second decoder;

a second phase comparator circuit for detecting a phase difference between an output of the clock transmission path and the output of the second interpolator;

a second filter for smoothing a signal representing the result of the phase comparison output from the second phase comparator circuit;

a second counter for counting up and counting down based upon the signal representing the result of the phase comparison output from the second filter; and a third decoder for decoding an output count from the second counter;

setting of an internal-division ratio of the third interpolator and switching of a clock output by the third switch being performed based upon a decoded output from the third decoder.

According to a 11th aspect of the present invention, there is provided a clock control circuit comprising:

a multiphase clock generating circuit for generating and outputting multiphase clocks from an input clock or generating and outputting multiphase clocks by frequency multiplying the input clock;

first, second, third and fourth switches, to which the multiphase clocks output from the frequency multiplying interpolator are input, for selecting and outputting pairs of clocks;

first, second, third and fourth interpolators, to which the pairs of clocks output from the first, second, third and fourth switches, respectively, are input, for outputting clock signals obtained by internally dividing a phase difference between respective ones of the pairs of clocks and applying a phase adjustment;

the fourth interpolator having an output to which is connected a clock transmission path supplied with a clock;

a first phase comparator circuit for detecting a phase difference between the rising edge of an output of the first interpolator and the rising edge of the input clock;

a first filter for smoothing a signal representing the result of the phase comparison output from the first phase comparator circuit;

a first counter for counting up and counting down based upon the signal representing the result of the phase comparison output from the first filter;

a second phase comparator circuit for detecting a phase difference between an output of the clock transmission path and the falling edge of a signal obtained by inverting the input clock by an inverting circuit;

a second filter for smoothing a signal representing the result of the phase comparison output from the second phase comparator circuit;

a second counter for counting up and counting down based upon the signal representing the result of the phase comparison output from the second filter;

an averaging circuit for averaging an output count from the first counter and an output count of the second counter;

a first decoder for decoding an output from the first counter;

a second decoder for decoding an output from the second counter;

a third decoder for decoding an output from the averaging circuit;

setting of an internal-division ratio of each of the first to third interpolators and switching of a clock output by each of the first to third switches being performed based upon a decoded output from each of the first to third decoders;

a third phase comparator circuit for detecting a phase difference between an output of the clock transmission path and the output of the third interpolator;

a third filter for smoothing a signal representing the result of the phase comparison output from the third phase comparator circuit;

a third counter for counting up and counting down based upon the signal representing the result of the phase comparison output from the third filter; and a fourth decoder for decoding an output count from the third counter;

setting of an internal-division ratio of the fourth interpolator and switching of a clock output by the fourth switch being performed based upon a decoded output from the fourth decoder.

According to a 12th aspect of the present invention, there is provided a clock control circuit comprising:

first, second and third interpolators each of which is for outputting a signal obtained by internally dividing a phase difference between two signals input thereto;

a common data signal being input to the first interpolator for being delayed and then output thereby;

a clock signal being input to the second interpolator, and the second interpolator outputting a clock signal obtained by internally dividing a timing difference between a leading edge and a trailing edge of a clock pulse;

the third interpolator outputting a clock signal obtained by internally dividing a timing difference between a trailing edge of the clock pulse and a leading edge of an ensuing clock pulse of the clock signal; and a multiplexing circuit for multiplexing the output clocks from the second and third interpolators and outputting a clock signal;

the clock signal output from the multiplexing circuit being supplied to a latch circuit as a latch timing clock for latching data that is output from the first interpolator.

According to a 13th aspect of the present invention, there is provided a semiconductor integrated circuit device having a clock control circuit according to any one of the preceding aspects.

According to a 14th aspect of the present invention, there is provided a semiconductor integrated circuit device having a plurality of macroblocks, the device comprising:

a frequency multiplying interpolator, which includes a plurality of circuits each of which is for outputting a signal obtained by internally dividing a phase difference between two signals, for generating and outputting multiphase clocks obtained by frequency multiplying an input clock;

each of the macroblocks having a switch, to which the multiphase clocks output from the frequency multiplying interpolator are input, for outputting at least two clocks from among the multiphase clocks, and a phase adjusting interpolator, to which an output from the switch is input, for outputting a signal obtained by internally dividing the phase of the output; and a control circuit for controlling switching of the clock by the switch and varying an internal-division ratio of the phase adjusting interpolator.

SUMMARY OF PREFERRED EMBODIMENTS

According to an embodiment, a clock control circuit comprises: a frequency multiplying interpolator including a plurality of circuits each for outputting a signal obtained by internally dividing the phase difference between two signals, the interpolator having an input clock applied thereto and outputting a plurality of clocks of different phases obtained by frequency multiplying the input clock; a switch to which the plurality of clock outputs from the frequency multiplying interpolator are input for switchingly (i.e., selectively) outputting two of the clocks; a phase adjusting interpolator to which the two outputs of the switch are input for outputting a signal obtained by internally dividing the phase difference between these two outputs; and a control circuit for controlling switching of the switch and for varying an internal-division ratio of the phase adjusting interpolator.

According to another embodiment a clock control circuit comprises: a frequency multiplying interpolator, which includes a plurality of circuits each for outputting a signal obtained by internally dividing a phase difference between two signals, for generating and outputting multiphase clocks obtained by frequency multiplying an input clock; a switch to which the multiphase clocks output from the frequency multiplying interpolator are input for outputting two of the multiphase clocks; a phase adjusting interpolator to which the two outputs of the switch are input for outputting a signal obtained by internally dividing the phase difference between these two outputs; and a control circuit for controlling switching of the switch and for varying an internal-division ratio of the phase adjusting interpolator.

According to a third embodiment, a clock control method comprises: reducing jitter of a frequency-multiplied clock by generating multiphase clocks, which are obtained by frequency multiplying an input clock, by a frequency multiplying interpolator, selecting two of the multiphase clocks, which are output from the frequency multiplying interpolator, by a switch and supplying the clocks to a phase adjusting interpolator; and varying an internal-division ratio of the phase adjusting interpolator based upon result of a phase comparison between a predetermined reference clock and output clocks of the phase adjusting interpolator.

Other aspects, features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 13(a) and (b) which are diagrams useful in describing the actions and effects of the embodiments of the present invention, schematically illustrate the appearance of jitter when a frequency multiplying interpolator is used and in an arrangement according to the prior art;

PREFERRED EMBODIMENTS

Modes for carrying out the present invention will be described below.

Figure 1:
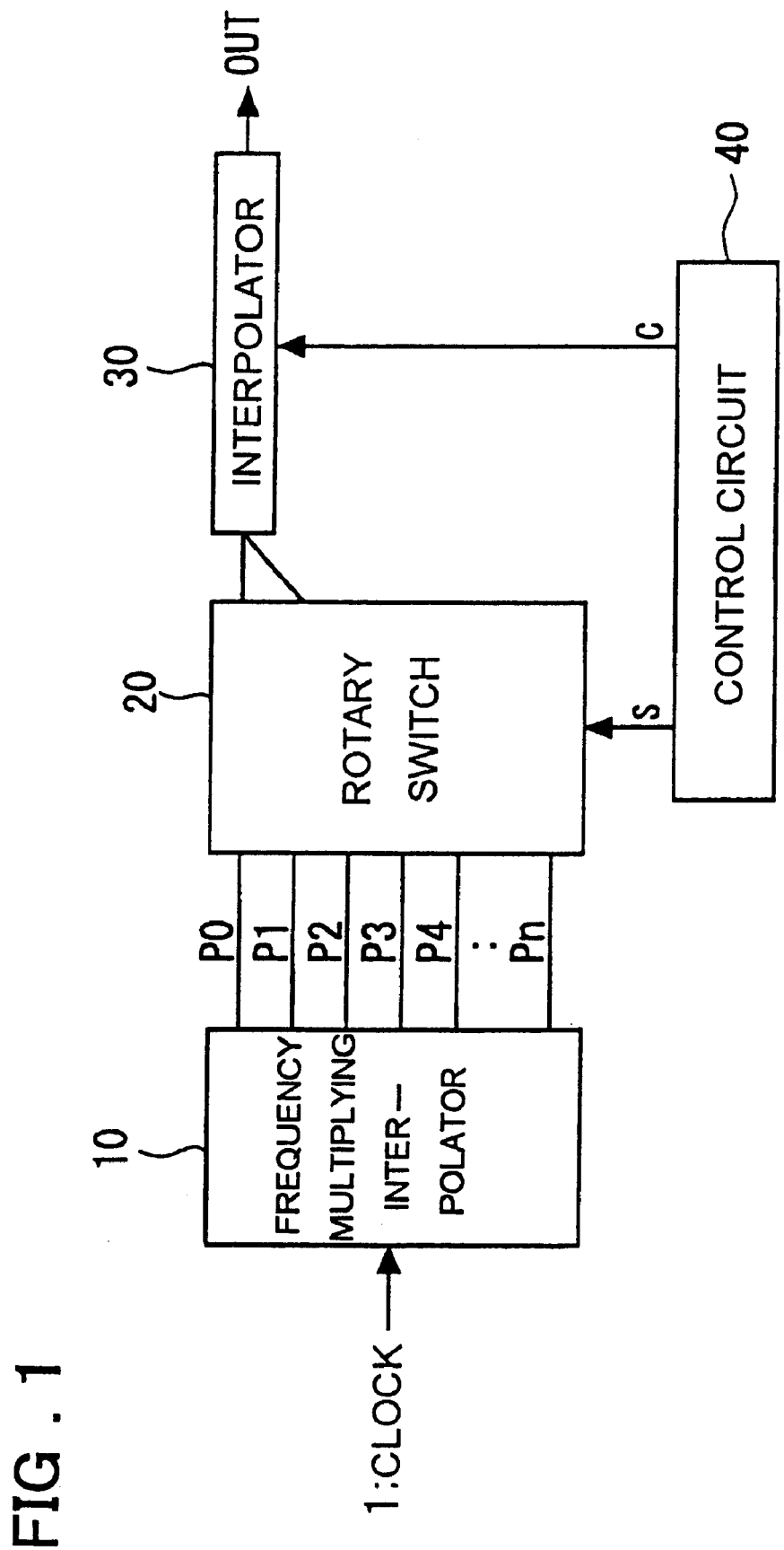
FIG. 1 is a block diagram illustrating the structure of an embodiment of the present invention.

According to a preferred mode for carrying out the present invention, as shown in FIG. 1, a clock control circuit comprises: a frequency multiplying interpolator (10), which includes a plurality of circuits each for outputting a signal obtained by internally dividing a phase difference between two signals, for generating and outputting multiphase clock (P0 to Pn) obtained by frequency multiplying an input clock (1); a switch (20) to which the multiphase clocks (P0 to Pn) output from the frequency multiplying interpolator (10) are input for outputting two mutually adjacent ones of the multiphase clocks; a phase adjusting interpolator (30, which is also referred to as a "fine adjusting interpolator") to which the two outputs of the switch (20) are input for outputting a signal, which is obtained by internally dividing the phase difference between these two inputs, from an output terminal (OUT); and a control circuit (40) for controlling switching of the switch (20) and for varying an internal-division ratio of the interpolator (30).

Figure 2:
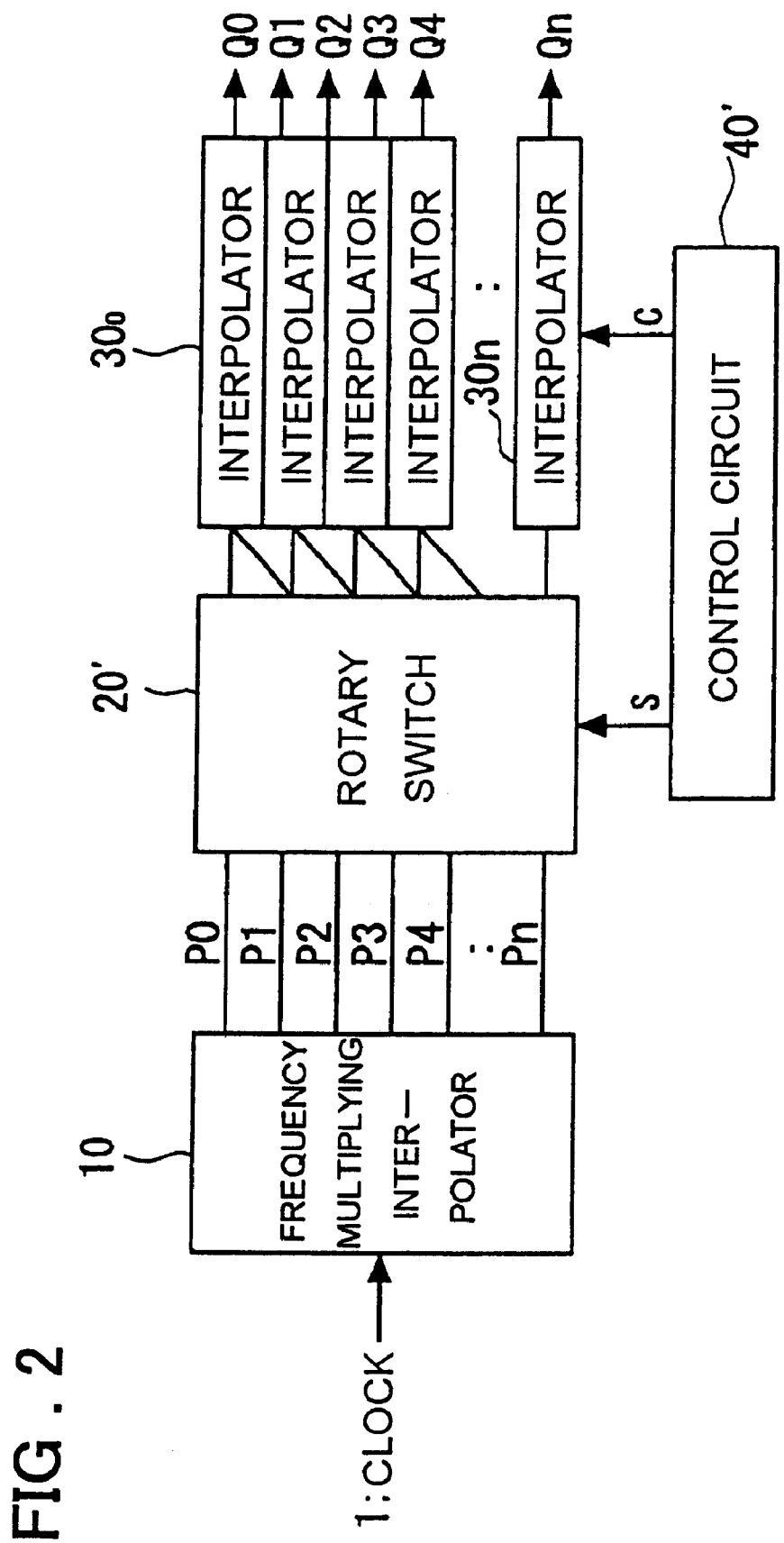
FIG. 2 is a block diagram illustrating the structure of a second embodiment of the present invention.

In another mode for carrying out the present invention, the clock control circuit may be constructed to use a plurality of interpolators to output multiphase clocks from the multiphase clocks (P0 to Pn) output by the frequency multiplying interpolator. More specifically, as shown in FIG. 2, the clock control circuit comprises: a frequency multiplying interpolator (10) for outputting multiphase clocks (P0 to Pn) obtained by frequency multiplying an input clock; a switch (20') to which the multiphase clocks output from the frequency multiplying interpolator (10) are input for outputting combinations each of which consists of two of the multiphase clocks; fine adjusting (phase adjusting) interpolators ($30_0$ to $30_n$), to each of which two outputs from among the plurality of outputs of the switch (20') are input, for producing output signals (Q0 to Qn), respectively, obtained by internally dividing the phase difference between the two outputs applied to each interpolator; and a control circuit (40') for controlling switching of the switch (20') and for varying internal-division ratios of the interpolators ($30_0$ to $30_n$)

Figure 4:
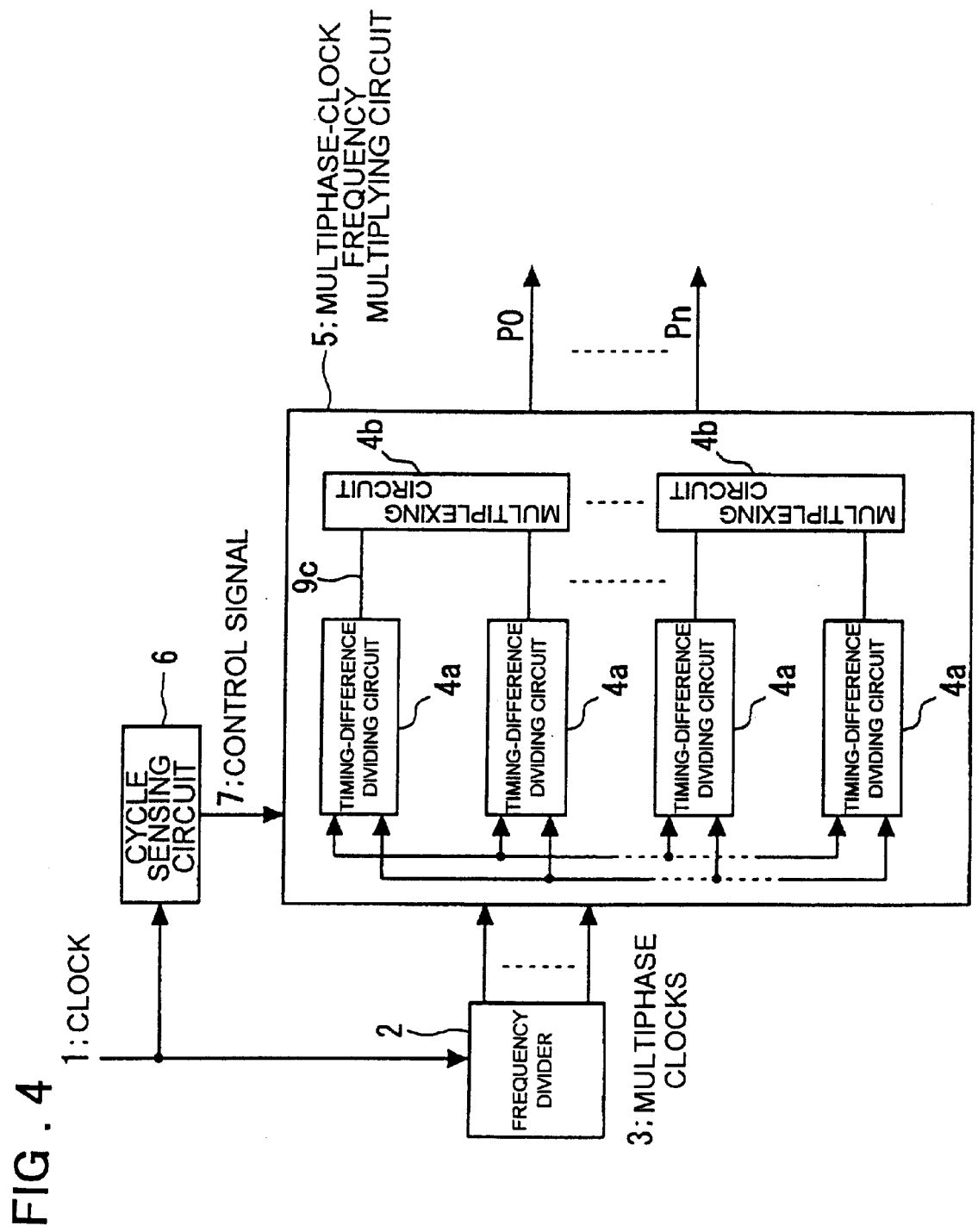
FIG. 4 is a block diagram illustrating the structure of a frequency multiplying interpolator according to an embodiment of the present invention.

In a mode for carrying out the present invent ion, as shown in FIG. 4, the frequency multiplying interpolator includes: a frequency divider (2) for frequency dividing an input clock and generating multiphase clocks; a period sensing circuit (6) for sensing the cycle of the input clock; and a multiphase-clock frequency multiplying circuit (5), to which the clock output of the frequency divider (2) is input, for generating multiphase clocks obtained by frequency multiplying the input clock; where in the multiphase-clock frequency multiplying circuit has a plurality of timing-difference dividing circuits (4a) each of which is for outputting a signal obtained by dividing a timing difference between two inputs applied thereto, and a plurality of multiplexing circuits (4b) each of which is for multiplexing outputs from two timing-difference dividing circuits; and each of the plurality of timing-difference dividing circuits has a timing-difference dividing circuit to which two identical-phase clocks are applied as inputs and a timing-difference dividing circuit to which two clocks of mutually adjacent phases are applied as inputs.

Figure 6A:
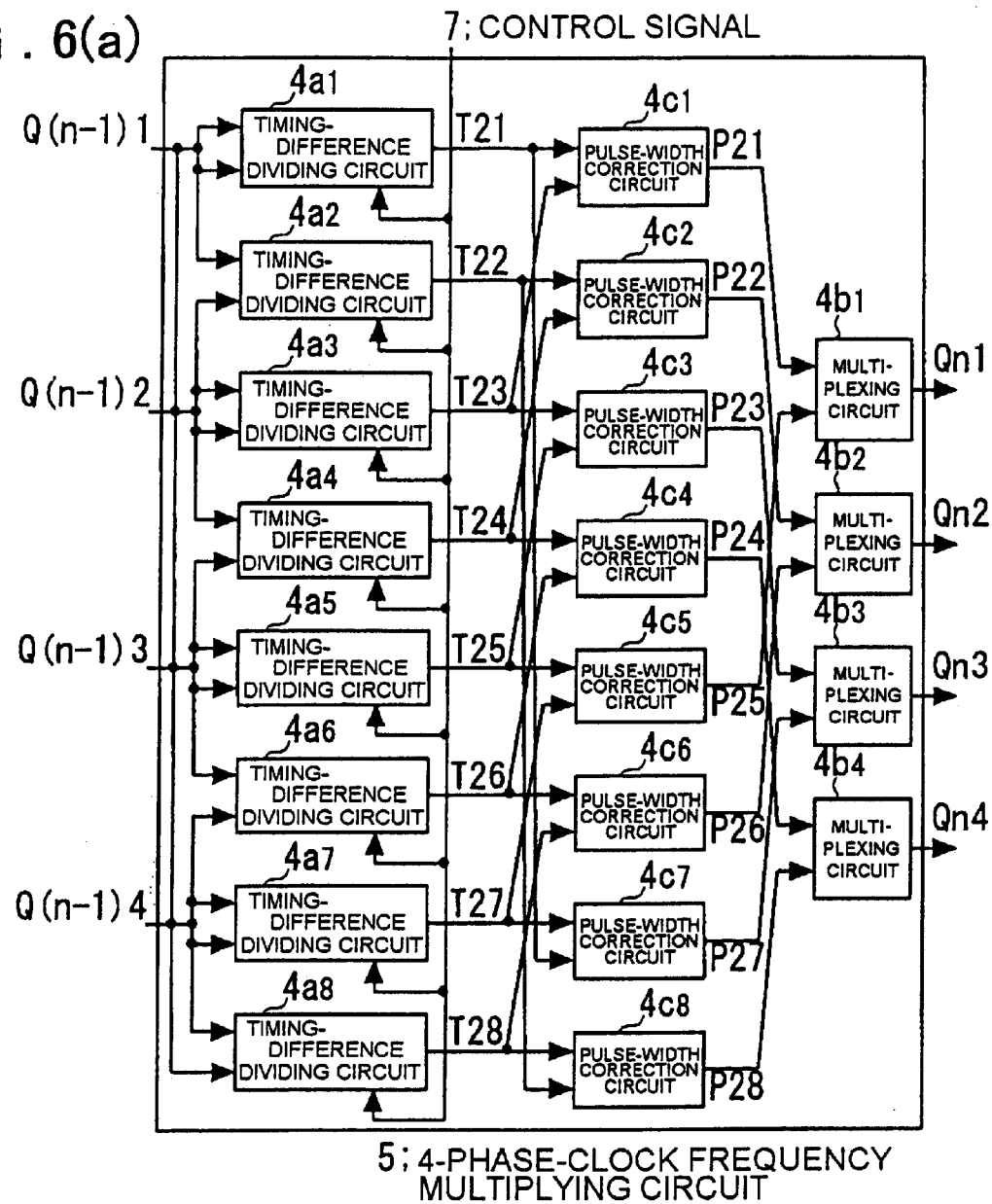
FIGS. 6(a), (b) and (c) are diagrams illustrating the structure of a 4-phase-clock frequency multiplying circuit according to an embodiment of the present invention.
Figure 6B:
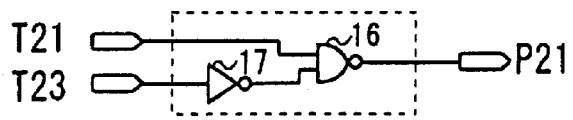
Figure 6C:
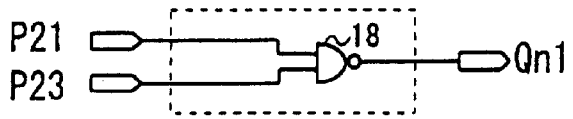

In a mode for carrying out the present invention, as shown in FIG. 6, the multiphase-clock frequency divider circuit includes 2n-number of timing-difference dividing circuits, to which n-phase clocks (first to nth clocks) are input, for respectively outputting signals obtained by dividing a timing difference between two inputs applied thereto, wherein (2I−1) th (where $1 \leq I \leq n$ holds) timing-difference dividing circuits (4a1, 4a3, 4a5, 4a7) have Ith identical clocks applied thereto as the above-mentioned two inputs, and 2I th (where $1 \leq I \leq n$ holds) timing-difference dividing circuits (4a2, 4a4, 4a6, 4a8) have an I th clock and a (I+1 mod n) th [where I+1 mod n represents the remainder obtained when I+1 is divided by n ("mod n" represents the remainder calculation in which n is the modulus)]clock applied thereto as the above-mentioned two inputs; 2n-number of pulse-width correction circuits (4c1 to 4c8) to which an output of a Jth (where $1 \leq J \leq 2n$) timing-difference dividing circuit and an output of a (J+2 mod n) th (where J+2 mod n represents the remainder obtained when J+2 is divided by n) timing-difference dividing circuit are input; and n-number of multiplexing circuits (4b1 to 4bn) to which an output of a Kth (where $1 \leq K \leq n$) pulse-width correction circuit and an output of a (K+n) th pulse-width correction circuit are input.

Figure 8A:
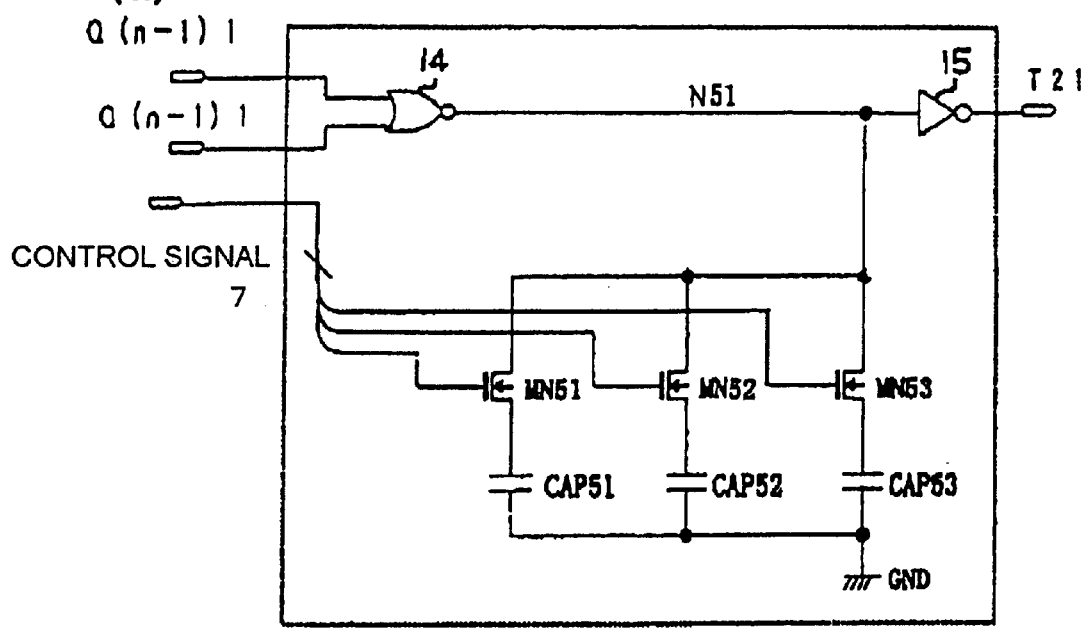
FIGS. 8(a) and (b) diagrams showing the structures of timing-difference dividing circuits of the 4-phase-clock frequency multiplying circuit according to the embodiment of the present invention shown in FIG. 6.
Figure 8B:
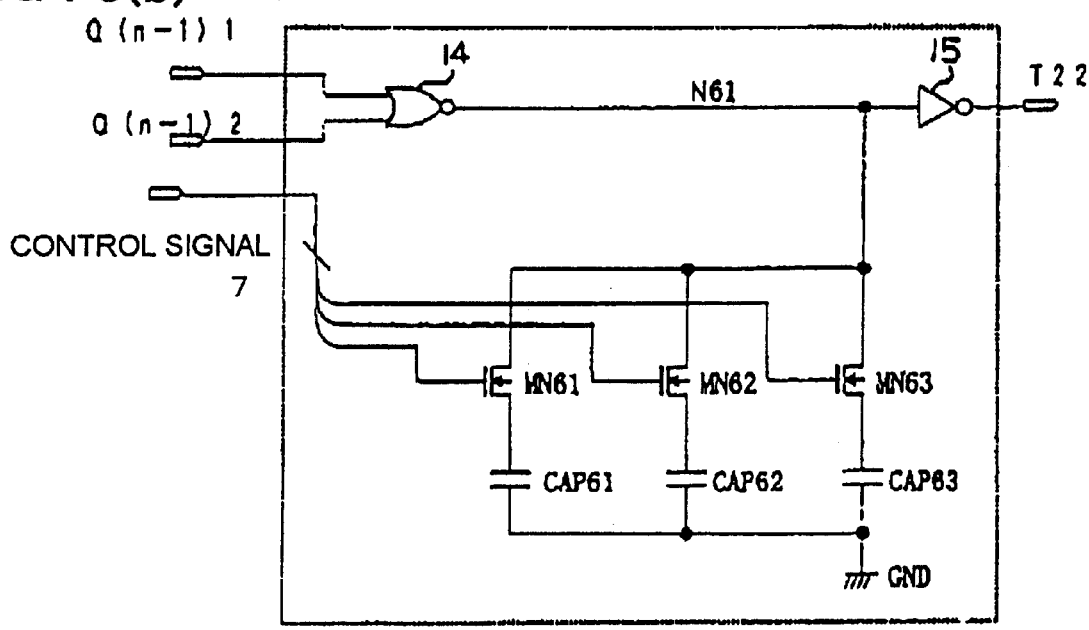

In a mode for carrying out the present invention, as shown in FIG. 8, a timing-difference dividing circuit includes a NOR gate (14) to which first and second input signals are applied, and an inverter (15) for inverting and outputting the output of the NOR gate (the potential of an internal node); wherein a plurality of serially connected switch elements and capacitors are connected in parallel between the internal node and ground, a cycle control signal (7) output from the period sensing circuit (6) is connected to a control terminal of each switch element and capacitance applied to the internal node is decided by the logic value of the cycle control signal (7).

Figure 10:
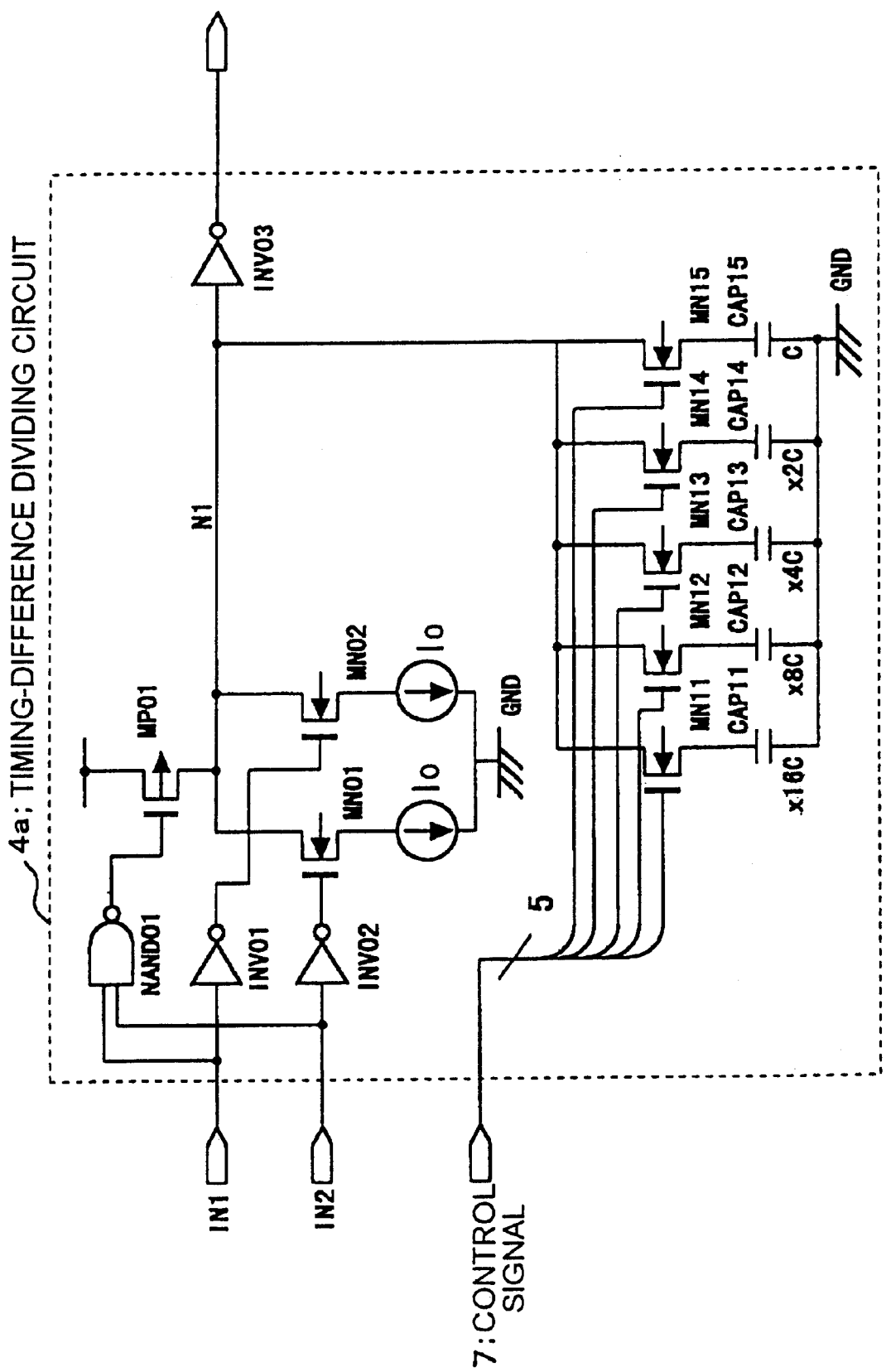
FIG. 10 is a diagram showing another example of th e structure of the 4-phase-clock frequency multiplying circuit according to the embodiment of the present invention shown in FIG. 6.

In a mode for carrying out the present invention, as shown in FIG. 10, a timing-difference dividing circuit includes: a logic circuit to which first and second input signals are applied; a first switch element (MP01) comprising a first-conductivity-type transistor connected between a first power supply and an internal node (N1) and having an output signal of the logic circuit input to a control terminal thereof; a buffer circuit (INVO3) having an input terminal connected to the internal node for inverting an output logic value if a size relationship between voltage of the internal node and a threshold-value voltage reverses; a second switch element (MN02) comprising a second-conductivity-type transistor connected between the internal node and a second power supply, driven by a first constant-current source and turned on and off by the first input signal (IN1); and a third switch element (MN01) comprising a second-conductivity-type transistor connected between the internal node and the second power supply, driven by a second constant-current source and turned on and off by the second input signal (IN2); wherein a plurality of serially connected switch elements and capacitors (switch elements MN11 to MN15, capacitors CAP11 to CAP15) are connected in parallel between the internal node and the second power supply, and capacitance applied to the internal node is decided by a cycle control signal supplied to a control terminal of each of these switch elements.

Figure 11:
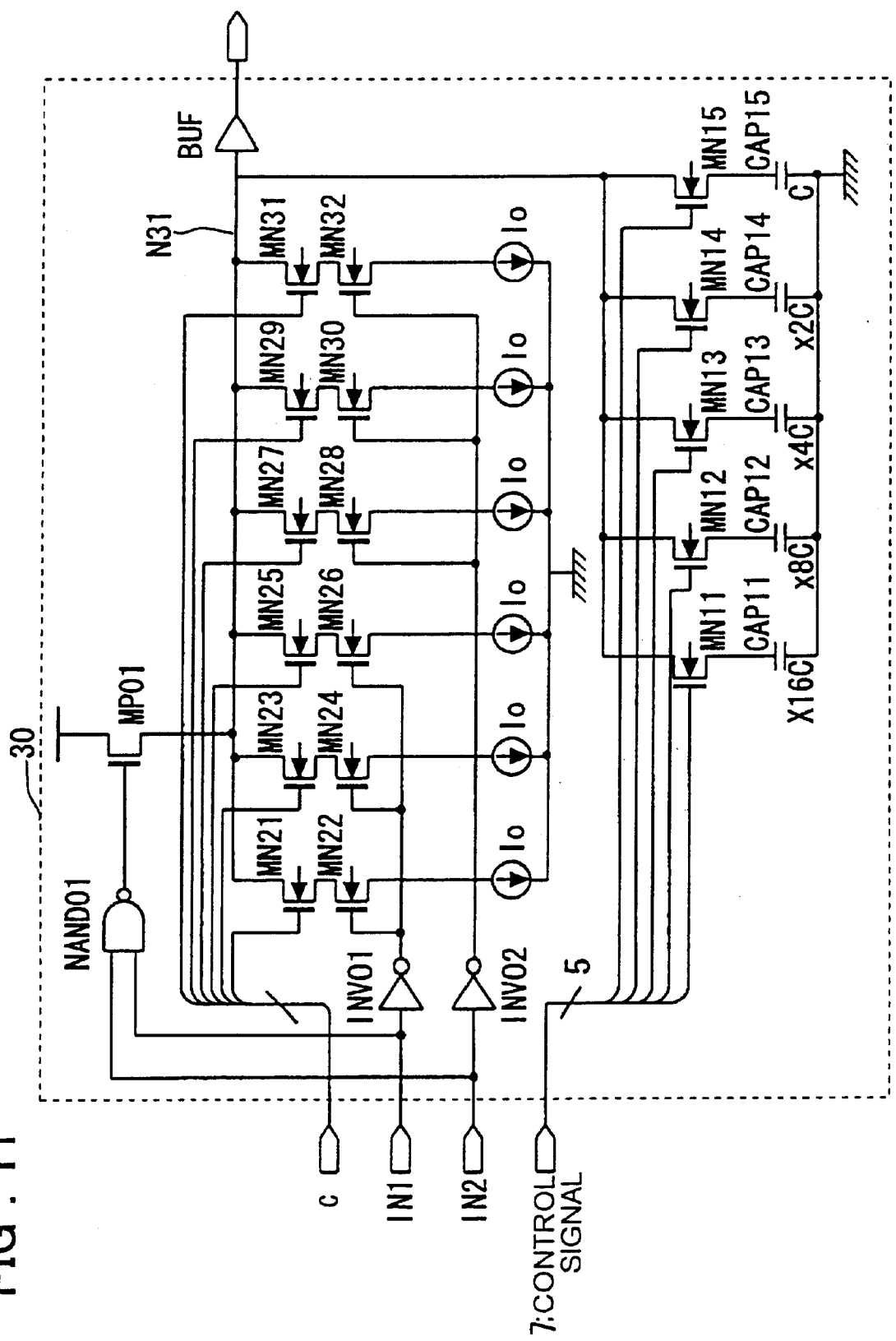
FIG. 11 is a diagram showing an example of the structure of a chase adousting interpoator according to an embodiment of the present invention.
Figure 12:
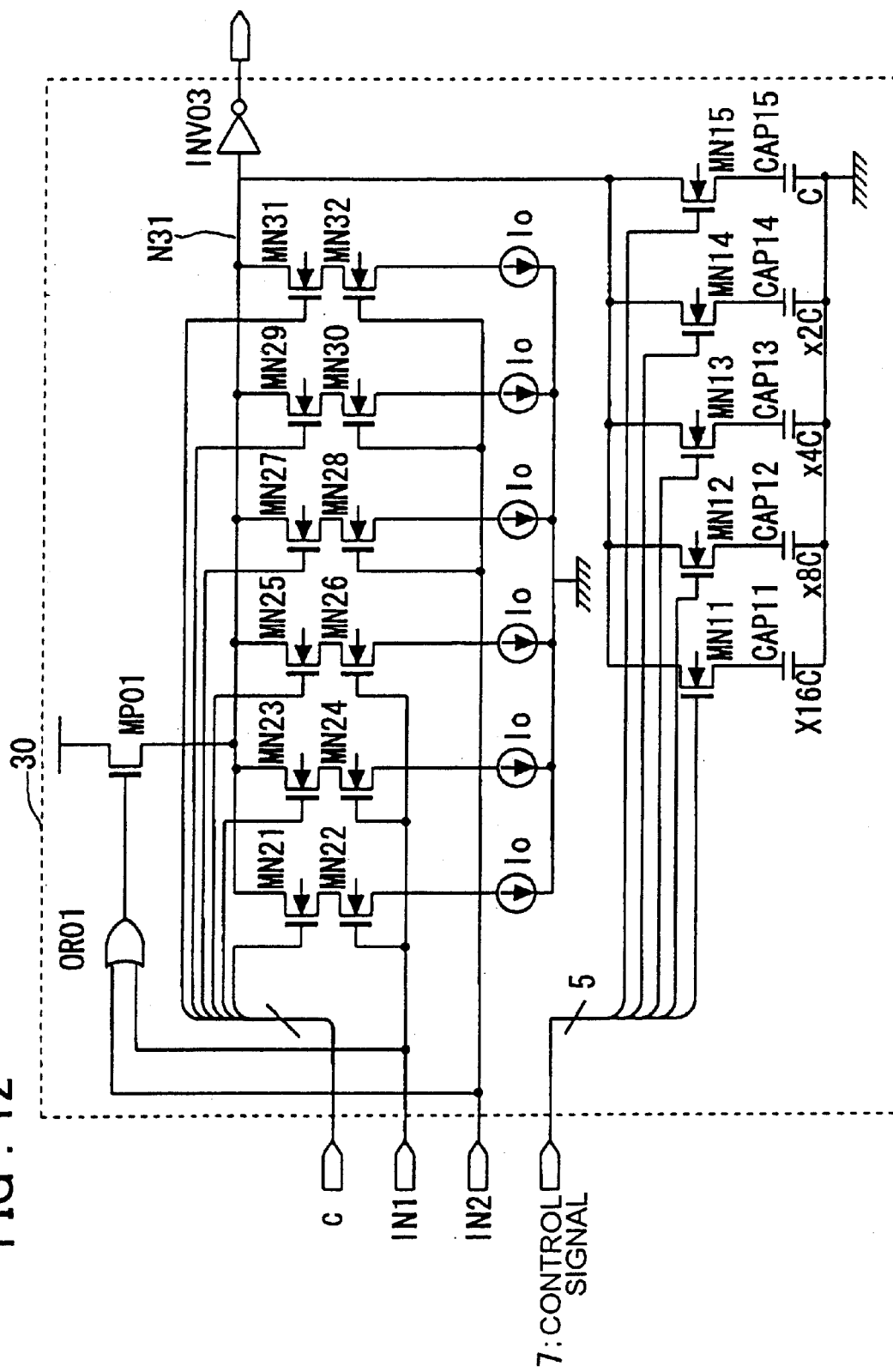
FIG. 12 is a diagram showing an example of the structure of a phase adjusting interpolator according to an embodiment of the present invention.

In a mode for carrying out the present invention, as shown in FIG. 11 or 12, the phase adjusting interpolator (30) includes: a logic circuit (NAND01 or OR01) to which first and second input signals are applied; a first switch element (MP01) connected between a first power supply and an internal node (N31) and having an output signal of the logic circuit connected to a control terminal thereof; a non-inverting-type or inverting-type buffer circuit (BUF or INV03) having an input terminal connected to the internal node for inverting an output logic value if the size relationship between voltage of the internal node and a threshold-value voltage reverses; a plurality of series circuits (MN22 and MN21, MN24 and MN23, MN26 and MN25), which comprise second switch elements turned on and off by the first input signal and driven by constant-current sources and third switch elements turned on and off by a control signal from the control circuit, connected in parallel between the internal node and a second power supply; a plurality of series circuits (MN28 and MN27, MN30 and MN29, MN32 and MN31), which comprise fourth switch elements turned on and off by the second input signal and driven by constant-current sources and fifth switch elements turned on and off by the control signal from the control circuit, connected in parallel between the internal node and the second power supply; and a plurality of series circuits (sixth switch elements MN11 to MN15, capacitors CAP11 to CAP15), which comprise sixth switch elements and capacitors connected in parallel between the internal node the second power supply; wherein capacitance applied to the internal node is decided by turning on and off the sixth switch elements by the cycle control signal connected to a control terminal of each of the sixth switch elements.

In the phase adjusting interpolator (30), a predetermined number (N) of each of the second, third, fourth and fifth switches elements is provided, K-number (where K=0 to N) of the third switch elements are turned on by the control signal supplied to the third switch elements, (N–K) -number of the fifth switch elements are turned on by the control signal supplied to the fifth switch elements, a signal corresponding to a phase obtained by internally dividing a timing difference T between the first and second input signals based upon K in increments of 1/N of the timing difference is output, and the internal-division ratio is varied by varying the value of K.

In a mode for carrying out the present invention, the switch (20) comprises a rotary switch, an n-phase clock output from the frequency multiplying interpolator is input to the rotary switch, an I-th clock is supplied to a first input of the phase adjusting interpolator and an adjacent (I+1) th clock is supplied to a second input of the phase adjusting interpolator based upon the switching control signal from the control circuit. When the signal is switched in accordance with a phase-lag or phase-lead state of the output in this case, switching is controlled in such a manner that the first input of the interpolator is made the (I+2) th clock and the second input is kept as the (I+1) th clock, or the first input is kept at the Ith clock and the second input is made the (I–1) th clock (where I+1, I–1, I+2 take on values of 1 to n and are decided by the remainder obtained by dividing by n).

FIG. 13 is an explanatory view showing a comparison of the effects of jitter in a case where the frequency multiplying interpolator of the present invention is used and a case where a DLL is used. In a case where a frequency-multiplied clock is generated using the interpolator, as shown in (a) of FIG. 13, jitter of the input clock appears as an average over the entirety of the output frequency-multiplied clock. For example, assume that the clock cycle changes to T-dt owing to jitter -dt of the input clock. In the case of an output clock obtained by frequency-multiplication by four, jitter is averaged and appears as –dt/4 every frequency-multiplied clock cycle. In other words, when the interpolator is used, jitter per clock obtained by frequency multiplication by four (i.e., every T/4) is –dt/4. By contrast, in the case where the DLL is used as in the prior art, jitter equivalent to dt appears in the final phase of the frequency-multiplied clock, as shown in (b) of FIG. 13.

Thus, in accordance with the present invention, jitter per frequency-multiplied clock is greatly reduced by averaging jitter using the frequency multiplying interpolator. In particular, the invention makes it possible to maintain a uniform phase difference in multiphase clocks.

Figure 17:
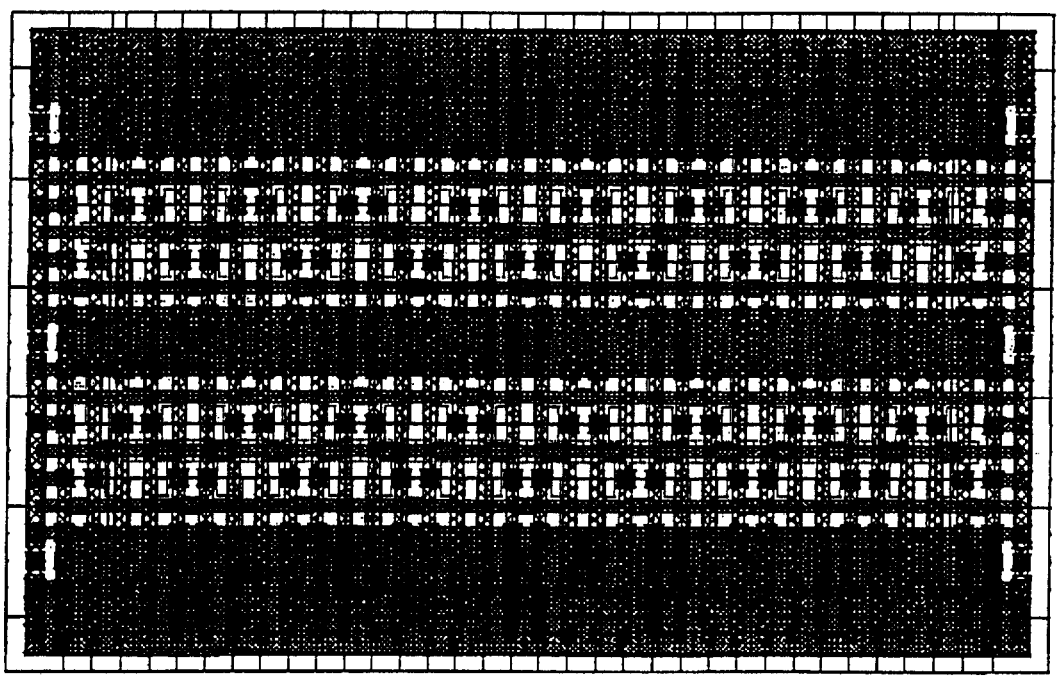
FIG. 17 is a diagram showing an example of the layout of 16-step interpolator according to an embodiment of the present invention.
Figure 18:
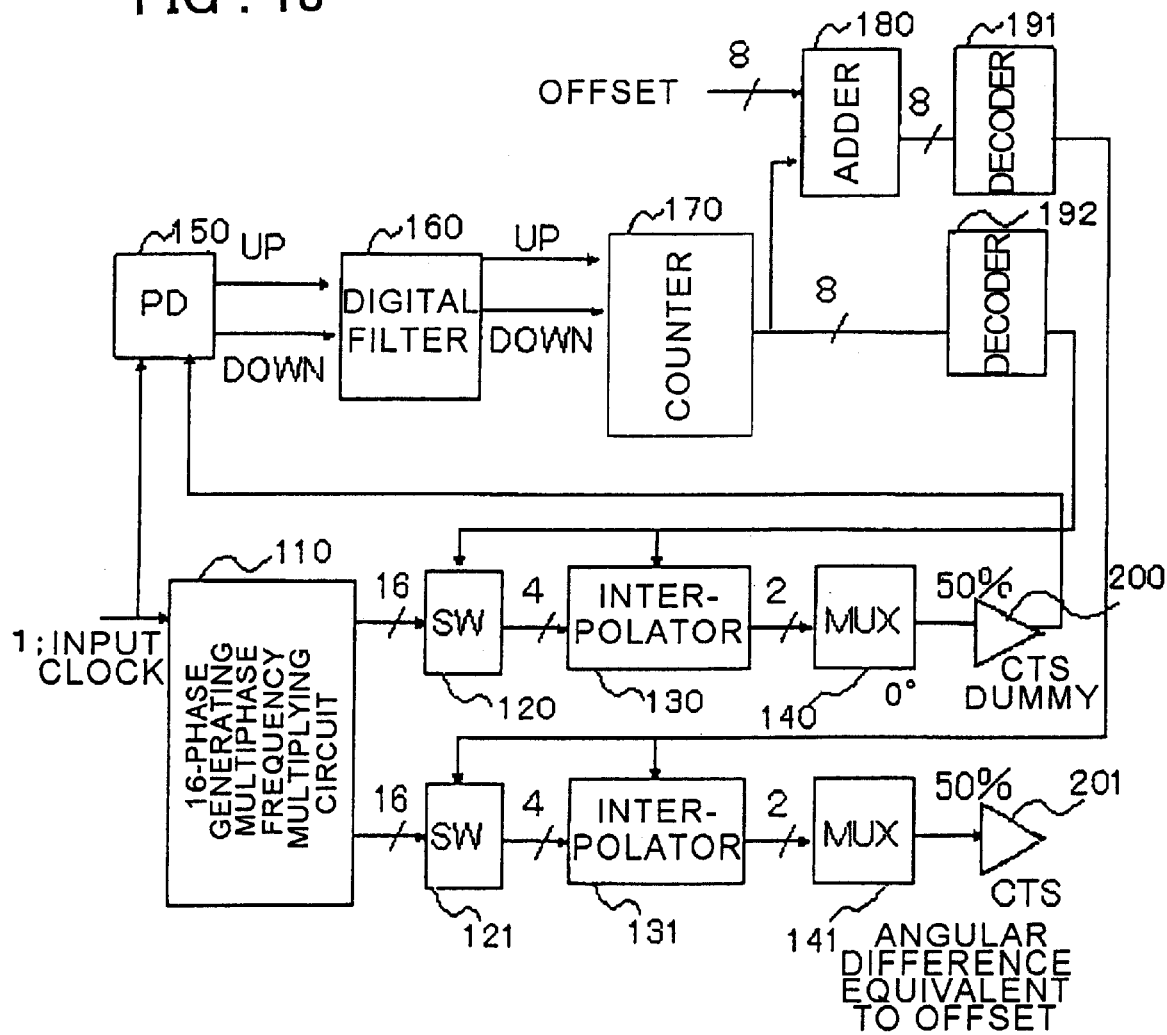
FIG. 18 is a block diagram illustrating a fourth embodiment of the present invention.
Figure 19:
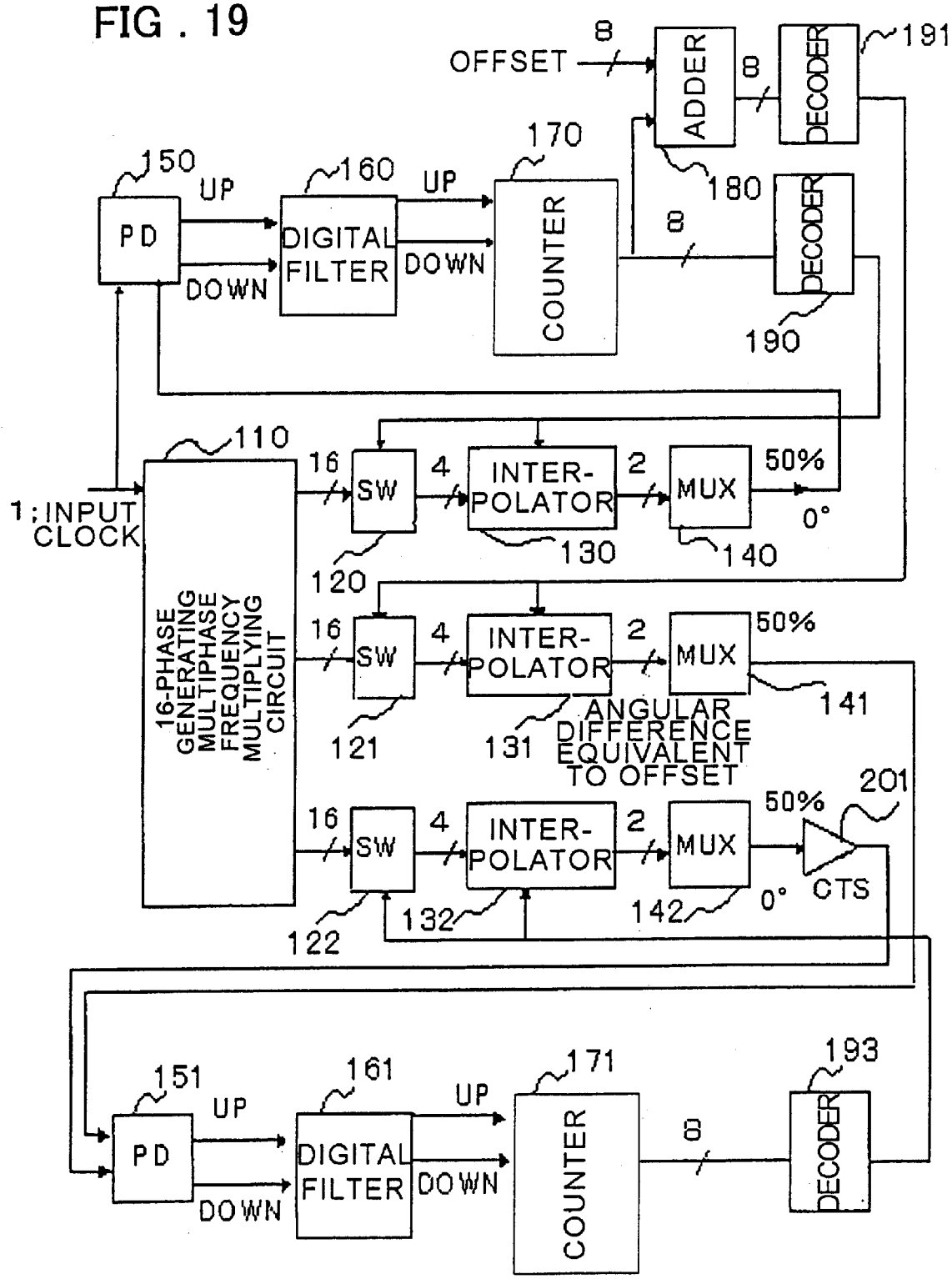
FIG. 19 is a block diagram illustrating a fifth embodiment of the present invention.

In a mode for carrying out the present invention, as shown in FIGS. 15 to 20, a clock control circuit according to the present invention comprises: a multiphase frequency multiplying circuit (110) constituting a multiphase-clock generating circuit for generating and outputting a multiphase clock or generating and outputting a frequency-multiplied multiphase clock from an input clock; a plurality of switches (120, 121), to which the multiphase clock output from the multiphase frequency multiplying circuit (110) is input, for selectively outputting combinations consisting of pairs of clock outputs; a plurality of phase adjusting interpolators (130, 131), to which the clock output pairs from the respective switches are input, for outputting respective signals obtained by internally dividing the phase differences between the clock output pairs; and a control circuit (e.g., counters 170, 171 in FIG. 15 or counter 170 and decoders 191, 192 in FIG. 18) for controlling switching of the clock outputs of each of the switches and for varying the internal-division ratio of each phase adjusting interpolator; wherein the clock output from one of the interpolators (130) is adjusted in phase so as to have a predetermined phase (e.g., 0°) with respect to the input clock (1), and the clock output from the other of the interpolators (131) is adjusted in phase so as to have a predetermined phase with respect to the input clock (1). Alternatively, in a mode for carrying out the present invention, as shown in FIG. 19, the clock output from the other of the interpolators (131) is adjusted in phase so as to have a predetermined phase with respect to the input clock (1), and the clock output from yet another interpolator (132) is adjusted in phase so as to have a predetermined phase with respect to the clock output from the other interpolator (131).

DETAILED DESCRIPTION OF THE EMBODIMENTS

Embodiments of the present invention will now be described in greater detail with reference to the drawings. In the basic structure of the present invention, the PLL or DLL used in the clock control circuit described in the description of the prior art is constituted by a frequency multiplying interpolator.

FIG. 1 is a block diagram illustrating the structure of a preferred embodiment of the present invention. In the embodiment shown in FIG. 1, a clock of an unchanging center frequency generated by a frequency multiplying interpolator 10 is adjusted to any phase by a rotary switch 20 and a fine adjusting interpolator 30.

Figure 25:
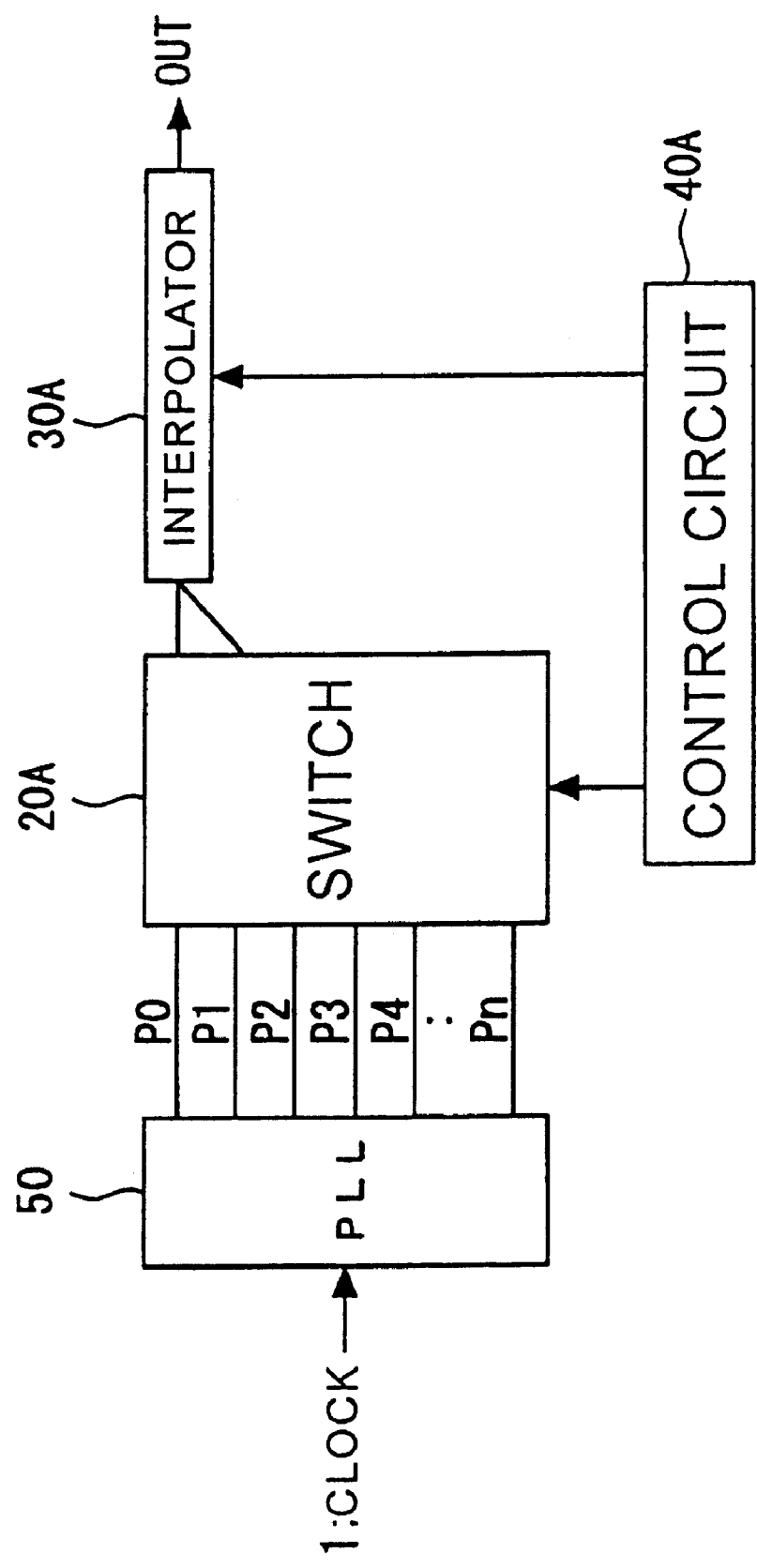
FIG. 25 is a block diagram illustrating an example of the structure of a clock control circuit according to the prior art.
Figure 26:
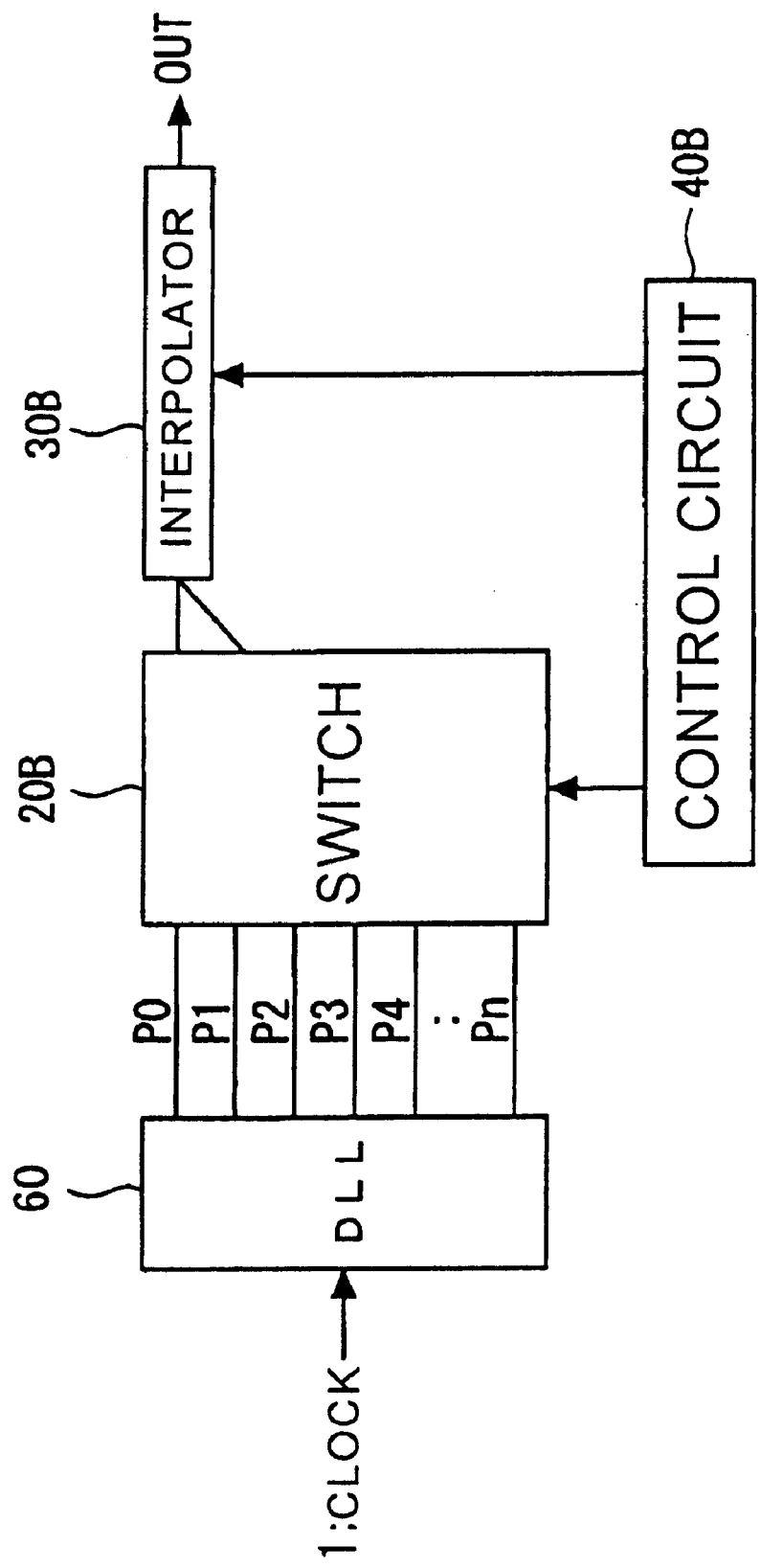
FIG. 26 is a block diagram illustrating another example of the structure of a clock control circuit according to the prior art.
Figure 27:
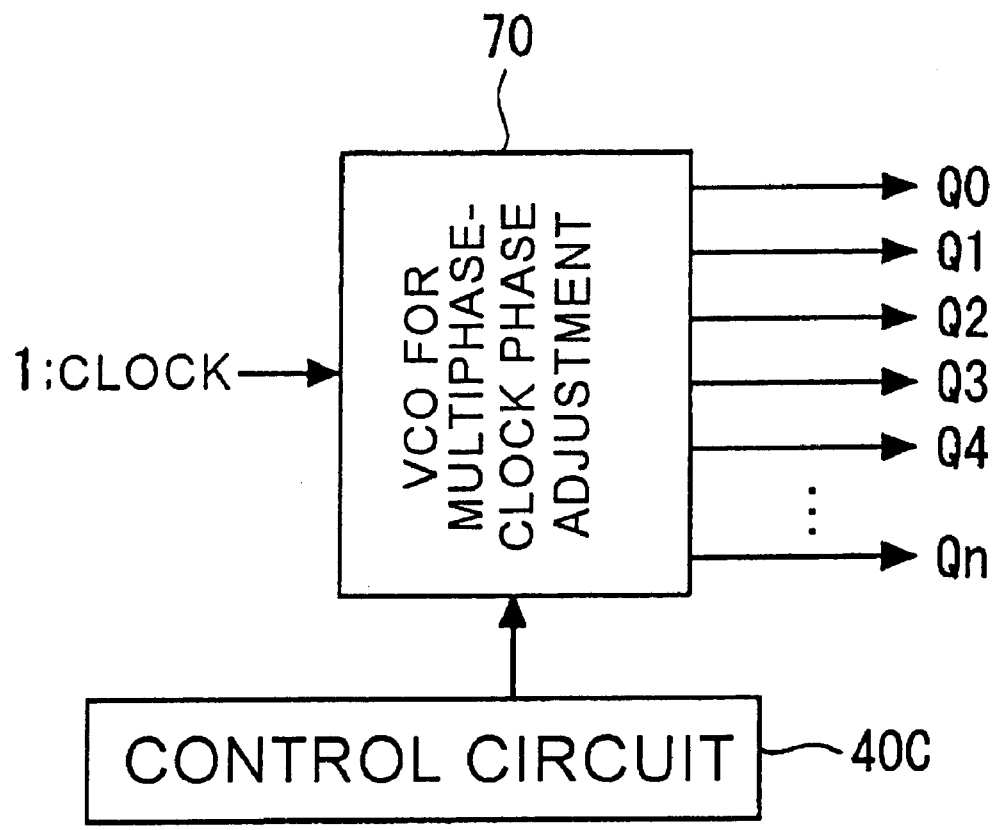
FIG. 27 is a block diagram illustrating yet another example of the structure of a clock control circuit according to the prior art.

In a manner similar to that of the arrangement shown in FIG. 25, the rotary switch 20 supplies the fine adjusting interpolator 30 with a pair of mutually adjacent odd and even phase signals from among the multiphase clocks P0 to Pn and, based upon a control signal from a control circuit 40, the interpolator 30 outputs a signal having a phase obtained by internally dividing the phase difference (timing difference) between the two inputs thereof.

Upon receiving an output signal from a phase comparator which compares the phase of a reference clock (not shown) and the phase of the output clock from the interpolator 30, a control circuit 40 outputs a control signal C for varying a timing-difference division value (internal-division ratio) in the interpolator 30 in accordance with lead/lag of the output of the interpolator 30 with respect to the reference clock in order to compensate for leading or lagging phase.

The control circuit 40 senses whether the setting of the internal-division ratio of the interpolator 30 has attained an upper or lower limit. If it is determined that lead/lag of the output of the interpolator 30 with respect to the reference clock requires further adjustment, the control circuit 40 outputs a selection control signal S to the rotary switch 20 in dependence upon phase lead or lag. The rotary switch 20 responds to the selection control signal S by changing over the clock pair output to the interpolator 30.

By way of example, assume that it is necessary to advance the phase of the output clock of interpolator 30 based upon the phase difference between the output clock of the interpolator 30 and the reference clock. In such case the rotary switch 20 responds to the selection control signal S from the control circuit 40 by changing over the clock output in such manner that the interpolator 30 will internally divide the phase difference (timing difference) between a phase signal that is, e.g., one earlier than the currently selected phase signal (i.e., that leads the currently selected phase signal by one) [where P−1=Pn, P−2=Pn−1, . . . holds, with calculation being performed based upon mod n] and the original phase signal, and supplying this clock output to the interpolator 30. On the other hand, if it is necessary to delay the phase of the output of the interpolator 30, the rotary switch 20 responds to the selection control signal S from the control circuit 40 by changing over the clock output in such manner that the interpolator 30 will internally divide the phase difference (timing difference) between a phase signal that is one later than the currently selected phase signal [where Pn+1=P0, Pn+2=P1, holds, with calculation being performed based upon mod n] and the original phase signal, and supplying this clock output to the interpolator 30.

Let the suffix n of the multiphase clocks P0 to Pn output from the frequency multiplying interpolator 10 be 2m−1 (the number of phases of the multiphase clocks is 2m). The rotary switch 20 includes a first selector which, in response to the control signal from the control circuit 40, selects one of the odd-phase clocks P0, P2, P4, . . . , 2m−2, and a second selector which, in response to the control signal from the control circuit 40, selects one of the even-phase clocks P1, P3, P5, . . . , 2m−1 (this will be described later with reference to FIG. 3). The control circuit 40 performs control to change over the clock output in such a manner that the combination of the odd-, even-phase clock output pair supplied to the interpolator 30, which internally divides the phase difference, will be a clock pair of mutually adjacent odd- and even-phase clocks, e.g., (P0, P1), (P2, P1), (P2, P3) and so on. As long as this function can be performed, the control circuit 40 can be implemented by any circuit arrangement.

As one example, the control circuit is provided with a counter to which is applied an UP/DOWN signal from a phase comparator circuit (not shown) that compares the phase of the output of the interpolator 30 and the phase of a reference clock. A prescribed low-order bit output of the counter is output as the control signal C that controls the internal-division ratio of the interpolator 30. If the setting of the internal-division ratio of interpolator 30 exceeds an upper limit or falls below a lower limit, the control signal is output to the selectors of the rotary switch 20 from a prescribed high-order bit output of the counter or from a decoder that decodes the counter output. The rotary switch 20 responds by changing over the clock that is selected and output.

The details of the structure of a frequency multiplying interpolator according to the present invention will now be described.

FIG. 4 is a block diagram illustrating the basic structure of the frequency multiplying interpolator 10 according to an embodiment of the present invention.

As shown in FIG. 4, the frequency multiplying interpolator 10 includes: a frequency divider 2 for frequency dividing an input clock 1 and generating multiphase clocks 3; a multiphase-clock frequency multiplying circuit 5 having the output 3 of the frequency divider 2 applied thereto; and a period sensing circuit 6, which comprises a ring oscillator of a fixed number of stages and a counter, for sensing the cycle period of the clock 1 by counting the oscillating frequency of the ring oscillator during one cycle of the clock 1. The multiphase-clock frequency multiplying circuit 5 has a plurality of timing-difference dividing circuits 4a each for outputting a signal obtained by internally dividing a timing difference (phase difference) between two inputs applied thereto, and a plurality of multiplexing circuits 4b each for multiplexing outputs from two timing-difference dividing circuits. The plurality of multiplexing circuits 4b output the multiphase clocks P0 to Pn.

Each of the plurality of timing-difference dividing circuits 4a has a timing-difference dividing circuit to which two identical-phase clocks are applied as inputs and a timing-difference dividing circuit to which two clocks of mutually adjacent phases are applied as inputs. The period sensing circuit 6 outputs a control signal 7 which, by adjusting the load capacitance of the timing-difference dividing circuit 4a in the multiphase-clock frequency multiplying circuit 5, controls the clock cycle.

Figure 5:
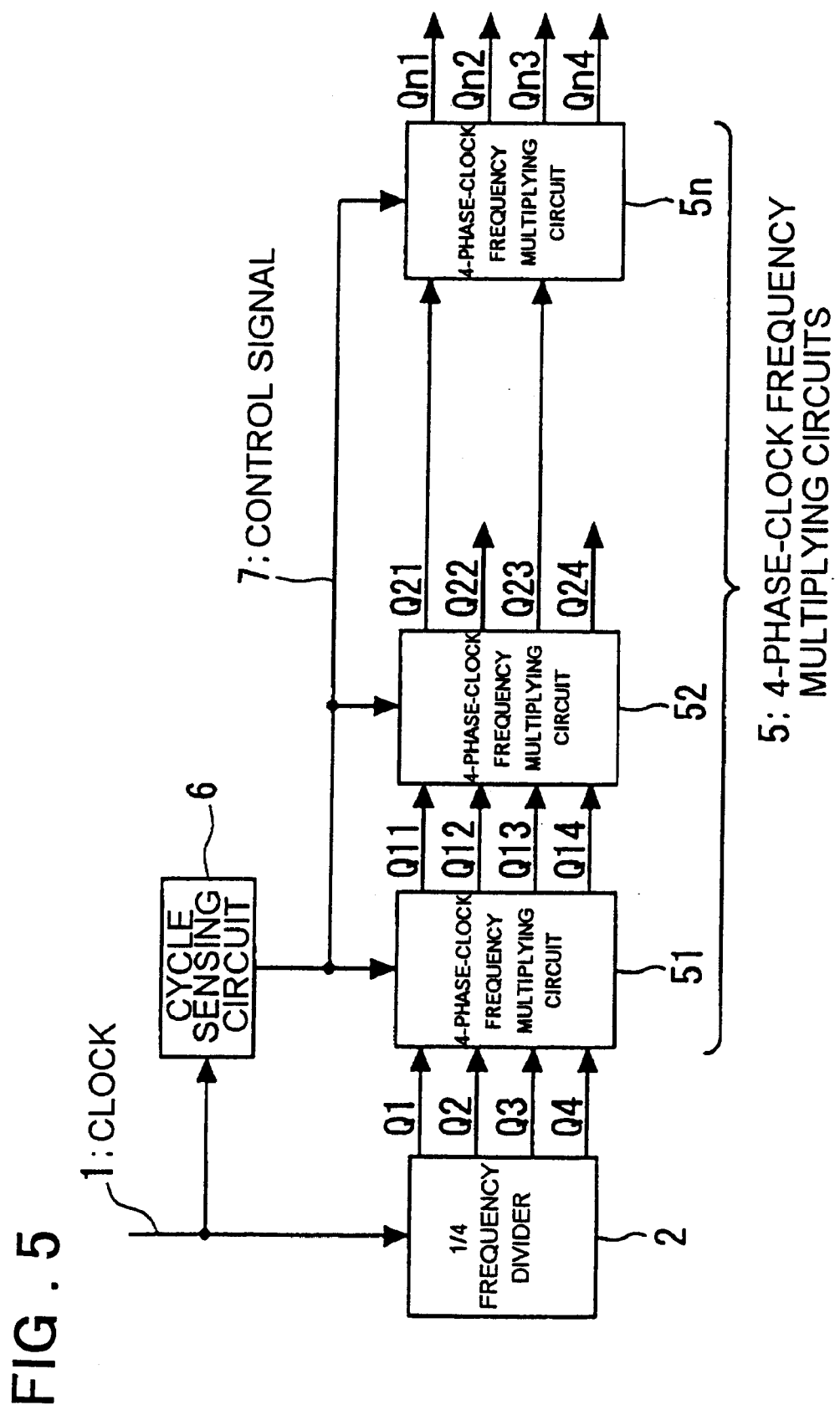
FIG. 5 is a block diagram illustrating the structure of a frequency multiplying interpolator according to an embodiment of the present invention.

FIG. 5 is a block diagram showing a concrete example of the structure of a frequency multiplying interpolator for generating a 4-phase clock according to an embodiment of the present invention.

As shown in FIG. 5, the interpolator has a ¼ frequency divider 2 for frequency dividing the input clock 1 by four and outputting 4-phase clocks Q1 to Q4; 4-phase-clock frequency multiplying circuits 51 to 5n cascade-connected in n stages; and the period sensing circuit 6. The 4-phase-clock frequency multiplying circuit 5n of the final stage outputs 4-phase clocks Qn1 to Qn4 (which correspond to P0 to P3 in FIG. 1) the frequencies of which have been multiplied by 2n. The number n of the 4-phase-clock frequency multiplying circuits is arbitrary.

The ¼ frequency divider 2 frequency divides the input clock by four to generate the 4-phase clocks Q1, Q2, Q3 and Q4. The 4-phase-clock frequency multiplying circuit 51 generates 4-phase clocks Q11, Q12, Q13 and Q14 by frequency multiplying the clocks Q1, Q2, Q3 and Q4. Similarly, the 4-phase-clock frequency multiplying circuit 5n provides 4-phase clocks Qn1, Qn2, Qn3, Qn4 frequency multiplied by 2n.

The period sensing circuit 6, which comprises a ring oscillator of a fixed number of stages and a counter, uses the counter to count the number of oscillations of the ring oscillator during one cycle of the clock 1 and outputs the control signal 7 in accordance with the count to thereby adjust the load within the 4-phase-clock frequency multiplying circuit 5. The period sensing circuit 6 eliminates a variation in the operating range of the clock period and a variation in the device characteristics.

FIG. 6(a) is a block diagram illustrating an example of the structure of the 4-phase-clock frequency multiplying circuit 5 shown in FIG. 5. The 4-phase-clock frequency multiplying circuits 51 to 5n shown in FIG. 5 all have the same structure.

As shown in FIG. 6(a) the 4-phase-clock frequency multiplying circuit 5 includes eight timing-difference dividing circuits 4a1 to 4a8, eight pulse-width correction circuits 4c1 to 4c8 and four multiplexing circuits 4b1 to 4bn. FIG. 6(b) is a diagram showing the construction of a pulse-width construction circuit 4c. The circuit includes a NAND circuit 16 the inputs to which are the first signal a signal obtained by inverting the second input by an inverter 17. FIG. 16(c) is a diagram showing the construction of a multiplexing circuit 4b, which comprises a two-input NAND gate 18.

Figure 7:
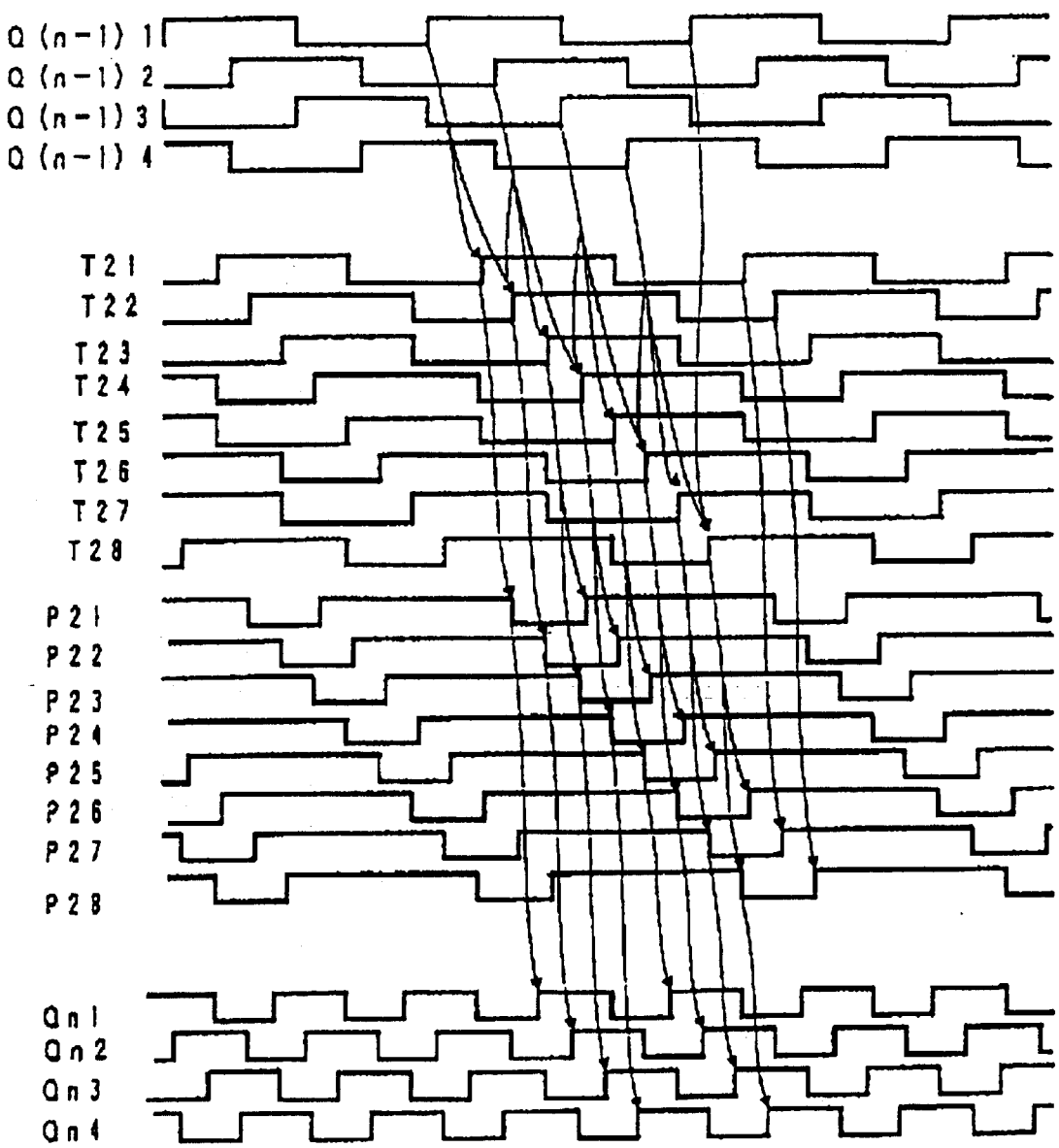
FIG. 7 is a diagram showing the timing waveforms of the 4-phase-clock frequency multiplying circuit according to the embodiment of the present invention shown in FIG. 6.

FIG. 7 is a signal waveform diagram showing the timing operation of the 4-phase-clock frequency multiplying circuit 5 depicted in FIG. 6. The rising edge of a clock T21 is decided by a delay, which is equivalent to the internal delay of the timing-difference dividing circuit 4a1, from the rising edge of a clock Q (n−1) 1 and similarly the rising edges T23, T25, T27 are each decided by a delay, which is equivalent to the internal delay of the timing-dividing circuit 4a3, 4a5, 4a7, respectively, from the rising edge of clock Q(n−1)2, Q(n−1)3, Q(n−1)4, respectively. The rising edge of a clock T22 is decided by the timing division and internal delay of the timing-difference dividing circuit 4a2 that operates on the timing of the rising edge of clock Q (n−1) 1 and on the timing of the rising edge of clock Q (n−1) 2; and the rising edge of a clock T24 is decided by the timing division and internal delay of the timing-difference dividing circuit 4a4 that operates on the timing of the rising edge of clock Q(n−1) 2 and on the timing of the rising edge of clock Q(n−1) 3. Similarly, the rising edge of a clock T26 is decided by the timing division and internal delay of the timing-difference dividing circuit 4a6 that operates on the timing of the rising edge of clock Q (n−1) 3 and on the timing of the rising edge of clock Q (n−1) 4; the rising edge a clock T27 is decided by the internal delay of the timing-difference dividing circuit 4a7 that operates on timing of the rising edge of a clock Q (n−1) 4; and the rising edge of a clock T28 is decided by the timing division and internal delay of the timing-difference dividing circuit 4a8 that operates on the timing of the rising edge of clock Q(n−1) 4 and on the timing of the rising edge of clock Q(n−1) 1. The clocks T21 and T23 are input to the pulse-width correction circuit 4c1. The latter outputs a pulse P21 having a falling edge decided by clock T21 and a rising edge decided by clock T23. Pulses P22 to P28 are generated through a similar procedure. The clocks P21 to P28 form an 8-phase pulse group of duty 25% in which the phases are shifted 45° at a time. The clock P21 and the clock P25, whose phase has been shifted 180° relative to clock P21, are multiplexed and inverted by the multiplexing circuit 4bI and output as clock Qn1 of duty 25%. Clocks Qn2 to Qn4 are generated in a similar manner. The clocks Qn1 to Qn4 form a 4-phase pulse group of duty 50% in which the phases are shifted 90° at a time. In the process of generating the clocks Qn1 to Qn4 from the clocks Q (n−1) 1 to Q (n−1) 4, the frequency of the clocks Qn1 to Qn4 is doubled.

FIGS. 8(a), (b) are diagrams showing examples of the structures of the timing-difference dividing circuits 4a1, 4a2, respectively, illustrated in FIG. 7. These circuits are identically constructed and the two inputs thereto are the same signals or two mutually adjacent signals that are different from each other. More specifically, identical inputs Q (n−1) 1 are applied to a 2-input NOR 14 of the timing-difference dividing circuit 4a1, and inputs Q (n−1) 1 and Q (n−2) 2 are applied to a 2-input NOR gate 14 of the timing-difference dividing circuit 4a2. The two timing-difference-dividing circuits are otherwise identical. As is well known, the 2-input NOR gate 14 comprises two P-channel MOS transistors, which have the input signals IN1, IN2 applied to the respective gates thereof, serially connected between a power supply VDD and an output terminal, and two N-channel MOS transistors, which have the input signals IN1, 1N2 applied to the respective gates thereof, parallel-connected between the output terminal and ground.

An internal node N51 (N61), which is the output node of the 2-input NOR gate 14, is connected to the input of an inverter 15. A circuit consisting of a serially connected N-channel MOS transistor MN51 and a capacitor CAP51, a circuit consisting of a serially connected N-channel MOS transistor MN52 and a capacitor CAP52, and a circuit consisting of a serially connected N-channel MOS transistor MN53 and a capacitor CAP53 are connected in parallel between the internal node and ground. The control signal 7 from the period sensing circuit 6 is connected to the gate of each of the N-channel MOS transistors MN51, MN52, MN53 to control the on/off operation of these transistors. The gate widths of the N-channel MOS transistors MN51, MN52, MN53 and the capacitances of the capacitors CAP51, CAP52 and CAP53 have a size ratio of, e.g., 1:2:4. On the basis of the control signal 7 output from the period sensing circuit 6, the load connected to the common node is adjusted in eight stages, whereby the clock cycle is set.

Figure 9:
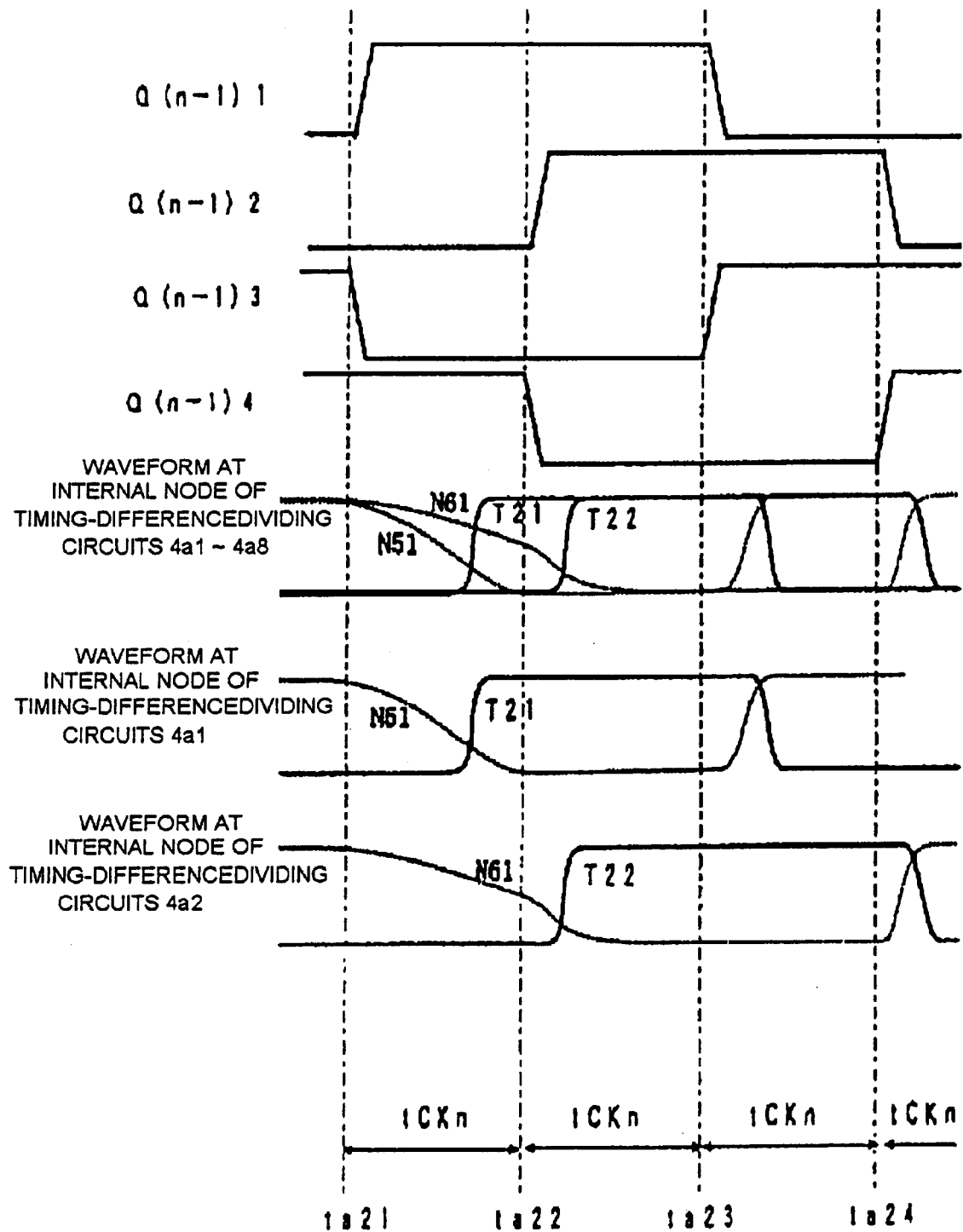
FIG. 9 is a diagram illustrating timing waveforms of the timing-difference dividing circuit shown in FIG. 8.

FIG. 9 is a timing diagram useful in describing the operation of the timing-difference dividing circuits 4a1, 4a2 depicted in FIG. 8.

With regard to the timing-difference dividing circuit 4a1, the charge at the internal node N51 is extracted via the N-channel MOS transistor of the NOR gate 14 by the rising edge of the clock Q (n−1) 1. When the potential at the node N51 reaches the threshold value of the inverter 15, the clock T21 at the output of the inverter 15 rises. Let CV represent the charge at the node N51 that requires to be extracted by the time the threshold value of the inverter 15 is reached (where C denotes a capacitance value and V represents voltage), and let I represent the discharge current of the N-channel MOS transistors of the NOR gate 14. The amount of charge CV is discharged by a current value of 2I from the rising edge of the clock Q (n−1) 1. As a result, a time CV/2I represents the timing difference (propagation delay time) from the rising edge of clock Q (n−1) 1 to the rising edge of clock T21. When the clock Q (n−1) 1 is at the low level, the node N51 on the output side of the 2-input NOR gate 14 is charged to the high level and the output clock T21 of inverter 15 assumes the low level.

With regard to the timing-difference dividing circuit 4a2, the charge at the internal node N61 is extracted via the NOR gate 14 in the period following time tCKn (where tCKn represents the clock period) from the rising edge of the clock Q (n−1) 1. When the potential at the node N61 reaches the threshold value of the inverter 15, the clock T22 rises from the rising edge of the clock Q (n−1) 2. Let CV represent the charge at the node N61 and let I represent the discharge current of the N-channel MOS transistors of the NOR gate 14. The amount of charge CV is discharged by a current value of I over the length of time tCKn from the rising edge of the clock Q (n−1) 1 and is extracted by current 2I over the remaining time. As a result, a time $$tCKn+(CV-tCKn \cdot I)/2I=CV/2I+tCKn/2 \quad (1)$$

represents the timing difference between the rising edge of clock Q(n−1) 1 and the rising edge of clock T22.

In other words, the timing difference between the rising edges of clocks T22 and T21 is tCKn/2.

The clock T22 rises if both clocks Q (n−1) 1 and Q (n−1) 2 assume the low level and the node N61 on the output side of the 2-input NOR gate 14 is charged to the high level from the power supply via the PMOS transistors of the NOR gate 14.

The above holds for clocks T22 to T28 as well so that the timing differences between the rising edges of the clocks T21 to T28 will each be tCKn/2.

The pulse-width correction circuits 4c1 to 4c8 generate the 8-phase pulse group P21 to P28 of duty 25% in which the phases are shifted 45° at a time.

The multiplexing circuits 4b1 to 4b8 generate the 4-phase pulse group Qn1 to Qn4 of duty 50% in which the phases are shifted 90° at a time.

The timing-difference dividing circuit 4a may have the structure shown in FIG. 10.

As shown in FIG. 10, the timing-difference dividing circuit 4a includes: a P-channel MOS transistor MP01 connected between the power supply and an internal node N1 and having a gate to which is input the output signal of a NAND gate NAND01 to which the first and second input signals IN1, IN2 are applied; an inverter INV03 for inverting and outputting the potential of the internal node N1; and N-channel MOS transistors MN01, MN02 having drains connected to the internal node N1, gates to which are input signals obtained by inverting the first and second input signals IN1, IN2 by the inverters INV01, INV02, respectively, and sources connected to constant-current sources I0. Connected between the internal node N1 and ground are switch elements MN11 to MN15 comprising N-channel MOS transistors and capacitors CAP11 to CAP15. The control signal 7 output from the period sensing circuit 6 is connected to the control terminals (gate terminals) of the switch elements MN11 to MN15 comprising N-channel MOS transistors, whereby the value of capacitance applied to the internal node N1 is decided. When the first and second input signals IN1, IN2 are at the high level, the P-channel MOS transistor MP01 turns on (conducts), the internal node N1 is charged and the output of the inverter INV03 assumes the low level. When either or both of the first and second input signals IN1, IN2 is at the low level, the P-channel MOS transistor MP01 turns off and either or both of the N-channel MOS transistors NM01, NM02 turns on to discharge the internal node N1. If the potential at the node N1 falls below the threshold value of the inverter INV03, the output of the inverter rises at attains the high level.

In a case where the timing-difference dividing circuit is constructed by connecting the outputs of two CMOS inverters whose inputs are the inputs IN1, IN2, a through-current flows when one of the two inputs is high and the other is low. With the timing-difference dividing circuit constructed as shown in FIG. 10, on the other hand, the through-current is reduced.

The phase adjusting interpolator 30 will now be described. As mentioned earlier, a phase comparator circuit senses the phase difference between the output of the interpolator 30 and a predetermined reference clock (e.g., the input clock 1 of FIG. 1 is used as the reference) and outputs an UP or DOWN signal in dependence upon whether the phase of the interpolator output lags or leads relative to the phase of the reference clock. The internal-division ratio of timing-difference division in the interpolator 30 is set by the control signal C produced by the control circuit 40, which includes a counter and a decoder. The output of the phase comparator circuit is smoothed by a filter and is then input to the counter, which counts this signal up or down. The decoder decodes the counter output.

FIG. 11 is a diagram showing an example of the structure of a phase adjusting interpolator according to an embodiment of the present invention.

As shown in FIG. 11, the interpolator 30 includes: a P-channel MOS transistor MP01 having a source connected to the power supply, a drain connected to an internal node N31 and a gate to which is input the output signal of a NAND gate NAND01 having the first and second inputs IN1, IN2 applied thereto; a buffer circuit BUF (an inverting or a non-inverting circuit) for switching the logic value of the output signal when there is a change in the size relationship between the potential of the internal node and a threshold voltage; N-channel MOS transistors (switch elements) MN21, MN23, MN25 whose drains are connected in common with the internal node N31 and which are turned on and off by the control signal C from the control circuit 40; N-channel MOS transistors MN22, MN24, MN26 having drains connected to the sources of the N-channel MOS transistors MN21, MN23, MN25, respectively, sources connected to respective ones of constant-current sources I0 and gates to which are input a signal obtained by inverting the first input signal IN1 by an inverter INV01; N-channel MOS transistors (switch elements) MN27, MN29, MN31 whose drains are connected in common with the internal node N31 and which are turned on and off by the control signal C from the control circuit 40; and N-channel MOS transistors MN28, MN30, MN32 having drains connected to the sources of the N-channel MOS transistors (switches) MN27, MN29, MN31, respectively, sources connected to respective ones of constant-current sources I0 and gates to which are input a signal obtained by inverting the second input signal IN2 by an inverter INV02.

Connected in parallel between the internal node and ground are a plurality of series circuits each comprising a switch element (N-channel MOS transistor) and a capacitor (switch elements MN11 to MN15, capacitors CAP11 to CAP15). Capacitance applied to the internal node is decided by the cycle control signal 7 connected to the control terminals of respective ones of the switch elements MN11 to MN15. The capacitances CAP11, CAP12, CAP13, CAP14 and CAPl5 have capacitance values C, 2C, 4C, 8C and 16C, respectively, and the cycle control signal 7 applied to the switch elements MN11 to MN15 is provided by the period sensing circuit 6 of the frequency multiplying interpolator 10. It should be noted that the placement of the N-channel MOS transistors may be interchanged in such a manner that the drains of the N-channel MOS transistors MN22, MN24, MN26, MN28, MN30 a and MN32 are connected in common with the internal node N31, the sources thereof are connected to the drawings of the N-channel MOS transistors MN21, MN23, MN25, MN27, MN29 and MN31, and the sources of the N-channel MOS transistors MN21, MN23, MN25, MN27, MN29 and MN31 are connected to the constant-current sources I0. The interpolator 30 outputs a negative-going signal corresponding to the phase obtained by internally dividing the timing difference (phase difference) between the falling edges of the two input signals IN1 and IN2.

More specifically, let T1 represent delay time up to the falling edge of the signal output by the buffer BUF in a case where the same signal IN1 is applied to the two inputs of the interpolator 30, and let T2 represent delay time up to the falling edge of the signal output by the buffer BUF in a case where the same signal IN2 (which lags behind the signal IN1 by the time T) is applied to the two inputs of the interpolator 30. In a case where the two input signals IN1, IN2 are the inputs to the interpolator 30, delay time T3 up to the falling edge of the signal output by the buffer BUF is set to a value [=(1x) ·T1+x·T2; where x represents the internal-division ratio and $0 \leq x \leq 1$ holds)) between T1 and T2. Depending upon the application, an inverting-type buffer (an inverter) may be substituted for the non-inverting-type buffer BUF. Further, the PMOS and NMOS transistors may be interchanged.

In this embodiment of the present invention, the number of switch elements that turn on among the switch elements MN21, MN23, MN25, MN27, MN29, MN31 of the rotary switch 20 is varied by the control signal C from the control circuit 40, whereby the timing difference between two input signals IN1 and IN2 is varied. That is, when the input signal IN1 undergoes a transition from the high to the low level, the value of the current that discharges the electric charge that has accumulated in the internal node N31 can be controlled by the number of switch elements MN21, MN23, MN25 turned on. When the input signal IN2 undergoes a transition from the high to the low level, the value of the current that discharges the electric charge that has accumulated in the internal node N31 can be controlled by the number of switch elements MN27, MN29, MN31 turned on. As a result, the internal-division ratio of the timing difference between the input signal IN1 and IN2 can be controlled and changed.

When all of the switch elements MN21, MN23, MN25, MN27, MN29, MN31 are turned on by the value of the control signal C, the time required to discharge the charge from the internal node N31 is minimized (discharge is by a current 3I0 when the first input signal IN1 is low and by a current 6I0 when the input s signals IN1, IN2 are low) and the delay time of output clock from the buffer BUF is minimized (the internal-division ratio is minimized). When one of the switch elements MN21, MN23, MN25 is turned on and one of the switch elements MN27, MN29, MN31 is turned on, the time required to discharge the charge from the internal node N31 is maximized (the internal-division ratio is maximized) (discharge is by a current I0 when the input signal IN1 is low and by a current 2I0 when the input signals IN1, IN2 are low) and the delay time of output clock from the buffer BUF is maximized. In this case, there are at least six combinations of ways to internally divide the timing difference depending upon the combination of bits constituting the control signal C.

Values of the internal-division ratios of timing difference (phase difference) between the input signals IN1 and IN2 can be set more finely by increasing the number of switch elements MN21, MN23, MN25, MN27, MN29, MN31. That is, the number of switch elements MN21, MN23, MN25, MN27, MN29, MN31 is arbitrary. Of course, the gate widths [or ratio of gate length (W) to gate width (L)] of the N-channel MOS transistors MN22, MN24, MN26 and gate widths of the N-channel MOS transistor MN28, MN30, MN32 can be changed to vary the current values of respective ones of the constant-current sources I0. It should be noted that any method in addition to the above-described method may be used to control the internal division of the timing difference.

An example of the operation for internally dividing the timing difference in the interpolator 30 will be described in greater detail with reference to FIG. 11. In the description that follows, it is assumed that 16 parallel-connected N-channel MOS transistors MN22, MN24, MN26 (and 16 N-channel MOS transistors MN21, MN23, MN25 also) are provided and have the signal obtained by inverting the input signal IN1 applied commonly to their gates, and that 16 parallel-connected N-channel MOS transistors MN28, MN30, MN32 (and 16 N-channel MOS transistors MN27, MN29, MN31 also) are provided and have the signal obtained by inverting the input signal IN2 applied commonly to their gates.

Assume for example that complementary control signals are input to the gates of the N-channel MOS transistors MN21, MN27 (the control signal input to the gate of the N-channel MOS transistor MN27 is a signal obtained by inverting the control signal input to the gate of the N-channel MOS transistor MN21), that complementary control signals are input to the gates of the N-channel MOS transistors MN23, MN29 and that complementary control signals are input to the gates of the N-channel MOS transistors MN25, MN31.

Operation for internally dividing the timing difference will be described for a case where N-number of 16 parallel-connected N-channel MOS transistors are turned on (where N is 0 to 16, N=0 represents a case where no transistors are turned on, and N is decided by the control signal C) by the input signal IN1 and then, after a period of time T, (16−N)-number of parallel-connected N-channel MOS transistors are turned on by the input signal IN2, whereby a total of N+(16−N)=16 N-channel MOS transistors are turned on.

Let I represent the current that flows into one parallel-connected N-channel MOS transistor, let V represent a threshold-value voltage at which the output of the buffer BUF changes state, and let CV represent the amount of change in electric charge up to attainment of the threshold-value voltage V.

Assume now that the input signals IN1, IN2 are both at the high level, so that the output of the NAND gate NAND01 is the low level and the internal node N31 has been charged (bringing the output of the buffer BUF to the high level) from the power-supply side via the P-channel MOS transistor MP01. A case where the input signals IN1, IN2 fall to the low level will now be described.

First, if N=16 holds, 16 of the 16 parallel-connected N-channel MOS transistors are turned on by the input signal IN1 and then, after a period of time T, all 16 of the 16 parallel-connected N-channel MOS transistors are turned off [(16−N)=0]. Accordingly, when N=16 holds, a time T (16) required for the output of the buffer BUF to change state after the input signal IN1 falls to the low level is as follows, where I represents the current of the constant-current source:

$$T(16)=CV/(16 \cdot I) \qquad (2)$$

In a case where N=n (n<16) holds (N is set by the control signal C), n-number of N-channel MOS transistors to the gates of which the signal obtained by inverting the input signal IN1 is applied turn on in the period of time T (where T represents the timing difference between the falling edges of the input signals IN1 and IN2) after the input signal IN1 falls to the low level, as a result of which electric charge equivalent to n·I·T is discharged. Next, in response to the second input signal IN2 falling to the low level, (16−n)-number of N-channel MOS transistors to the gates of which the signal obtained by inverting the input signal IN2 is applied turn on, so that a total of 16 N-channel MOS transistors are on. Accordingly, the output of the buffer BUF changes state (from the high to the low level) at the moment electric charge (CV−n·I·T) that remains on the internal node N31 is discharged by (16·I). A time T' is given by (CV−n·I·T)/16·I).

Accordingly, the time T (n) it takes for the output of the buffer BUF to change state after the input signal IN1 falls to the low level is as follows:

$$T(n)=(CV-n \cdot I \cdot T)/(16 \cdot I)+T = CV/(16 \cdot I)-(n/16) \ T+T = T(16)+[(16-n)/16] \cdot T \qquad (3)$$

Output signals of phases that are the result of dividing the timing difference T between the input signals IN1 and IN2 into 16 equal parts by the value of n are obtained. That is, by varying n by the setting of the control signal, there can be obtained an output signal of any phase that is the result of dividing the timing difference between the input signals IN1 and IN2 at a resolution of ¹⁄₁₆. Such an interpolator is referred to also as a "16-step interpolator".

The interpolator 30 shown in FIG. 11 is used in an application for outputting a signal obtained by internally dividing the timing difference between the falling edges of the first and second input signals IN1 and IN2, as described above. The circuit structure of the interpolator 30 adapted to a signal obtained by internally dividing the timing difference between the rising edges of the first and second input signals IN1 and IN2 is as shown in FIG. 12, by way of example.

As shown in FIG. 12, the interpolator 30 includes: the P-channel MOS transistor MPO1 having a source connected to the power supply, a drain connected to the internal node N31 and a gate to which is input the output signal of an OR gate OR01 having the first and second inputs IN1, IN2 applied thereto; an inverter INV03 having an input terminal connected to the internal node N31 and an output terminal for producing an output signal; the N-channel MOS transistors (switch elements) MN21, MN23, MN25 whose drains are connected in common with the internal node N31 and which are turned on and off by the control signal C from the control circuit 40; the N-channel MOS transistors MN22, MN24, MN26 having drains connected to the sources of the N-channel MOS transistors MN21, MN23, MN25, respectively, sources connected to respective ones of the constant-current sources I0 and gates to which the first input signal IN1 is applied; the N-channel MOS transistors (switch elements) MN27, MN29, MN31 whose drains are connected in common with the internal node N31 and which are turned on and off by the control signal C from the control circuit 40; and the N-channel MOS transistors MN28, MN30, MN32 having drains connected to the sources of the N-channel MOS transistors (switches) MN27, MN29, MN31, respectively, sources connected to respective ones of constant-current sources I0 and gates to which the second input signal IN2 is applied. Furthermore, connected in parallel between the internal node and ground are the switch elements MN11 to MN15 comprising N-channel MOS transistors and the capacitors CAP11 to CAP15. Capacitance applied to the internal node is decided by the cycle control signal 7 connected to the control terminals of respective ones of the switch elements MN11 to MN15. The capacitances CAP11, CAP12, CAP13, CAP14 and CAP15 have capacitance values C, 2C, 4C, 8C and 16C, respectively, and the cycle control signal 7 applied to the switch elements MN11 to MN15 is provided by the period sensing circuit 6 of the frequency multiplying interpolator 10.

It is assumed also in the circuit shown in FIG. 12 that 16 parallel-connected N-channel MOS transistors MN22, MN24, MN26 (and 16 N-channel MOS transistors MN21, MN23, MN25 also) are provided and have the input signal IN1 applied commonly to their gates, and that 16 parallel-connected N-channel MOS transistors MN28, MN30, MN32 (and 16 N-channel MOS transistors MN27, MN29, MN31 also) are provided and have the input signal IN2 applied commonly to their gates. Further, the arrangement is such that N-number of 16 parallel-connected N-channel MOS transistors are turned on (where N is 0 to 16, N=0 represents a case where no transistors are turned on, and N is decided by the control signal C) by the input signal IN1 and then, after a period of time T, (16−N) -number of parallel-connected N-channel MOS transistors are turned on by the input signal IN2, whereby a total of N+(16−N)=16 N-channel MOS transistors are turned on. Through a principle similar to that described above in connection with Equation (3), the phase of the rising edge of the output signal can be adjusted by 16 steps of the timing difference T between the rising edges of the input signals IN1 and IN2. Depending upon the application, the arrangement of FIG. 12 may be modified by replacing the inverter INV03 with a non-inverting buffer circuit (constructed by connecting two inverters together, by way of example).

If on the basis of the phase comparison by the phase comparator circuit (not shown) it is found that the phase of the output of interpolator 30 leads the phase of the reference clock, then, in order to delay the phase of the interpolator output, the control circuit 40 in FIGS. 1, 11 and 12 reduces the number of ON switches [reduces n in Equation (3)] among the group of switch elements MN21, MN23, MN24 and among the group of switch elements MN27, MN29, MN31. If as a result of comparing the phase of the output signal of the interpolator 30 under these conditions with the phase of the reference clock by the phase comparator circuit it is found that a further delay of phase is necessary, the control circuit 40 responds to the output of the phase comparator circuit by reducing the number of ON switches. If, in a case where the control circuit 40 cannot reduce the number of ON switches any further (i. e. , a case where the upper limit of the setting of the internal division ratio has been reached, e.g., a case where only one switch element MN21 among the switch elements MN21, MN23, MN25 is ON and only one switch element MN27 among the switch elements MN27, MN29, MN31 is ON), the control circuit 40 receives a signal from the phase comparator circuit indicating that a further delay of phase is necessary, a count-up signal enters the counter within the control circuit 40 and the decoder circuit responds by outputting the selection control signal S to the rotary switch 20.

In FIG. 1, assume that the rotary switch 20 has selected the multiphase clocks P0, P1 (the phase of clock P1 lags behind that of clock P0 by 360°/n) and that these are supplied to the interpolator 30 as the first and second inputs IN1, IN2, respectively. If the phase of the output of interpolator 30 has been delayed and the upper limit on the setting of the internal division ratio of the timing difference in interpolator 30 has been reached, the control circuit 40 changes over the first input IN1 of interpolator 30 from the output clock P0 to the output clock P2 obtained from the frequency multiplying interpolator 10. The output signal produced by the interpolator 30 is that obtained by internally dividing the phase difference between the clocks P0 and P2. In this case, if the phase of the output of interpolator 30 is lagging behind the phase of the reference clock the number of ON switches among the switch elements MN21, MN23, MN25 and among the switch elements MN27, MN29, MN31 is increased.

If the phase of the output of interpolator 30 still leads the phase of the reference clock and it is necessary to delay the phase of the output of interpolator 30, the control circuit 40 changes over the second input IN2 of interpolator 30 from the output clock P1 to the output clock P3 obtained from the frequency multiplying interpolator 10. The output signal produced by the interpolator 30 is that obtained by internally dividing the phase difference between the clocks P0 and P3.

In the control circuit 40, a decoder supplies the control signal C to the control terminals of the switch elements MN21, MN23, MN25 and MN27, MN29, MN31 comprising the N-channel MOS transistors of the interpolator 30. The circuitry constructing the decoder is decided by the number of switch elements MN21, MN23, MN25 and MN27, MN29, MN31 and the order in which these switch elements are turned on and off in accordance with the result of the phase comparison performed by the phase comparator circuit. The decoder may be constructed in such a manner that output signals of flip-flops constructing a shift register and signals obtained by inverting these output signals are supplied as the control signal C.

A second embodiment of the present invention will now be described.

FIG. 2 is a block diagram illustrating the structure of a second embodiment of the present invention.

As shown in FIG. 2, this embodiment differs from the first embodiment in that there are provided a plurality of interpolators 300 to 301 each of which outputs a signal obtained by internally dividing a phase difference between two signals output from a switch 20', the outputs of the interpolators constituting frequency-multiplied clocks Q0 to Qn. In the second embodiment, the structures of the frequency multiplying interpolator 10 and of the individual interpolators 300 to 301 are identical with those of the frequency multiplying interpolator 10 and interpolator 30 described in connection with the first embodiment.

Figure 3:
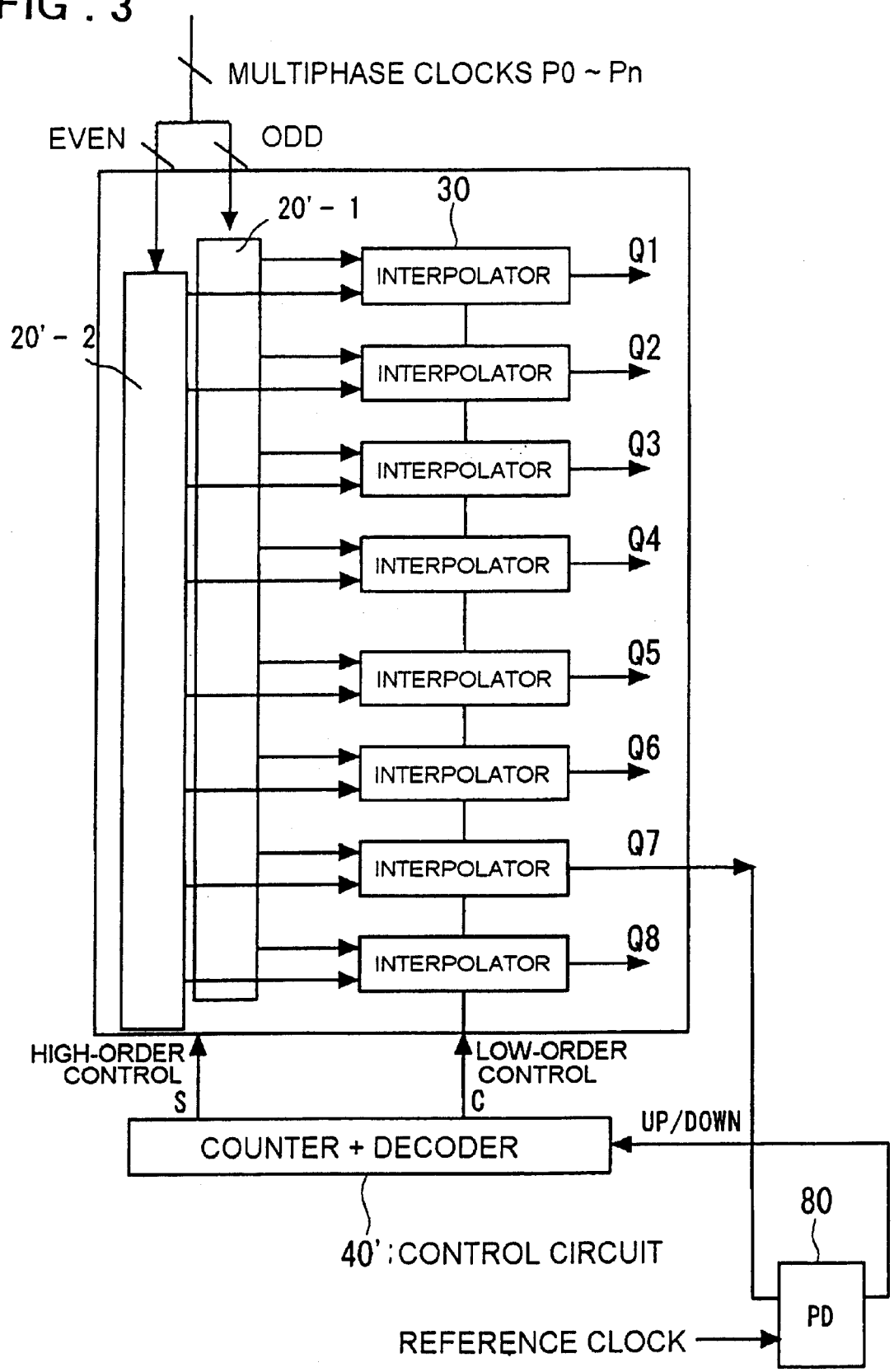
FIG. 3 is a block diagram illustrating the structure of the second embodiment of the present invention.

FIG. 3 is a block diagram showing an example of the structure of the switch 20' and of the arrangement of the plurality of interpolators 30 according to the second embodiment of the invention.

As shown in FIG. 3, the switch 20' has a selector switch 20'-1 to which odd-phase clocks among the multiphase clocks P0 to Pn are input, for selectively outputting odd-phase clocks to the interpolators 30, and a selector switch 20'-2 to which even-phase clocks among the multiphase clocks P0 to Pn are input, for selectively outputting even-phase clocks to the interpolators 30.

Phase comparator circuits (PD) 80 compare the phases of the outputs Q1 to Q8 of the interpolators 30 and the phase of a reference clock and output the results (UP/DOWN signals) of the phase comparison. The UP/DOWN signals control the setting of the internal-division ratios of the corresponding interpolators 30. For the sake of simplicity, only one phase comparator circuit (PD) 80 for comparing output Q7 and the reference clock is shown in FIG. 3. Further, a low-pass filter for smoothing the result of the phase comparison from the phase comparator circuit (PD) 80 is not shown in FIG. 3.

In a manner similar to that of the control circuit 40 described in conjunction with the first embodiment, the control circuit 40' comprises a counter and a decoder circuit and outputs the control signal C to each interpolator 30. If it is necessary to advance or delay phase further in a case where the internal-division ratio of an interpolator 30 has attained an upper or lower limit, the control circuit 40' exercises control to change over the odd-phase clock, which is supplied to the interpolator 30 as the first input signal, to the immediately adjacent odd-phase clock on either side, and to change over the even-phase clock, which is supplied to the interpolator 30 as the second input signal, to the immediately adjacent even-phase clock on either side.

Figure 14:
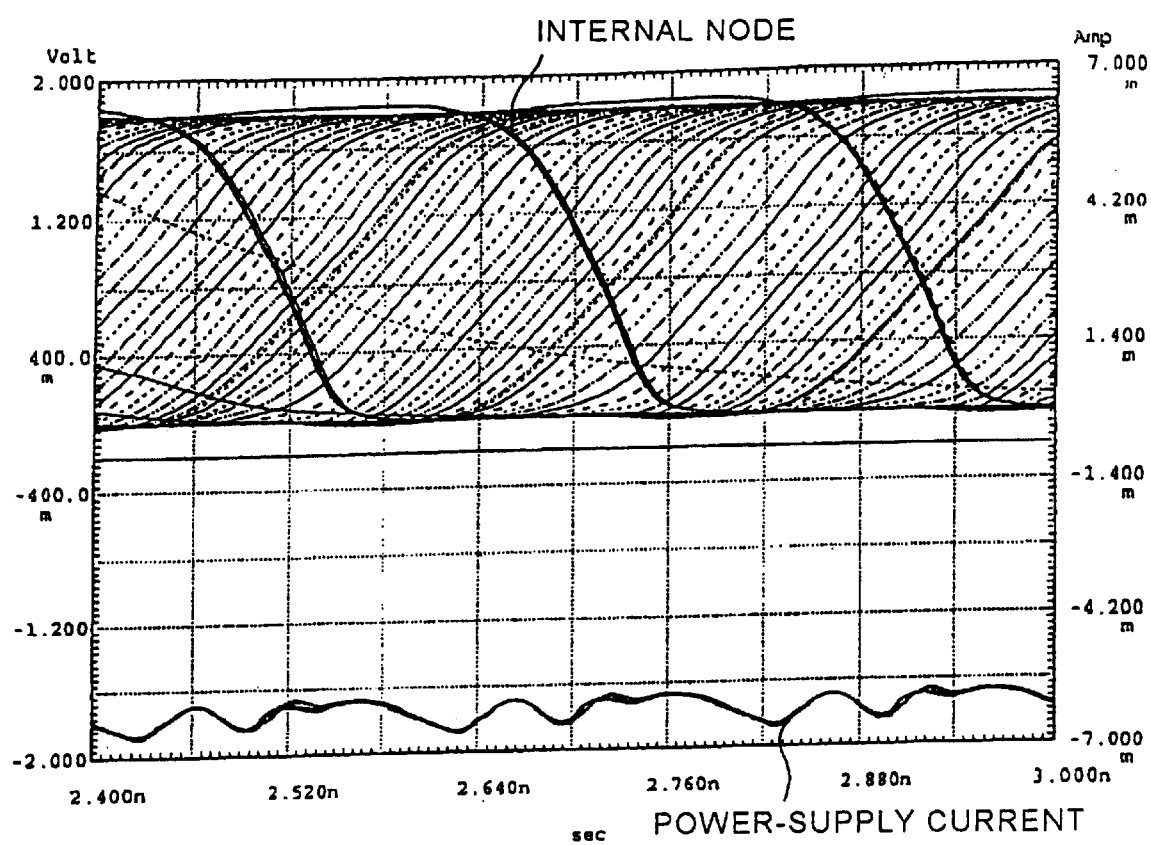
FIG. 14 is a diagram illustrating an example of the results of simulating an output timing waveform of an interpolator according to an embodiment of the present invention.

FIG. 14 is a diagram showing results obtained by investigating the operation of a clock control circuit according to an embodiment of the present invention. FIG. 14 depicts the results obtained by using a circuit simulator (SPICE 2) to simulate the voltage waveform of the internal node of an interpolator (e.g., see FIG. 11) to which a frequency-multiplied 8-phase clock (625 MHz) is input, and the output clock waveform (an 8-phase-signal waveform that intersects the voltage waveform of the internal node and is indicated by the rising solid lines, dash lines and dot-and-dash lines, etc.). FIG. 14 demonstrates that it is possible to obtain an output at a resolution of 12.5 ps.

The functions set forth below are implemented in accordance with the embodiments of the present invention described above.

Instant frequency multiplying function:

Because the present invention does not have a feedback loop such as in a PLL or DLL in order to generate multiphase clocks, there is no time lag involved in outputting a phases-synchronized signal as a result of which a frequency-multiplied clock can be produced in an instant.

Jitter reducing function:

The clock control circuit of the present invention is free of loop jitter. In addition, jitter in the interpolator is averaged to reduce jitter present between clock cycles.

Instant multiphase-clock supply function:

Multiphase clocks are supplied by a plurality of interpolators in an instant.

Multiphase-clock phase correction function:

The phases of frequency-multiplied and multiphase clocks are corrected in the frequency multiplying interpolator, and phase is adjusted in the fine adjusting interpolator.

Because a PLL (VC0) is not used, broadband operation becomes possible and it is possible to reduce development and manufacturing cost and to shorten development time.

All circuitry inclusive of the interpolator 30 is digital. This makes possible low-voltage operation and a reduction in power consumption.

The clock control circuit according to the present invention that implements the above-described functions is ideal for use in circuitry for controlling the phase of a clock in a semiconductor integrated circuit device and in a clock-and-data recovery circuit.

A third embodiment of a clock control circuit according to the present invention will now be described with reference to the drawings.

Figure 15:
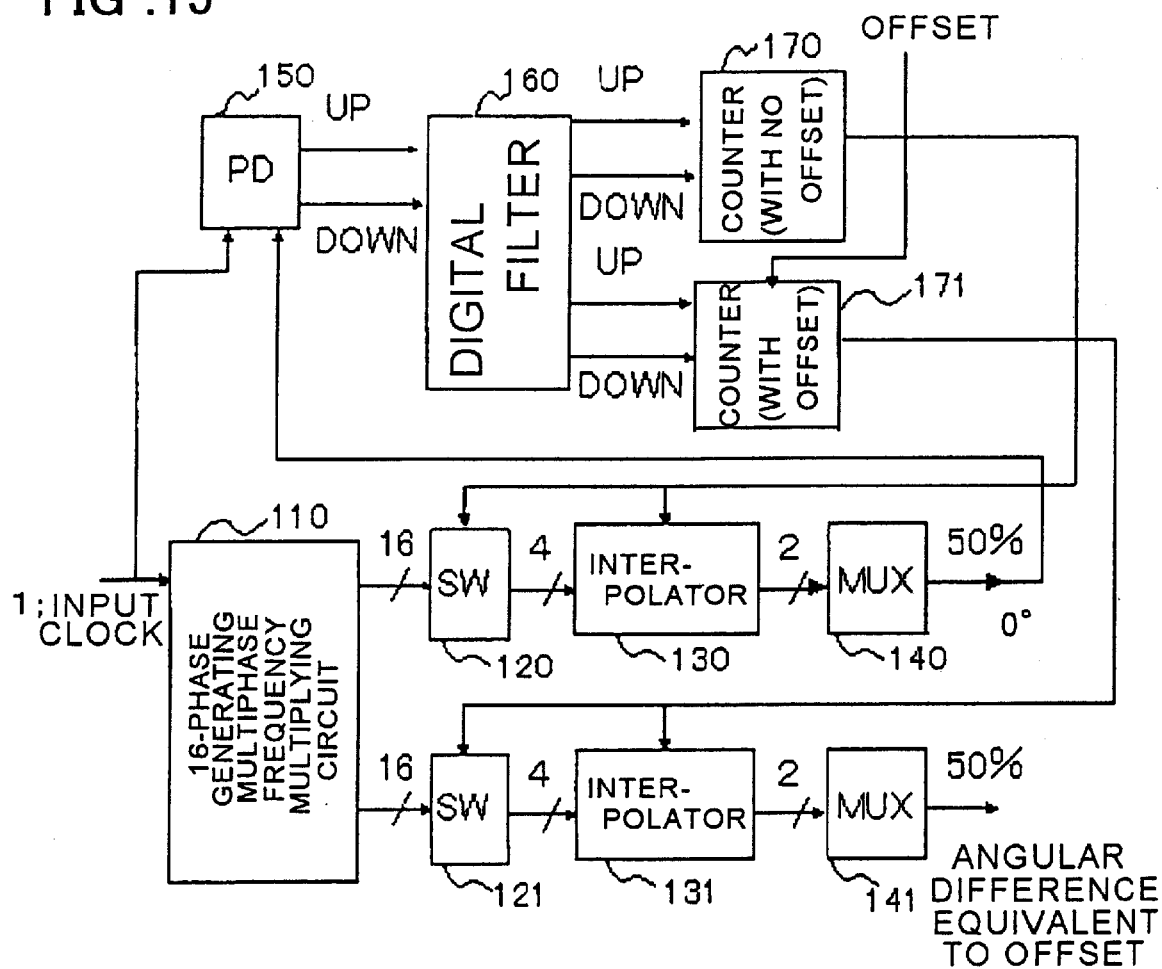
FIG. 15 is a block diagram illustrating the structure of a third embodiment of the present invention.

FIG. 15 is a block diagram illustrating the structure of a clock control circuit according to a third embodiment of the present invention.

As shown in FIG. 15, the clock control circuit of the third embodiment uses shift-register-type counters 170, 171 and has phase adjusting interpolators 130, 131 serving as the control cirrcuit 40 of the first embodiment. The interolator 130 is for finely adjusting the phase difference between input clocks to 0°, and the fine adjusting interpolator 131 outputs a clock signal obtained by shifting phase by an amount equivalent to any angle (offset).

More specifically, as shown in FIG. 15, a multiphase frequency multiplying circuit 110 to which the input clock 1 is input for generating multiphase frequency-divided clocks is constituted by, e.g., the frequency multiplying interpolator 10 described in the foregoing embodiments. The multiphase frequency multiplying circuit 110 (referred to also as a "16-phase generating multiphase frequency multiplying circuit"), which frequency multiplies the input clock and generates a 16-phase clock, is constituted by the frequency multiplying interpolator 10 described earlier. More specifically, the frequency multiplying interpolator 10 shown in FIG. 5 is constituted by a $\frac{1}{16}$ frequency divider and a 16-phase-clock frequency multiplying circuit. By using the frequency multiplying interpolator 10 as the multiphase frequency multiplying circuit 110, the jitter component of the input clocks can be averaged and the jitter component of the multiphase frequency-multiplied clocks can be reduced [see FIG. 13(a)].

In the third embodiment of the present invention, there are provided first and second switches 120, 121, to which the multiphase clock (16-phase clock) output from the multiphase frequency multiplying circuit 110 is input, for selecting and outputting combinations of four clocks the phases whereof satisfy a predetermined relationship. Also provided are a first interpolator 130 to which two pairs of clocks (four signals) output from the first switch 120 are input, and a second interpolator 131 to which two pairs of clocks (four signals) output from the second switch 121 are input.

The first and second switches 120, 121 each comprise rotary switches of the kind described above. Among the 16-phase clocks output by the multiphase frequency multiplying circuit 110, each of the switches 120, 121 selects and outputs a clock pair comprising a first clock (e.g., an even-phase signal) the phase of which is, e.g., 0°, and a second clock (an odd-phase signal) the phase of which neighbors that of the first clock, and a clock pair comprising a third clock having a predetermined phase difference (e.g., 180°) with respect to the first clock, and a fourth clock the phase of which neighbors that of the third clock.

Figure 16:
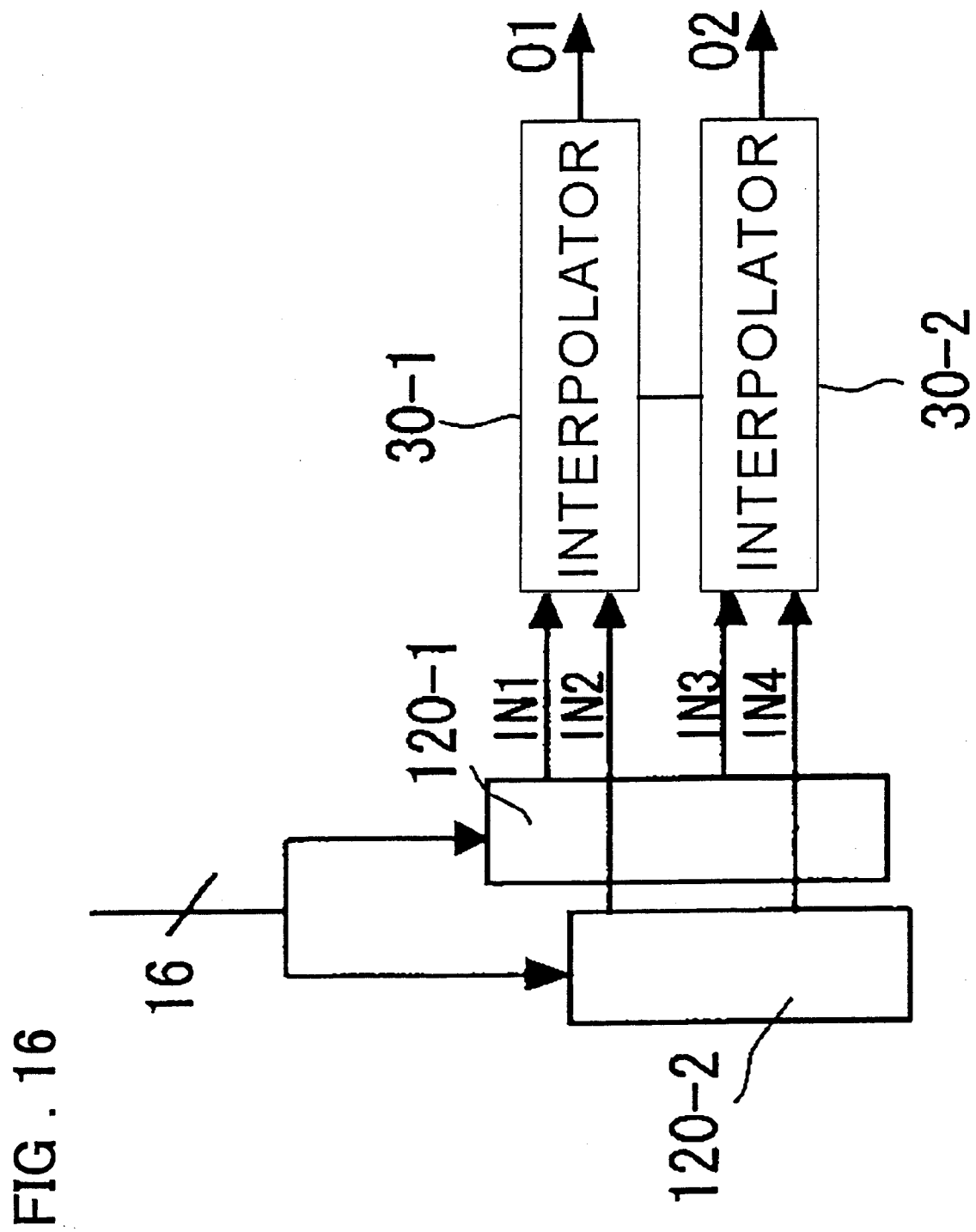
FIG. 16 is a block diagram illustrating the structures of a switch and interpolator according to the third embodiment of the present invention.

FIG. 16 is a diagram illustrating the connections between the first switch 120 and first interpolator 130 in the third embodiment of the present invention. The second switch 121 and second interpolator 131 are similarly arranged.

As shown in FIG. 16, the first and second interpolators 130, 131 each have a first phase adjusting interpolator 30-1 for outputting a first output signal 01, which is obtained by internally dividing the timing difference between the first input signal IN1 and second input signal IN2 output from rotary switches 120-1, 120-2 constructing the first switch 120, and a second phase adjusting interpolator 30-2 for outputting a second output signal 02, which is obtained by internally dividing the timing difference between the third input signal IN3 and fourth input signal IN4 output from rotary switches 120-1, 120-2.

The first phase adjusting interpolator 30-1 outputs the first output signal 01, which has a rising edge that corresponds to a phase obtained by internally dividing the timing difference between the rising edges of the input signals IN1 and IN2, and the second phase adjusting interpolator 30-2 outputs the second output signal 02, which has a rising edge that corresponds to a phase obtained by internally dividing the timing difference between the rising edges of the input signals IN3 and IN4.

The first output signal 01 and second output signal 02 enter a multiplexing circuit 140 in FIG. 15. The multiplexing circuit 140 combines the first and second output signals 01, 02 into a pulse signal (a signal having a duty of, e.g., 50%) determined by the edges of these two signals, thereby multiplexing the signals into a single signal that is delivered as an output.

Structurally, the rotary switches 120-1, 120-2 basically is the same as the rotary switches 20'-1, 20'-2 described above with reference to FIG. 3. A 16-phase multiphase clock is applied as an input, from which two clock pairs each having an odd-phase clock and an even-phase clock are selected and supplied to the interpolators 30-1, 30-2 for phase adjustment.

If the phase difference between the input clock 1 and the output of the interpolator 130 is adjusted to 0°, a first clock of 0 phase is selected from the 16-phase clock output of the multiphase frequency multiplying circuit 110 as the first signal IN1 output by the rotary switch 120-1, and a clock (a second clock) neighboring the signal IN1 and differing in phase by 360°/16 is selected as the second signal IN2 selectively output from the second rotary switch 120-2. The signals IN1, IN2 are supplied to the interpolator 130. Operation is similar with regard to the interpolator 131 as well.

If the clock duty is 50%, a signal of 180° phase (the ninth clock among the clocks of 16 phases) is selected from the 16-phase clock output of the multiphase frequency multiplying circuit 110 as the third signal IN3 selectively output by the rotary switch 120-1, and a clock (e.g., tenth clock) of a phase neighboring the signal IN3 is selected as the fourth signal IN4 selectively output from the second rotary switch 120-2. The signals IN3, IN4 are supplied to the interpolator 130. Though the signals selected as the first and second signals IN1, IN2 are neighboring in phase and the signals selected as the third and fourth signals IN3, IN4 are neighboring in phase, the first signal IN1 and third signal IN3 are selected freely depending upon the phase (e.g., 0°) set with respect to the input clock 1 and the value of the duty ratio (e.g., 180° in case of a duty ratio of 50% ). Operation is similar with regard to the interpolator 131 as well.

The first and second phase adjusting interpolators 30-1, 30-2 are similar to the interpolator 30 described above with reference to FIG. 12. In this embodiment, the interpolator 30 is so adapted that the internal-division ratio of the timing difference T between the two input signals is varied in 16 steps by the control signal.

In this case, the switches 120, 121 select pairs of clocks of neighboring phases (360°/16) and the first and second interpolators 130, 131 internally divide the phase differences of the clock pairs in increments of 16. Thus, phase can be adjusted at a resolution of [360° (one cycle of the input clock)]/[256 (=16×16)].

With reference again to FIG. 15, the clock control circuit includes the first multiplexing circuit 140 for multiplexing and outputting the first and second signals produced by the first and second phase adjusting interpolators of the first interpolator 130, and the second multiplexing circuit 141 for multiplexing and outputting the first and second signals produced by the first and second phase adjusting interpolators of the second interpolator 131.

The clock control circuit further includes a phase comparator circuit 150 for detecting the phase difference between the output signal from the multiplexing circuit 140 and the input clock; a digital filter 160 for smoothing UP and DOWN signals output from the phase comparator circuit 150; a first counter 170 for counting up (up-shifting) and counting down (down-shifting) based upon the UP and DOWN signals output from the digital filter 160; and a second counter (with an offset) 171, in which an offset value is loaded, for counting up (up-shifting) and counting down (down-shifting) based upon the UP and DOWN signals output from the digital filter 160. Switching by the first switch 120 and phase adjustment by the first interpolator 130 are performed based upon the count output by the first counter 170, and setting of the internal-division ratio of the second phase adjusting interpolator 131 and switching of the clock output in the second switch 121 are performed based upon the clock output by the second counter 171.

The multiplexing circuit 141 outputs a clock the phase of which has been shifted from that of the input clock 1 by an angle decided by the offset value.

The counters 170, 171, which output control signals to the switches 120, 121 that switch among the outputs from the 16-phase frequency multiplying circuit 110 and to the 16-step interpolators 130, 131, comprise 8-bit shift-register-type counters, by way of example. The four high-order bits are used to control the switching of the switches (rotary switches) 120, 121, and the four low-order bits are used for the control signals that set the internal-division ratios of the 16-step interpolators 130, 131.

In the third embodiment of the present invention, a frequency multiplying interpolator is ideal for use as the multiphase frequency multiplying circuit 110 that generates the multiphase clock from the input clock 1, as mentioned above. However, the invention is not limited to a frequency multiplying interpolator. For example, it goes without saying that the arrangement of the interpolators 130, 131, etc., can be applied even with respect to an implementation in which a multiphase clock from a PLL or DLL is supplied to the switches 120, 121.

FIG. 17 is a diagram showing an example of a layout a obtained by integrating the phase adjusting interpolator used in the present invention. This illustrates an example of the layout pattern of an interpolator (a 16-step interpolator) (constructed as shown in FIG. 16) for adjustments of 0° and 180°

A fourth embodiment of the present invention will now be described. FIG. 18 is a block diagram illustrating the structure of a fourth embodiment of the present invention.

In the fourth embodiment, a binary counter and decoders are provided as the control circuit, and a 0° fine adjusting interpolator and an interpolator that can be set freely to any angle are provided. The angle is set through calculation by an adder circuit whenever a phase adjustment is performed by the control circuit. In order to adjust for the delay of a clock transmission path (referred to as a "CTS") laid out and wired by a clock tree sequence (a layout design method of placing a delay-averaging buffer along a tree-shaped clock transmission path and reducing cross skew), a dummy circuit providing an amount of delay equal to that of the CTS is provided.

More specifically, as shown in FIG. 18, the clock control circuit includes: the multiphase frequency multiplying circuit 110 for generating and outputting a multiphase clock obtained by frequency multiplying the input clock 1; the first and second switches 120, 121, to which the multiphase clock output from the multiphase frequency multiplying circuit 110 is input, for selecting and outputting a plurality of clocks from the multiphase clock; the first interpolator 130 to which the output (first to fourth signals) of the first switch 120 is input; and the second interpolator 131 to which the output (first to fourth signals) of the second switch 121 is input. In the fourth embodiment of the present invention, the multiphase frequency multiplying circuit 110 (referred to also as a "16-phase generating multiphase frequency multiplying circuit"), which generates the 16-phase clock by frequency multiplying the input clock, comprises the frequency multiplying interpolator described in the foregoing embodiments. It is constructed by providing the frequency multiplying interpolator 10 shown in FIG. 5 with a ¹⁄₁₆ frequency divider and 16-phase-clock frequency multiplying circuits.

The first and second switches 120, 121 and the first and second interpolators 130, 131 are constructed as shown in FIG. 16. This embodiment includes the multiplexing circuit 140 for multiplexing the first and second signals produced by the first and second phase adjusting interpolators 30-1, 30-2 of the first interpolator 130, and the multiplexing circuit 141 for multiplexing the first and second signals produced by the first and second phase adjusting interpolators 30-1, 30-2 of the second interpolator 131.

A clock transmission path (CTS) 201 supplied with the clock is connected to the output side of the second interpolator 131, namely to the output of the multiplexing circuit 141, and a CTS dummy circuit 200, which is a dummy circuit having a delay time equivalent to that of the clock transmission path 201, is connected to the output side of the first interpolator 130, namely to the output of the multiplexing circuit 140.

This embodiment further includes the phase comparator circuit 150 for detecting the phase difference between the output signal from the CTS dummy circuit 200 and the input clock 1; the digital filter 160 for smoothing the UP and DOWN signals output from the phase comparator circuit 150; the first counter 170 for counting up and counting down based upon the UP and DOWN signals output from the digital filter 160; a first decoder 192 for decoding the count output by the counter 170; an adder circuit 180 for adding the count output by the counter 170 and an input offset value; and a second decoder 191 for decoding the output of the adder circuit 180.

The first switch 120 is switched and a phase adjustment (setting of the internal-division ratio of the timing difference) is performed by the first interpolator 130 based upon the decoded output from the first decoder 192. A phase adjustment (setting of the internal-division ratio of the timing difference) is performed by the second interpolator 131 and the second switch 121 is switched based upon the decoded output from the second decoder 191.

A latch circuit or the like (application) is supplied with the clock from the CTS 201. The fourth embodiment of the present invention is such that a phase difference (angle difference) equivalent to the offset is set for the supplied clock, this phase difference being relative to the input clock 1. Further, the second decoder 191 decodes a value obtained by adding the count output from the first counter 170 (the first counter 170 counts the phase difference between the output of the CTS dummy circuit 200 and the input clock 1) to the offset angle to thereby adjust the phase of the output clock of CTS 201. As a result, even if noise enters the system, a phase difference equivalent to the offset is assured in the output clock of the CTS 201.

In FIG. 18, it is assumed that the first and second phase adjusting interpolators 30-1, 30-2 (see FIG. 16) which construct each of the interpolators 130, 131 each comprise a 16-step interpolator, that the output of the counter 170 and the output of the adder circuit 180 are each eight-bit signals, and that a Phase adiustment is performed in 256 steps. It should be noted that the multiphase frequency multiplying circuit 110 of the present invention is not limited to the generation of 16 multiphase clocks and that the interpolator is not limited to a 16-step interpolator.

With regard to the relationship between the first counter 170 and the decoded output of the first decoder 192, the control signal C is output to the interpolator 130 in such a manner that whenever the counter output is counted up by one, a shift equivalent to a predetermined fraction of the cycle tCK of the clock (e.g., tCK/256 in the arrangement having the multiphase frequency multiplying circuit 110 which generates the 16-phase frequency-multiplied clock and the 16-step interpolator) is made in the delay direction.

In the arrangement having the multiphase frequency multiplying circuit 110 and the 16-step interpolators 130, 131 shown in FIG. 18, the counter 170 comprises, e.g., an 8-bit binary counter, the four high-order bits are used to control the switching of the switches (rotary switches) 120, 121, and the four low-order bits are used for the control signal that sets the internal-division ratios of the 16-step interpolators 130, 131.

The switches (rotary switches) 120, 121 are switched when the control signal C (see FIG. 1) of the 16-step interpolators 130, 131 is all "1"s or all "0"s.

The lower-order bits of the first and second decoders 192, 191 enter the 16-step interpolators 130, 131 as the control signals thereof. By way of example, an arrangement may be adopted in which the direction of the shift is made up or down by a thermometer-type shift depending upon whether the high-order bits are odd or even (i.e., depending upon whether the least significant bit of the four high-order bits is "0" or "1").

The high-order bits of the first and second decoders 192, 191 are shifted two bits at a time as the selection control signal of the switches (rotary switches) 120, 121, whereby a clock pair of odd and even signals among the multiphase clocks is selected and output.

Noise such as at the time of signal switching may be suppressed by inserting a re-timing circuit between the first and second decoders 192, 191 and the switches 120, 121 and 16-step interpolators 130, 131.

A fifth embodiment of the present invention will now be described. FIG. 19 is a block diagram illustrating the structure of a fifth embodiment of the present invention. The clock control circuit according to this embodiment further includes an interpolator for adjusting the phase of the clock transmission path (CTS) and a control circuit for controlling this interpolator.

More specifically, as shown in FIG. 19, this embodiment includes: the multiphase frequency multiplying circuit 110 for generating and outputting a multiphase clock obtained by frequency multiplying the input clock 1; first to third switches 120 to 122, to which the multiphase clock output from the multiphase frequency multiplying circuit 110 is input, for selecting and outputting a plurality of clocks from the multiphase clock; the first interpolator 130 to which the output (first to fourth signals) of the first switch 120 is input; the second interpolator 131 to which the output (first to fourth signals) of the second switch 121 is input; and a third interpolator 132 to which the output of the third switch 122 is input. In the fifth embodiment of the present invention also, the multiphase frequency multiplying circuit 110 (referred to also as a "16-phase generating multiphase frequency multiplying circuit"), which generates the 16-phase clock by frequency multiplying the input chock, comprises the frequency multiplying interpolator described in the foregoing embodiments. It is constructed by providing the frequency multiplying interpolator 10 shown in FIG. 5 with a ⅟₁₆ frequency divider and 16-phase-clock frequency multiplying circuits.

The first to third interpolators 130 to 132 are constructed as shown in FIG. 16. This embodiment includes the multiplexing circuits 140 to 142 for multiplexing the first and second signals produced by the first and second phase adjusting interpolators 30-1, 30-2 in the first to third interpolators 130 to 132.

The clock transmission path (clock tree sequence wiring) 201 supplied with the clock is connected to the multiplexing circuit 142, which is connected to the output of the third interpolator 132.

This embodiment further includes the phase comparator circuit 150 for detecting the phase difference between the output signal from the multiplexing circuit 140 connected to the first interpolator 130 and the input clock 1; the digital filter 160 for smoothing the UP and DOWN signals output from the phase comparator circuit 150; the first counter 170 for counting up and counting down based upon the UP and DOWN signals output from the digital filter 160; the first decoder 192 for decoding the count output by the first counter 170; the adder circuit 180 for adding the count output by the counter 170 and an input offset value; and the second decoder 191 for decoding the output of the adder circuit 180. The first switch 120 is switched and a phase adjustment is performed by the first interpolator 130 based upon the decoded output from the first decoder 192. A phase adjustment is performed by the second interpolator 131 and the second switch 121 is switched based upon the decoded output from the second decoder 191.

The fifth embodiment further includes: a second phase comparator circuit 151 for detecting the phase difference between the output of the clock transmission path (CTS) 201 and the output of the second interpolator 131; a second digital filter 161 for smoothing UP and DOWN signals output from the second phase comparator circuit 151; a second counter 171 for counting up and counting down based upon the UP and DOWN signals output from the second digital filter 161; and a third decoder 193 for decoding the count output by the counter 170. A phase adjustment is performed by the third interpolator 132 and the third switch 122 is switched based upon the decoded output from the third decoder 193.

In the fifth embodiment, the phase of the output of the clock transmission path (CTS) 201 is compared with the phase of a signal having a phase difference, which is equivalent to the offset, with respect to the input clock. As a result, the output of the clock transmission path (CTS) 201 is control led so as to have a predetermined phase difference (angle difference) relative to the input clock.

Figure 20:
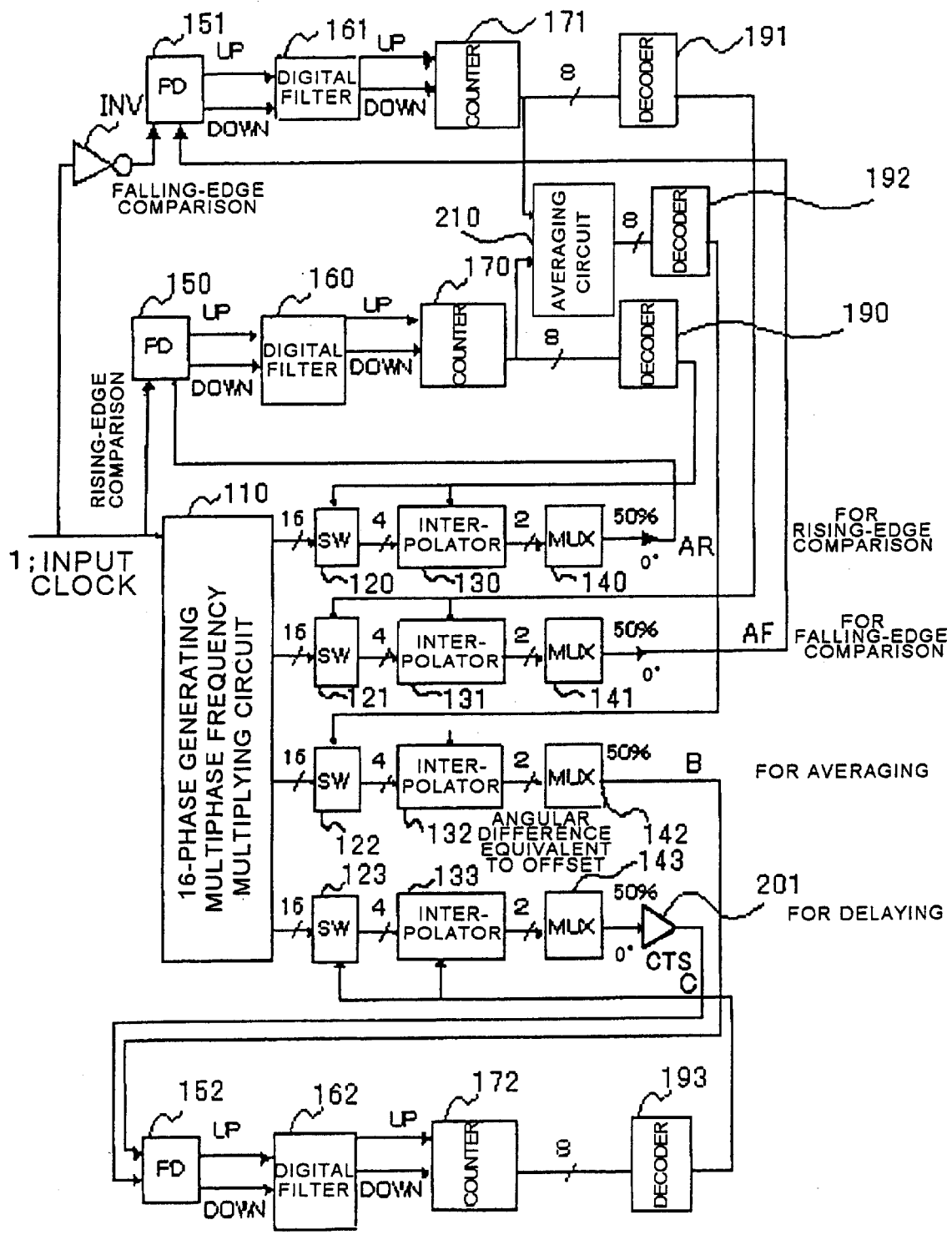
FIG. 20 is a block diagram illustrating a sixth embodiment of the present invention.

A sixth embodiment of the present invention will now be described. FIG. 20 is a block diagram illustrating the structure of a sixth embodiment of the present invention. The sixth embodiment is so adapted that a phase offset is applied based upon the average of the rising and falling edges of a signal. If the duty of the input signal pulse fluctuates, it is possible to latch data at a phase intermediate the rising edge the next rising and edge of the input clock. This makes it possible to latch data reliably pulse.

As shown in FIG. 20, this embodiment includes: the multiphase frequency multiplying circuit 110 for generating and outputting a multiphase clock obtained by frequency multiplying the input clock 1; first to fourth switches 120 to 123, to which the multiphase clock output from the multiphase frequency multiplying circuit 110 is input, for selecting and outputting a plurality of clocks from the multiphase clock; first to fourth interpolators 130 to 133 to which the outputs of the first to fourth switches 120 to 123, respectively, are input; and multiplexers 140 to 143 for multiplexing the first and second signals produced by the first and second phase adjusting interpolators of each of the first to fourth interpolators 130 to 133. In the sixth embodiment of the present invention also, the multiphase frequency multiplying circuit 110 (referred to also as a "16-phase generating multiphase frequency multiplying circuit"), which generates the 16-phase clock by frequency multiplying the input clock, comprises the frequency multiplying interpolator described in the foregoing embodiments. It is constructed by providing the frequency multiplying interpolator 10 shown in FIG. 5 with a ⅟₁₆ frequency divider and 16-phase-clock frequency multiplying circuits. Further, the first to fourth interpolators 130 to 133 are constructed in a manner similar to that of the interpolator shown in FIG. 16.

The clock transmission path (CTS) 201 supplied with the clock is connected to the multiplexing circuit 143, which is connected to the output of the third interpolator 133.

This embodiment further includes the first phase comparator circuit 150 for detecting the phase difference between the rising edge of the output signal from the multiplexing circuit 140 connected to the first interpolator 130 and the rising edge of the input clock 1; the first digital filter 160 for smoothing the UP and DOWN signals output from the first phase comparator circuit 150; the first counter 170 for counting up and counting down based upon the UP and DOWN signals output from the first digital filter 160; the second phase comparator circuit 151 for detecting the phase difference between the falling edge of the output of the second interpolator 131 and the falling edge of output of the input clock 1; the second digital filter 161 for smoothing UP and DOWN signals output from the second phase comparator circuit 151; the second counter 171 for counting up and counting down based upon the UP and DOWN signals output from the second digital filter 161; an averaging circuit 210 for averaging the value of the count output by the first counter 170 and the value of the count output by the second counter 171 and delivering the average value; the second decoder 191 for decoding the output of the second counter 171; and a third decoder 192 for decoding the output of the averaging circuit 210.

A phase adjustment is performed by the first interpolator 130 and the first switch 120 is switched based upon the decoded output from the first decoder 190; a phase adjustment is performed by the second interpolator 131 and the second switch 121 is switched based upon the decoded output from the second decoder 191; and a phase adjustment is performed by the third interpolator 132 and the third switch 122 is switched based upon the decoded output from the third decoder 192.

This embodiment further includes: a third phase comparator circuit 152 for detecting the phase difference between the output of the CTS 201 and the multiplexing circuit 142 connected to the output of the third interpolator 132; a third digital filter 162 for smoothing UP and DOWN signals output from the third phase comparator circuit 152; a third counter 172 for counting up and counting down based upon the UP and DOWN signals output from the third digital filter 162; and a fourth decoder 193 for decoding the count output by the third counter 172. A phase adjustment is performed by the fourth interpolator 133 and the fourth switch 123 is switched based upon the decoded output from the fourth decoder 193.

Figure 21:
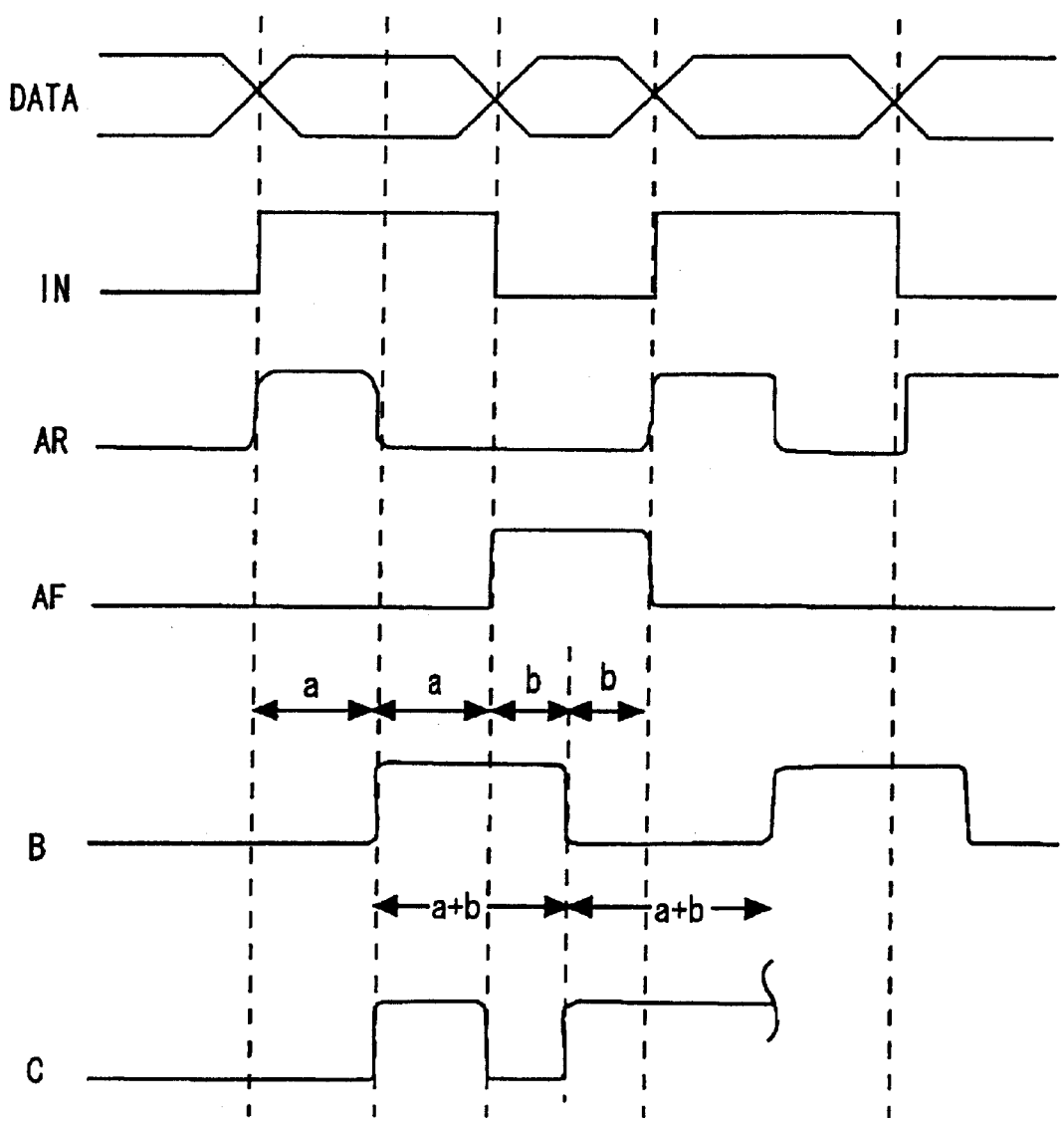
FIG. 21 is a diagram illustrating the timing operation of the sixth embodiment of the present invention.

FIG. 21 is a diagram illustrating the timing operation of the sixth embodiment of the present invention. This embodiment is adapted to deal with a case where the cycle and duty, etc., of the input clock IN fluctuate and where there is a variation in the period of the data transmitted in sync with this clock. Specifically, the multiplexing circuit 142 outputs a signal (B) (pulse widths a+b and duty 50%) whose phase is adjusted by the third interpolator 132 based upon the average value of a phase difference between the input clock and a signal (AR) (pulse width a and duty 50%), which is synchronized to the rising edge of the input clock based upon the multiphase clock obtained by frequency multiplying the input clock, and a signal (AF) (pulse width b and duty 50%) synchronized to the falling edge of the input clock, and the arrangement is such that the phase difference between the signal (B) and the output C of the CTS 201 will take on a predetermined value (e.g., will coincide with a predetermined value). As a result, even if duty fluctuates, sampling can be performed exactly in the middle of one cycle period of data (DATA) in a latch circuit that latches the data (DATA) using the output clock C of the CTS 201 as a latch timing clock.

Figure 22A:
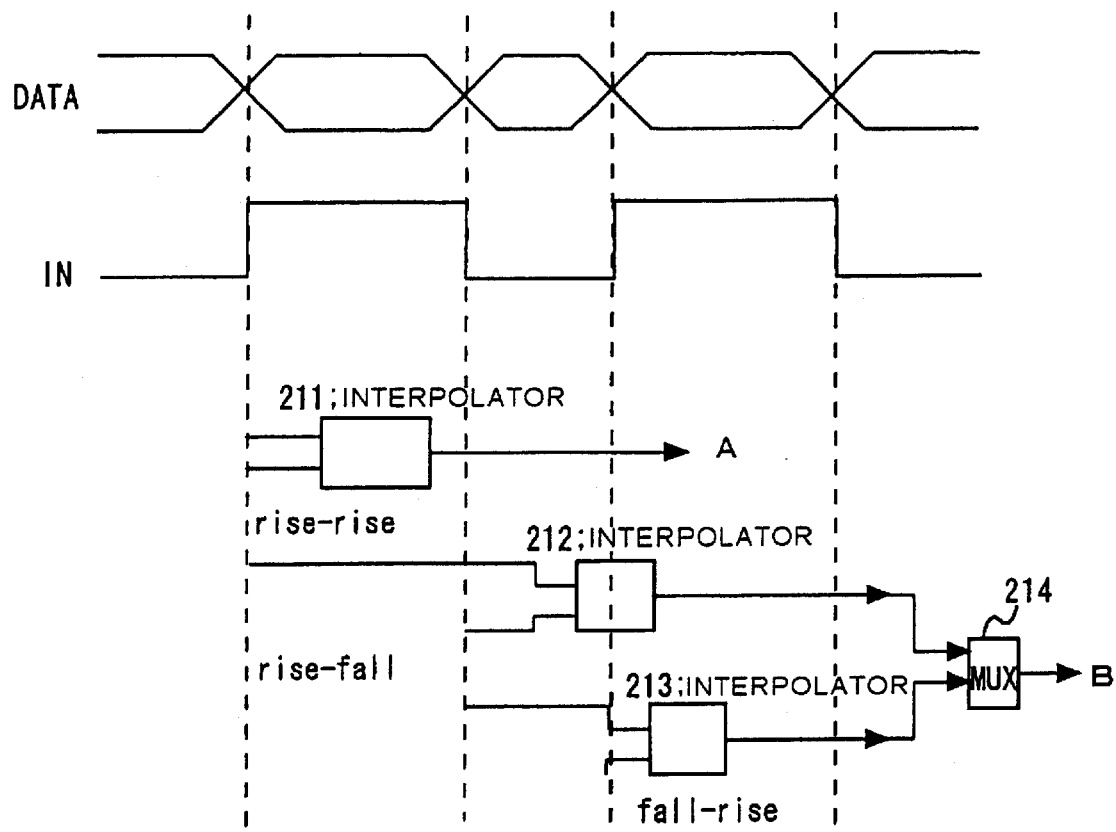
FIG. 22 is a diagram useful in describing a seventh embodiment of the present invention.

A seventh embodiment of the present invention will now be described. FIG. 22 is a diagram useful in describing the seventh embodiment of the present invention.

In FIG. 22, (a) illustrates an example of an arrangement in which the influence of a fluctuation in duty is suppressed and data is latched reliably in a latch circuit (not shown) by interpolators.

More specifically, as shown in (a) of FIG. 22, there are provided a first interpolator 211 for outputting a signal A upon delaying the rising edge of data (DATA); a second interpolator 212 for internally dividing the timing difference between the leading edge (the rising edge in FIG. 22) of a clock pulse in the input clock (IN) and the trailing edge (the falling edge in FIG. 22) of this clock pulse; a third interpolator 213 for internally dividing the timing difference between the trailing edge (the falling edge in FIG. 22) of the input clock (IN) and the leading edge (the rising edge in FIG. 22) of the next clock pulse; and a multiplexing circuit 214 for multiplexing the outputs of the second and third interpolators 212, 213 into a single signal B which is delivered as the output.

The second interpolator 212, which has the structure of the interpolator shown in FIG. 12, for example, outputs a signal having a rising edge that corresponds to the phase obtained by internally dividing the timing difference between the rising edge of the input signal IN1 and the falling edge of the input signal IN2. The second interpolator 212 is constructed such that a signal obtained by inverting the input signal IN2 is input to the input of the OR gate OR1 and to the gates of the N-channel MOS transistors MN28, MN30, MN32. The third interpolator 213, which has the structure of the interpolator shown in FIG. 11, outputs a signal having a falling edge that corresponds to the phase obtained by internally dividing the timing difference between the falling edge of the input signal IN1 and the rising edge of the input signal IN2. The third interpolator 213 is constructed such that a signal obtained by inverting the input signal IN2 is input to the input of the NAND gate NAND1 and to the gates of the inverter INV02.

Figure 22B:
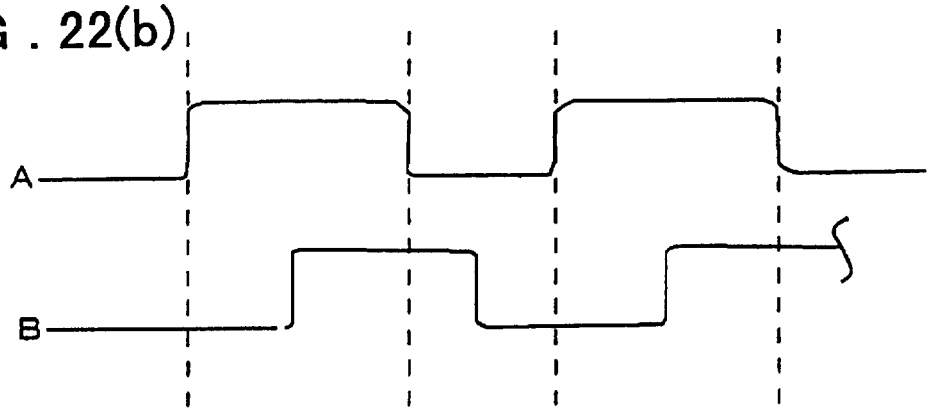

As shown in (b) of FIG. 22, the data output A of the first interpolator 211 is sampled at the clock B output from the multiplexing circuit 214, whereby the influence of a fluctuation in duty is suppressed and data is latched reliably in a latch circuit. More specifically, the clock B rises and falls at the timing of, e.g., the center of the cycles of the data A. Even if the duty of the clock fluctuates, therefore, the data will not be latched at an improper timing. In the example of FIG. 22(b), the data A is sampled using the rising and falling edges of the clock B. However, the invention is of course applicable to a system in which sampling is performed only at the rising edge of the clock B.

Figure 23:
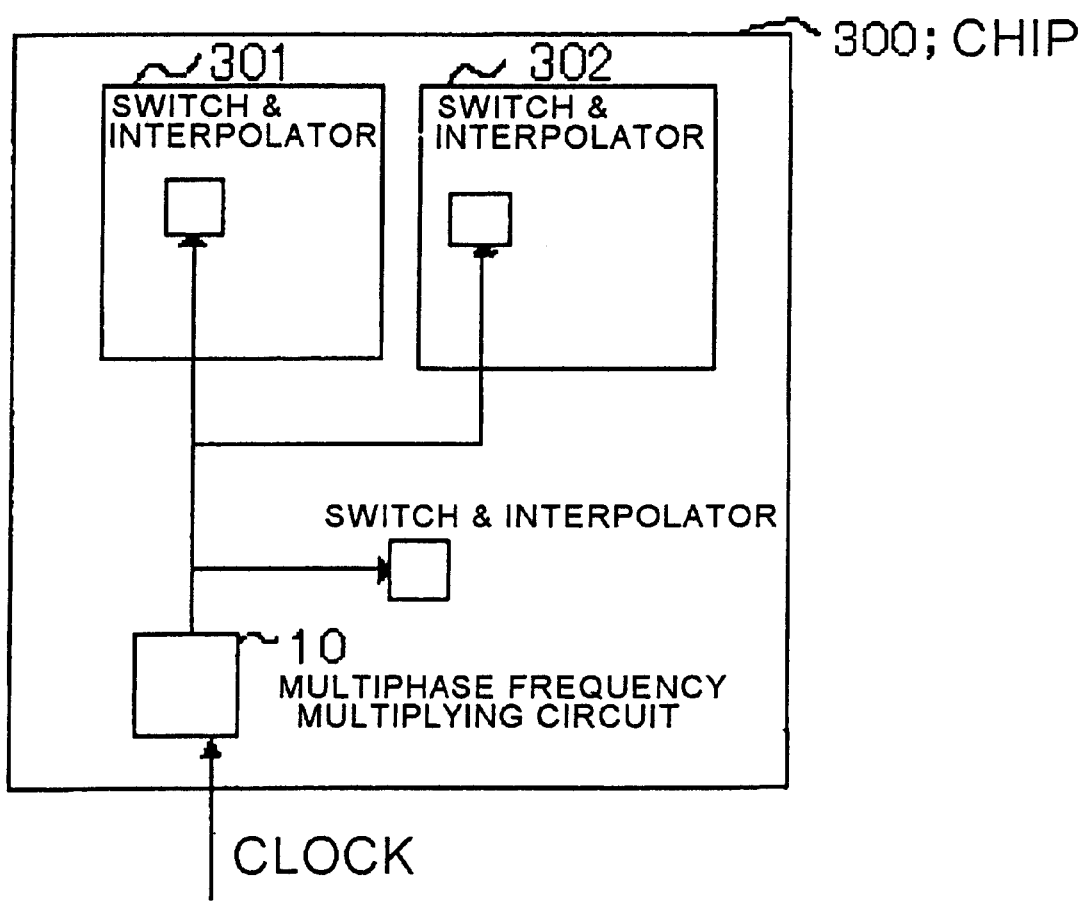
FIG. 23 is a diagram useful in describing an eighth embodiment of the present invention.

An eighth embodiment of the present invention will now be described. FIG. 23 is a schematic view of a layout useful in describing the eight embodiments, and FIG. 24 is a block diagram of circuitry illustrating this layout.

Figure 24:
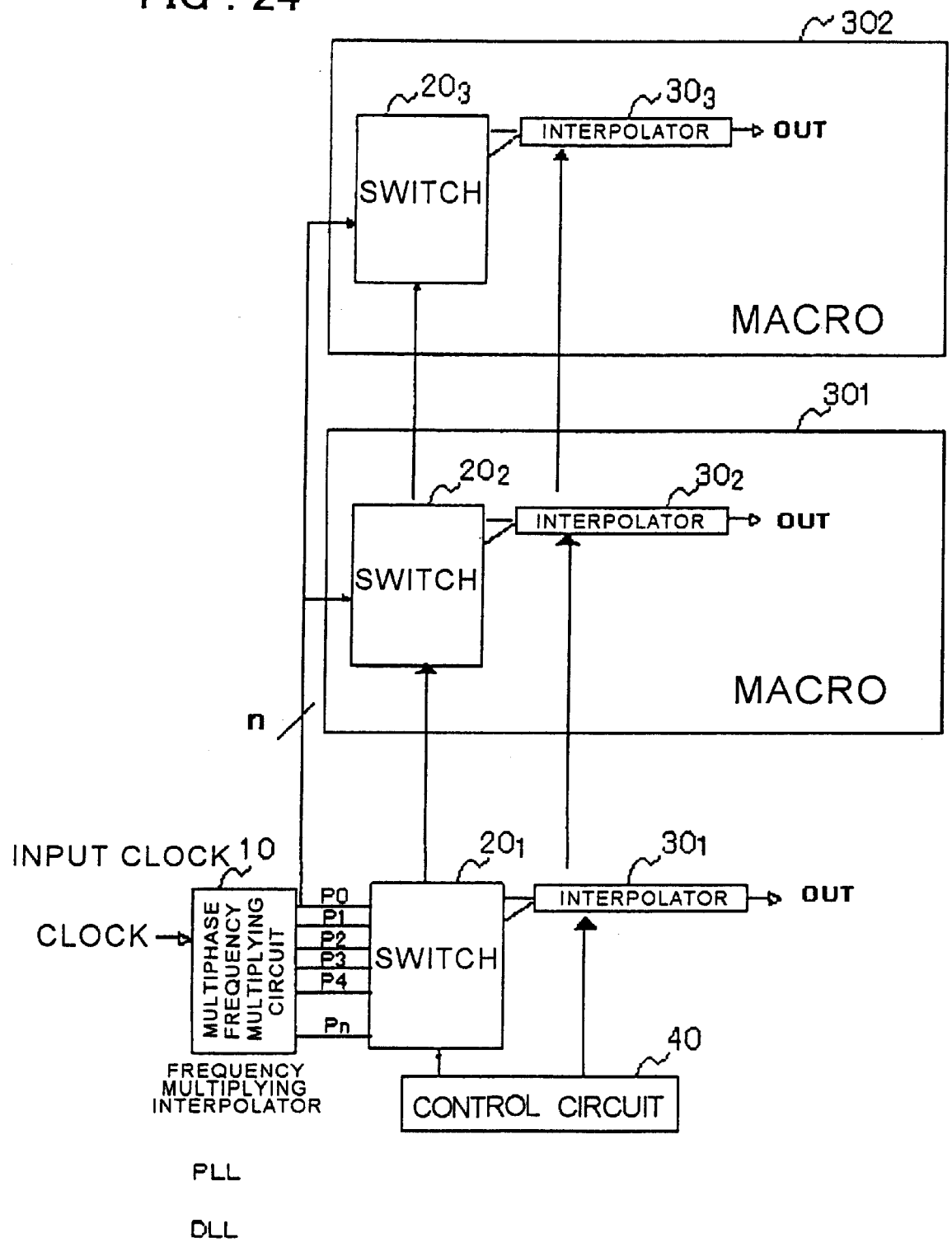
FIG. 24 is a block diagram illustrating the eighth embodiment of the present invention.

As shown in FIGS. 23 and 24, the multiphase frequency multiplying interpolator 10 to which an external clock is input is provided in a chip 300. A circuit for supplying the internal circuits with the clock has a switch 201, to which the multiphase clock from the multiphase frequency multiplying interpolator 10 is input, and an interpolator 301. Switches 202, 203, to which the multiphase (n-phase) clock from the multiphase frequency multiplying interpolator 10 is input, and interpolators 302, 303 are provided also in macros (macroblocks) 301, 302 disposed on and wired to the chip. In the eighth embodiment, the phase a adjusting interpolator 30 is disposed in dispersed fashion within the macros, the phase of the clock in each macroblock is control led it is possible to adjust the phase of the clock across a plurality of macroblocks.

The meritorious effects of the present invention are summarized as follows.

The present invention constructed as set forth above provides a number of advantages, which will now be set forth.

A first advantage is that a clock that is free of loop jitter and center-frequency fluctuation, which are problems that arise in the prior art, can be produced by adopting an arrangement in which frequency-multiplied and multiphase clocks are produced using interpolators.

A second advantage is that clock phase can be controlled finely by adopting an arrangement in which an interpolator that receives two outputs from a switch and internally divides the phases of the two signals not only has its cycle set but also is capable of having the internal-division ratio varied by a control signal from a control circuit.

A third advantage is that frequency-multiplied and multiphase clocks can be produced instantly without providing a feedback loop such as a PLL or DLL in regard to generation of the multiphase clocks.

A fourth advantage is that jitter is averaged by an interpolator that internally divides a phase difference, thereby making it possible to greatly reduce jitter between clock cycles.

A fifth advantage is that it is possible to generate a clock signal whose phase has been shifted by any offset with respect to an input clock.

A sixth advantage is that a clock output from a clock transmission path such as a clock tree can be set to a phase that has been shifted by a prescribed offset with respect to an input clock.

A seventh advantage is that even if the duty of the clock fluctuates, data can be latched reliably.

As many apparently widely different embodiments of the present invention can be made without departing from the spirit and scope thereof, it is to be understood that the invention is not limited to the specific embodiments thereof except as defined in the appended claims.

It should be noted that other objects, aspects, features and aspects of the present invention will become apparent in the entire disclosure and that modifications may be done without departing the gist and scone of the present invention as disclosed herein and claimed as appended herewith.

Also it should be noted that any combination of the disclosed and/or claimed elements, matters and/or items may fall under the modifications aforementioned.

What is claimed is:

1. A clock control circuit comprising:
   a frequency multiplying interpolator, which includes a plurality of circuits each of which is for outputting a signal obtained by internally dividing a phase difference between two signals, for generating a plurality of frequency-multiplied clocks, which have phases that differ from one another, from an input clock; and
   at least one phase adjusting interpolator, to which are input two clocks from among the plurality of frequency-multiplied clocks of different phases output from said frequency multiplying interpolator, for outputting a signal obtained by internally dividing a phase difference between these two clocks.

2. A clock control circuit comprising:
   (a) a frequency multiplying interpolator, which includes a plurality of circuits each of which is for outputting a signal obtained by internally dividing a phase difference between two signals, for generating multiphase clocks obtained by frequency multiplying an input clock;
   (b) a switch, to which the multiphase clocks output from said frequency multiplying interpolator are input, for selectively outputting at least a pair of clocks from among the multiphase clocks;
   (c) at least one phase adjusting interpolator, to which the pair of clocks output from said switch is input, for outputting a signal obtained by internally dividing a phase difference between the pair of clocks; and
   (d) a control circuit for controlling a setting of an internal-division ratio of said phase adjusting interpolator and switching of a clock output by said switch.

3. A clock control circuit comprising:
   (a) a frequency multiplying interpolator, which includes a plurality of circuits each of which is for outputting a signal obtained by internally dividing a phase difference between two signals, for generating multiphase clocks obtained by frequency multiplying an input clock;
   (b) one or a plurality of switches, to which the multiphase clocks output from said frequency multiplying interpolator are input, for outputting pairs of clocks of combinations selected from among the multiphase clocks;
   (c) a plurality of phase adjusting interpolators, to respective ones of which the plurality of pairs of clocks selectively output from said switch are input, for outputting signals obtained by internally dividing a phase difference between each pair of clocks; and
   (d) a control circuit for controlling a setting of an internal-division ratio of each of said phase adjusting interpolators and switching of a clock output by said switch.

4. The clock control circuit according to any one of claims 1 to 3, wherein said frequency multiplying interpolator includes:
   a frequency divider for frequency dividing an input clock and generating multiphase clocks;
   a period sensing circuit for sensing the cycle of the input clock; and
   a multiphase-clock frequency multiplying circuit, to which the multiphase clocks output from said frequency divider are input, for generating multiphase clocks obtained by frequency multiplying the input clocks;
   said multiphase-clock frequency multiplying circuit having:
      a plurality of timing-difference dividing circuits each of which is for outputting a signal obtained by dividing a timing difference between two inputs applied thereto; and
      a plurality of multiplexing circuits each of which is for multiplexing outputs from two of said timing-difference dividing circuits and outputting a multiplexed signal; and
      each of said plurality of timing-difference dividing circuits having:
         a timing-difference dividing circuit to which two identical-phase clocks are applied as inputs; and
         a timing-difference dividing circuit to which two clocks of mutually adjacent phases are applied as inputs.

5. The clock control circuit according to claim 4, wherein said multiphase-clock frequency multiplying circuit has n-phase clocks of first to nth clocks input thereto and includes:
   2n-number of timing-difference dividing circuits each of which is for outputting a signal obtained by dividing a timing difference between two inputs applied thereto, wherein a (2I-1) th (where $1 \leq I \leq n$ holds) timing-difference dividing circuit has Ith identical clocks applied thereto as said two inputs, and a 2Ith (where $1 \leq I \leq n$ holds) timing-difference dividing circuit has an Ith clock and a (I+1 mod n)th (where mod represents residue calculation and I+1 mod n is the reminder obtained when I+1 is divided by n) clock applied thereto as said two inputs;
   2n-number of pulse-width correction circuits to which an output of a Jth (where $1 \leq J \leq 2n$ holds) timing-difference dividing circuit and an output of a (J+2 mod n)th (where J+2 mod n represents the remainder obtained when J+2 is divided by n) timing-difference dividing circuit are input; and n-number of multiplexing circuits to which an output of a Kth (where $1 \leq K \leq n$ holds) pulse-width correction circuit and an output of a (K+n)th pulse-width correction circuit are input.

6. The clock control circuit according to claim 4, wherein each of said timing-difference dividing circuits includes:

a NOR gate to which first and second input signals are applied; and an inverter to which the potential of an internal node, which is an output of said NAND gate, is input;

a plurality of series circuits of serially connected switch elements and capacitors being connected in parallel between the internal node and ground; and capacitance applied to the internal node being decided by a cycle control signal connected to a control terminal of each of said switch elements.

7. The clock control circuit according to claim 4, wherein each of said timing-difference dividing circuits includes:

a logic circuit, to which first and second input signals are applied, for outputting result of a predetermined logical operation between the first and second input signals;

a first switch element connected between a first power supply and an internal node and having an output signal of said logic circuit input to a control terminal thereof;

a buffer circuit having an input terminal connected to the internal node for inverting an output logic value if a size relationship between potential of the internal node and a threshold value reverses;

a first constant-current source and a second switch element, which is turned on and off by the first input signal, connected in series between the internal node and a second power supply; and a second constant-current source and a third switch element, which is turned on and off by the second input signal, connected in series between the internal node and the second power supply;

a plurality of series circuits of serially connected fourth switch elements and capacitors being connected in parallel between the internal node and the second power supply;

capacitance applied to the internal node being decided by a cycle control signal supplied to a control terminal of each of said fourth switch elements.

8. The clock control circuit according to claim 7, wherein said first switch element comprises a transistor of a first conductivity type, and each of said second to fourth switch elements comprises a transistor of a second conductivity type.

9. The clock control circuit according to claim 4, wherein each of said timing-difference dividing circuits includes:

a logic circuit, to which first and second input signals are applied, for outputting result of a predetermined logical operation between the first and second input signals;

a P-channel MOS transistor connected between a first power supply and an internal node and having an output signal of said logic circuit applied thereto as a gate input;

a buffer circuit having an input terminal connected to the internal node for inverting an output logic value if a size relationship between potential of the internal node and a threshold value reverses; and N-channel MOS transistors connected between the internal node and ground and each having a signal obtained by inverting the first input signal applied thereto as a gate input and each being driven by a constant-current source, and N-channel MOS transistors connected between the internal node and ground and each having a signal obtained by inverting the second input signal applied thereto as a gate input and each being driven by a constant-current source;

a plurality of series circuits of serially connected switch elements and capacitors being connected in parallel between the internal node and ground;

capacitance applied to the internal node being decided by a cycle control signal supplied to a control terminal of each of said switch elements.

10. The clock control circuit according to claims 1 to 3, wherein said phase adjusting interpolator includes:

a logic circuit, to which first and second input signals are applied, for outputting result of a predetermined logical operation between the first and second input signals;

a first switch element connected between a first power supply and an internal node and having an output signal of said logic circuit input to a control terminal thereof; and a buffer circuit having an input terminal connected to the internal node for inverting an output logic value if a size relationship between potential of the internal node and a threshold value reverses;

a plurality of series circuits being connected in parallel between the internal node and a second power supply, each of said series circuits comprising a first constant-current source, a second switch element turned on and off by the first input signal and a third switch element turned on and off by a control signal from said control circuit;

a plurality of series circuits being connected in parallel between the internal node and the second power supply, each of said series circuits comprising a second constant-current source, a fourth switch element turned on and off by the second input signal and a fifth switch element turned on and off by the control signal from the control circuit;

a plurality of series circuits being connected in parallel between the internal node and the second power supply, each of said series circuits comprising a sixth switch element and a capacitor;

capacitance applied to the internal node being decided by turning on and off the sixth switch element by a cycle control signal connected to a control terminal of said sixth switch element.

11. The clock control circuit according to claim 10, wherein said first switch element comprises a transistor of a first conductivity type, and each of said second to fourth switch elements comprises a transistor of a second conductivity type.

12. The clock control circuit according to claim 10, wherein at least a prescribed number (N) of each of said second, third, fourth and fifth switches is provided;

K-number (where K is 0 to N) of said third switch elements are turned on by the control signal supplied to said third switch elements;

(N–K)-number of said fifth switch elements are turned on by the control signal supplied to said fifth switch elements;

a signal corresponding to a phase obtained by internally dividing a timing difference between the first and second input signals based upon K in increments of 1/N of the timing difference is output, and the internal-division ratio is varied by varying the value of K.

13. The clock control circuit according to any one of claims 1 to 3, wherein said phase adjusting interpolator includes:
   an OR gate to which first and second input signals are appllied;
   a P-channel MOS transistor connected between a power supply and an internal node and having an output signal of said OR gate applied thereto as a gate input;
   a buffer circuit having an input terminal connected to the internal node for inverting an output logic value if a size relationship between potential of the internal node and a threshold value reverses; and
   a plurality of series circuits being connected in parallel between the internal node and ground, each of said series circuits comprising an N-channel MOS transistor that has the first input signal applied thereto as a gate input and that is driven by a constant-current source, and a switch element turned on and off by a control signal from said control circuit;
   a plurality of series circuits being connected in parallel between the internal node and ground, each of said series circuits comprising an N-channel MOS transistor that has the second input signal applied thereto as a gate input and that is driven by a constant-current source, and a switch element turned on and off by the control signal from said control circuit;
   a plurality of series circuits being connected in parallel between the internal node and ground, each of said series circuits comprising a switch element and a capacitor;
   capacitance appllied to the internal node being decided by a cycle control signal connected to a control terminal of said switch element.

14. The clock control circuit according to any one of claims 1 to 3, wherein said phase adjusting interpolator includes:
   a NOR gate to which first and second input signals are applied;
   a P-channel MOS transistor connected between a power supply and an internal node and having an output signal of said NOR gate applied thereto as a gate input;
   a buffer circuit having an input terminal connected to the internal node for inverting an output logic value if a size relationship between potential of the internal node and a threshold value reverses; and
   a plurality of series circuits being connected in parallel between the internal node and ground, each of said series circuits comprising an N-channel MOS transistor having a signal obtained by inverting the first input signal by a first inverting circuit applied thereto as a gate input and being driven by a constant-current source, and a switch element turned on and off by a control signal from said control circuit;
   a plurality of series circuits being connected in parallel between the internal node and ground, each of said series circuits comprising an N-channel MOS transistor having a signal obtained by inverting the second input signal by a second inverting circuit applied thereto as a gate input and being driven by a constant-current source, and a switch element turned on and off by the control signal from said control circuit;
   a plurality of series circuits being connected in parallel between the internal node and ground, each of said series circuits comprising a switch element and a capacitor;
   capacitance applied to the internal node being decided by a cycle control signal connected to a control terminal of said switch element.

15. The clock control circuit according to claims 6 to 9, wherein the cycle control signal is supplied by said period sensing circuit set forth in claim 4.

16. The clock control circuit according to claim 2 or 3, wherein if a setting of the internal-division ratio of said phase adjusting interpolator reaches an upper limit or lower limit and it is still necessary to perform an adjustment of output phase in said phase adjusting interpolator, then said control circuit changes over the clock output of said switch that selectively outputs clocks supplied to said phase adjusting interpolator.

17. The clock control circuit according to claim 2 or 3, wherein said control circuit controls setting of the internal-division ratio of said phase adjusting interpolator and switching of the clock output of said switch based upon result of a phase comparison between the input clock or a predetermined reference clock and the output of said phase adjusting interpolator.

18. The clock control circuit according to claim 2 or 3, wherein said control circuit has a counter the value of which varies based upon result of a phase comparison between the input clock or a predetermined reference clock and the output of said phase adjusting interpolator;
   setting of the internal-division ratio of said phase adjusting interpolator and switching of the clock output of said switch being control led based upon an output from said counter.

19. The clock control circuit according to claim 2 or 3, wherein said control circuit includes:
   a counter the value of which varies based upon result of a phase comparison between the input clock or a predetermined reference clock and the output of said phase adjusting interpolator; and
   a decoder for decoding an output from said counter;
   setting of the internal-division ratio of said phase adjusting interpolator and switching of the clock output of said switch being control led based upon an output from said decoder.

20. The clock control circuit according to claim 2 or 3, wherein said switch comprises a rotary switch in which, if an n-phase clock output from said frequency multiplying interpolator is input thereto and, on the basis of a switching control signal from said control circuit, an I-th clock is being supplied to a first input of said phase adjusting interpolator and an adjacent (I+1)th clock is being supplied to a second input of said phase adjusting interpolator, then, when the clock output is switched in accordance with a phase-lag or phase-lead state of the output, said rotary circuit controls switching in such a manner that the first input of said phase adjusting interpolator is made an (I+2)th clock and the second input is kept as the (I+1)th clock, or the first input is kept at the Ith clock and the second input is made the (I−1)th clock (where I+1, I−1, I+2 take on values of 1 to n and are given by a remainder obtained by dividing by n).

21. An interpolator comprising:
   a logic circuit, to which first and second input signals are applied, for outputting result of a predetermined logical operation between the first and second input signals;
   a first switch element connected between a first power supply and an internal node and having an output signal of said logic circuit input to a control terminal thereof; and
   a buffer circuit having an input terminal connected to the internal node for inverting an output logic value if a size relationship between potential of the internal node and a threshold value reverses;

a plurality of series circuits being connected in parallel between the internal node and a second power supply, each of said series circuits comprising a first constant-current source, a second switch element turned on and off by the first input signal and a third switch element turned on and off by a control signal applied to a control terminal thereof;

a plurality of series circuits being connected in parallel between the internal node and the second power supply, each of said series circuits comprising a second constant-current source, a fourth switch element turned on and off by the second input signal and a fifth switch element turned on and off by a control signal applied to a control terminal thereof;

a plurality of series circuits being connected in parallel between the internal node and the second power supply, each of said series circuits comprising a sixth switch element and a capacitor;

capacitance applied to the internal node being decided by turning on and off the sixth switch element by a cycle control signal applied to a control terminal thereof;

an output signal corresponding to a phase obtained by internally dividing a phase difference between the first input signal and the second input signal being delivered from said buffer circuit in dependence upon a combination of values of the control signals applied to the control terminals of said third switch elements and to the control terminals of said fifth switch elements.

22. The interpolator according to claim 21, wherein at least a prescribed number (N) of each of said second, third, fourth and fifth switches is provided;

K-number (where K is 0 to N) of said third switch elements are turned on by the control signal supplied to said third switch elements;

(N−K)-number of said fifth switch elements are turned on by the control signal supplied to said fifth switch elements;

a signal corresponding to a phase obtained by internally dividing a timing difference between the first and second input signals based upon K in increments of 1/N of the timing difference is output, and the internal-division ratio is varied by varying the value of K.

23. A clock control method comprising the steps of:

reducing jitter of a frequency-multiplied clock by generating multiphase clocks, which are obtained by frequency multiplying an input clock, using a frequency multiplying interpolator which includes a plurality of circuits each of which is for outputting a signal obtained by internally dividing a phase difference between two signals;

selecting two of the multiphase clocks, which are output from the frequency multiplying interpolator, by a switch and supplying the two clocks to a phase adjusting interpolator;

outputting from said phase adjusting interpolator a clock obtained by internally dividing a phase difference between the two clocks; and performing control to vary an internal-division ratio of the phase adjusting interpolator based upon result of a phase comparison between a predetermined reference clock and an output clock of the phase adjusting interpolator.

24. A clock control method using first, second and third interpolators each of which outputs a signal obtained by internally dividing a phase difference between two signals input thereto, said method comprising the steps of:

inputting a common data signal, which is transferred in sync with a clock signal, to said first interpolator for delaying the data signal and then outputting the same;

inputting the clock signal to said second interpolator for outputting a clock signal obtained by internally dividing a timing difference between a leading edge and a trailing edge of a clock pulse;

inputting the clock signal to said third interpolator for outputting a clock signal obtained by internally dividing a timing difference between a trailing edge of the clock pulse and a leading edge of an ensuing clock pulse; and latching data that is output from said first interpolator using a clock, which is obtained by multiplexing output signals from said second and third interpolators, as a latch timing pulse, and automatically adjusting latch timing to an optimum position with respect to the data independently of a fluctuation in duty of the clock signal.

25. A clock control circuit comprising:

a multiphase clock generating circuit for generating and outputting multiphase clocks from an input clock or generating and outputting multiphase clocks by frequency multiplying the input clock;

a plurality of switches, to which the multiphase clocks output from said frequency multiplying interpolator are input, for selecting and outputting pairs of clocks;

a plurality of interpolators, to respective ones of which the pairs of clocks output from said switch are input, for outputting signals obtained by internally dividing a phase difference between respective ones of the pairs of clocks; and a control circuit for controlling a setting of an internal-division ratio of each of said interpolators and switching of a clock output by each of said switches;

a clock output from one of said interpolators being adjusted in phase so as to have a predetermined phase difference with respect to the input clock, and clocks output from the other of said interpolators being adjusted in phase so as to have a predetermined phase difference with respect to the input clock or with respect to an output clock of yet another interpolator.

26. A clock control circuit comprising:

a multiphase clock generating circuit for generating and outputting multiphase clocks from an input clock or generating and outputting multiphase clocks by frequency multiplying the input clock;

first and second switches, to which the multiphase clocks output from said frequency multiplying interpolator are input, for selecting and outputting pairs of clocks;

a first interpolator, to which the pair of clocks output from said first switch is input, for outputting a clock signal obtained by internally dividing a phase difference between the pair of clocks and applying a phase adjustment;

a second interpolator, to which the pair of clocks output from said second switch is input, for outputting a clock signal obtained by internally dividing a phase difference between the pair of clocks and applying a phase adjustment;

a phase comparator circuit for detecting a phase difference between an output of said first interpolator and the input clock;

a filter for smoothing a signal representing the result of the phase comparison output from said phase comparator circuit;

a first counter for counting up and counting down based upon the signal representing the result of the phase comparison output from said filter; and a second counter, which is set to an offset value, for counting up and counting down based upon the signal representing the result of the phase comparison output from said filter;

setting of an internal-division ratio of said first interpolator and switching of a clock output by said first switch being performed based upon an output from said first counter; and setting of an internal-division ratio of said second interpolator and switching of a clock output by said second switch being performed based upon an output from said second counter.

27. A clock control circuit comprising:

a multiphase clock generating circuit for generating and outputting multiphase clocks from an input clock or generating and outputting multiphase clocks by frequency multiplying the input clock;

first and second switches, to which the multiphase clocks output from said frequency multiplying interpolator are input, for selecting and outputting pairs of clocks;

a first interpolator, to which the pair of clocks output from said first switch is input, for out putting a clock signal obtained by internally dividing a phase difference between the pair of clocks and applying a phase adjustment;

a second interpolator, to which the pair of clocks output from said second switch is input, for outputting a clock signal obtained by internally dividing a phase difference between the pair of clocks and applying a phase adjustment;
 said second interpolator having an output to which is connected a clock transmission path supplied with a clock;
 said first interpolator having an output to which is connected a dummy circuit having a delay time equivalent to that of said clock transmission path;

a phase comparator circuit for detecting a phase difference between an output of said dummy circuit and the input clock;

a filter for smoothing a signal representing the result of the phase comparison output from said phase comparator circuit;

a first counter for counting up and counting down based upon the signal representing the result of the phase comparison output from said filter;

a first decoder for decoding an output count from said first counter;

an adder circuit for adding the output count from said first counter and an input offset value; and a second decoder for decoding an output from said adder circuit;

setting of an internal-division ratio of said first interpolator and switching of a clock output by said first switch being performed based upon an output from said first decoder; and setting of an internal-division ratio of said second interpolator and switching of a clock output by said second switch being performed based upon an output from said second decoder.

28. A clock control circuit comprising:

a multiphase clock generating circuit for generating and outputting multiphase clocks from an input clock or generating and outputting multiphase clocks by frequency multiplying the input clock;

first, second and third switches, to which the multiphase clocks output from said frequency multiplying interpolator are input, for selecting and outputting pairs of clocks;

first, second and third interpolators, to which the pairs of clocks output from said first, second and third switches, respectively, are input, for outputting clock signals obtained by internally dividing a phase difference between respective ones of the pairs of clocks and applying a phase adjustment;
 said third interpolator having an output to which is connected a clock transmission path supplied with a clock;

a first phase comparator circuit for detecting a phase difference between an output of said first interpolator and the input clock;

a first filter for smoothing a signal representing the result of the phase comparison output from said first phase comparator circuit;

a first counter for counting up and counting down based upon the signal representing the result of the phase comparison output from said first filter;

a first decoder for decoding an output count from said first counter;

an adder circuit for adding the output count from said first counter and an input offset value;

a second decoder for decoding an output from said adder circuit;

setting of an internal-division ratio of said first interpolator and switching of a clock output by said first switch being performed based upon a decoded output from said first decoder;

setting of an internal-division ratio of said second interpolator and switching of a clock output by said second switch being performed based upon a decoded output from said second decoder;

a second phase comparator circuit for detecting a phase difference between an output of said clock transmission path and the output of said second interpolator;

a second filter for smoothing a signal representing the result of the phase comparison output from said second phase comparator circuit;

a second counter for counting up and counting down based upon the signal representing the result of the phase comparison output from said second filter; and a third decoder for decoding an output count from said second counter;

setting of an internal-division ratio of said third interpolator and switching of a clock output by said third switch being performed based upon a decoded output from said third decoder.

29. A clock control circuit comprising:

a multiphase clock generating circuit for generating and outputting multiphase clocks from an input clock or generating and outputting multiphase clocks by frequency multiplying the input clock;

first, second, third and fourth switches, to which the multiphase clocks output from said frequency multiplying interpolator are input, for selecting and outputting pairs of clocks;

first, second, third and fourth interpolators, to which the pairs of clocks output from said first, second, third and fourth switches, respectively, are input, for outputting clock signals obtained by internally dividing a phase difference between respective ones of the pairs of clocks and applying a phase adjustment;

said fourth interpolator having an output to which is connected a clock transmission path supplied with a clock;

a first phase comparator circuit for detecting a phase difference between the rising edge of an output of said first interpolator and the rising edge of the input clock;

a first filter for smoothing a signal representing the result of the phase comparison output from said first phase comparator circuit;

a first counter for counting up and counting down based upon the signal representing the result of the phase comparison output from said first filter;

a second phase comparator circuit for detecting a phase difference between an output of said clock transmission path and the falling edge of a signal obtained by inverting the input clock by an inverting circuit;

a second filter for smoothing a signal representing the result of the phase comparison output from said second phase comparator circuit;

a second counter for counting up and counting down based upon the signal representing the result of the phase comparison output from said second filter;

an averaging circuit for averaging an output count from said first counter and an output count of said second counter;

a first decoder for decoding an output from said first counter;

a second decoder for decoding an output from said second counter;

a third decoder for decoding an output from said averaging circuit;

setting of an internal-division ratio of each of said first to third interpolators and switching of a clock output by each of said first to third switches being performed based upon a decoded output from each of said first to third decoders;

a third phase comparator circuit for detecting a phase difference between an output of said clock transmission path and the output of said third interpolator;

a third filter for smoothing a signal representing the result of the phase comparison output from said third phase comparator circuit;

a third counter for counting up and counting down based upon the signal representing the result of the phase comparison output from said third filter; and a fourth decoder for decoding an output count from said third counter;

setting of an internal-division ratio of said fourth interpolator and switching of a clock output by said fourth switch being performed based upon a decoded output from said fourth decoder.

30. The clock control circuit according to claim 26 or 27, wherein each of said first and second switches selects and outputs, from among the multiphase clocks output from said multiphase clock generating circuit, a first pair of signals, which comprises a first signal and a second signal having a phase adjacent that of the first signal, and a second pair of signals, which comprises a third signal having a predetermined phase difference with respect to the first signal and a fourth signal having a phase adjacent that of the third signal;

each of said first and second interpolators has:
a first phase adjusting interpolator for producing a first output signal obtained by internally dividing a timing difference between the first pair of signals; and
a second phase adjusting interpolator for producing a second output signal obtained by internally dividing a timing difference between the second pair of signals;

said clock control circuit further comprising:
a first multiplexing circuit for multiplexing and outputting the first and second output signals from said first and second phase adjusting interpolators, respectively, of said first interpolator; and
a second multiplexing circuit for multiplexing and output ting the first and second output signals from said first and second phase adjusting interpolators, respectively, of said second interpolator.

31. The clock control circuit according to claim 28, wherein each of said first to third switches selects and outputs, from among the multiphase clocks output from said multiphase clock generating circuit, a first pair of signals, which comprises a first signal and a second signal having a phase adjacent that of the first signal, and a second pair of signals, which comprises a third signal having a predetermined phase difference with respect to the first signal and a fourth signal having a phase adjacent that of the third signal;

each of said first and second interpolators has:
a first phase adjusting interpolator for producing a first output signal obtained by internally dividing a timing difference between the first pair of signals; and
a second phase adjusting interpolator for producing a second output signal obtained by internally dividing a timing difference between the second pair of signals;

said clock control circuit further comprising:
first to third multiplexing circuits for multiplexing and outputting the first and second output signals output from said first and second phase adjusting interpolators of respective ones of said first to third interpolators.

32. The clock control circuit according to claim 29, wherein each of said first to fourth switches selects and outputs, from among the multiphase clocks output from said multiphase clock generating circuit, a first pair of signals, which comprises a first signal and a second signal having a phase adjacent that of the first signal, and a second pair of signals, which comprises a third signal having a predetermined phase difference with respect to the first signal and a fourth signal having a phase adjacent that of the third signal;

each of said first and second interpolators has:
a first phase adjusting interpolator for producing a first output signal obtained by internally dividing a timing difference between the first pair of signals; and
a second phase adjusting interpolator for producing a second output signal obtained by internally dividing a timing difference between the second pair of signals;

said clock control circuit further comprising:
first to fourth multiplexing circuits for multiplexing and outputting the first and second output signals output from said first and second phase adjusting interpolators of respective ones of said first to fourth interpolators.

33. The clock control circuit according to any one of claims 26 to 29, comprising a frequency multiplying interpolator constituted by a multiphase frequency multiplying circuit in which said multiphase clock generating circuit has a plurality of timing-difference dividing circuits each of which is for outputting a signal obtained by internally dividing a phase difference between two signals from among the multiphase clocks generated from the input clock.

34. The clock control circuit according to any one of claims 26 to 29, comprising a frequency multiplying interpolator constituted by a multiphase multiplying circuit wherein said multiphase clock generating circuit includes:

a frequency divider for generating multiphase clocks by frequency dividing an input clock;

a period sensing circuit for sensing the cycle of the input clock; and a multiphase-clock frequency multiplying circuit, to which the multiphase clocks output from said frequency divider are input, for generating multiphase clocks obtained by frequency multiplying the input clocks;

said multiphase-clock frequency multiplying circuit has:
a plurality of timing-difference dividing circuits each of which is for outputting a signal obtained by dividing a timing difference between two inputs applied thereto; and
a plurality of multiplexing circuits each of which is for multiplexing outputs from two of said timing-difference dividing circuits; and each of said plurality of timing-difference dividing circuits has:
a timing-difference dividing circuit to which two identical-phase clocks are applied as inputs; and
a timing-difference dividing circuit to which two clocks of mutually adjacent phases are applied as inputs.

35. The clock control circuit according to claim 34, wherein said multiphase-clock frequency multiplying circuit has n-phase clocks (first to nth clocks) input thereto and includes:

2n-number of timing-difference dividing circuits each of which is for outputting a signal obtained by dividing a timing difference between two inputs applied thereto, wherein a (2I−1)th (where 1≦I≦n holds) timing-difference dividing circuit has Ith identical clocks applied thereto as said two inputs, and a 2Ith (where 1≦I≦n holds) timing-difference dividing circuit has an Ith clock and a (I+1 mod n)th (where mod represents residue calculation and I+1 mod n is the residue obtained when I+1 is divided by n) clock applied thereto as said two inputs;

2n-number of pulse-width correction circuits to which an output of a Jth (where 1≦J≦2n holds) timing-difference dividing circuit and an output of a (J+2 mod n)th (where J+2 mod n represents the remainder obtained when J+2 is divided by n) timing-difference dividing circuit are input; and n-number of multiplexing circuits to which an output of a Kth (where 1≦K≦n holds) pulse-width correction circuit and an output of a (K+n)th pulse-width correction circuit are input.

36. The clock control circuit according to claim 34, wherein each of said timing-difference dividing circuits includes:

a NOR gate to which first and second input signals are applied; and an inverter to which the potential of an internal node, which is an output of said NAND gate, is input;

a plurality of series circuits of serially connected switch elements and capacitors being connected in parallel between the internal node and ground; and capacitance applied to the internal node being decided by a cycle control signal connected to a control terminal of each of the switch elements.

37. The clock control circuit according to claim 34, wherein each of said timing-difference dividing circuits includes:

a logic circuit, to which first and second input signals are applied, for outputting result of a predetermined logical operation between the first and second input signals;

a first switch element connected between a first power supply and an internal node and having an output signal of said logic circuit input to a control terminal thereof;

a buffer circuit having an input terminal connected to the internal node for inverting an output logic value if a size relationship between potential of the internal node and a threshold value reverses;

a first constant-current source and a second switch element, which is turned on and off by the first input signal, connected between the internal node and a second power supply; and a second constant-current source and a third switch element, which is turned on and off by the second input signal, connected between the internal node and the second power supply;

a plurality of series circuits being connected in parallel between the internal node and the second power supply, each of said series circuits comprising a fourth switch element and a capacitor;

capacitance applied to the internal node being decided by a cycle control signal supplied to a control terminal of said fourth switch element.

38. A clock control circuit according to any one of claims 26 to 29, wherein said phase adjusting interpolator includes:

a logic circuit, to which first and second input signals are applied, for outputting result of a predetermined logical operation between the first and second input signals;

a first switch element connected between a first power supply and an internal node and having an output signal of said logic circuit input to a control terminal thereof; and a buffer circuit having an input terminal connected to the internal node for inverting an output logic value if a size relationship between potential of the internal node and a threshold value reverses;

a plurality of series circuits being connected in parallel between the internal node and a second power supply, each of said series circuits comprising a first constant-current source, a second switch element turned on and off by the first input signal and a third switch element turned on and off by a control signal from said control circuit;

a plurality of series circuits being connected in parallel between the internal node and the second power supply, each of said series circuits comprising a second constant-current source, a fourth switch element turned on and off by the second input signal and a fifth switch element turned on and off by the control signal from the control circuit;

a plurality of series circuits being connected in parallel between the internal node and the second power supply, each of said series circuits comprising a sixth switch element and a capacitor;

capacitance applied to the internal node being decided by turning on and off the sixth switch element by a cycle control signal connected to a control terminal of said sixth switch element.

39. A clock control circuit comprising:

first, second and third interpolators each of which is for outputting a signal obtained by internally dividing a phase difference between two signals input thereto;

a common data signal being input to said first interpolator for being delayed and then output thereby;

a clock signal being input to said second interpolator, and said second interpolator outputting a clock signal obtained by internally dividing a timing difference between a leading edge and a trailing edge of a clock pulse;

said third interpolator outputting a clock signal obtained by internally dividing a timing difference between a trailing edge of the clock pulse and a leading edge of an ensuing clock pulse of the clock signal; and a multiplexing circuit for multiplexing the output clocks from said second and third interpolators and outputting a clock signal;

the clock signal output from said multiplexing circuit being supplied to a latch circuit as a latch timing clock for latching data that is output from said first interpolator.

40. A semiconductor integrated circuit device having a clock control circuit defined in claims 1 to 19.

41. A semiconductor integrated circuit device having a plurality of macroblocks, said device comprising:

a frequency multiplying interpolator, which includes a plurality of circuits each of which is for outputting a signal obtained by internally dividing a phase difference between two signals, for generating and outputting multiphase clocks obtained by frequency multiplying an input clock;

each of said macroblocks having a switch, to which the multiphase clocks output from said frequency multiplying interpolator are input, for outputting at least two clocks from among the multiphase clocks, and a phase adjusting interpolator, to which an output from said switch is input, for outputting a signal obtained by internally dividing the phase of said output; and a control circuit for controlling switching of the clock by said switch and varying an internal-division ratio of said phase adjusting interpolator.

42. The clock control circuit according to claim 4, wherein each of said timing-difference dividing circuits includes:

a logic circuit, to which first and second input signals are applied, for outputting result of a predetermined logical operation between the first and second input signals;

an N-channel MOS transistor connected between a first power supply and an internal node and having an output signal of said logic circuit applied thereto as a gate input;

a buffer circuit having an input terminal connected to the internal node for inverting an output logic value if a size relationship between potential of the internal node and a threshold value reverses; and P-channel MOS transistors connected between the internal node and ground and each having a signal obtained by inverting the first input signal applied thereto as a gate input and each being driven by a constant-current source, and P-channel MOS transistors connected between the internal node and ground and each having a signal obtained by inverting the second input signal applied thereto as a gate input and each being driven by a constant-current source;

a plurality of series circuits of serially connected switch elements and capacitors being connected in parallel between the internal node and ground;

capacitance applied to the internal node being decided by a cycle control signal supplied to a control terminal of each of said switch elements.

43. The clock control circuit according to any one of claims 1 to 3, wherein said phase adjusting interpolator includes:

an OR gate to which first and second input signals are applied;

a N-channel MOS transistor connected between a power supply and an internal node and having an output signal of said OR gate applied thereto as a gate input;

a buffer circuit having an input terminal connected to the internal node for inverting an output logic value if a size relationship between potential of the internal node and a threshold value reverses; and a plurality of series circuits being connected in parallel between the internal node and ground, each of said series circuits comprising an P-channel MOS transistor that has the first input signal applied thereto as a gate input and that is driven by a constant-current source, and a switch element turned on and off by a control signal from said control circuit;

a plurality of series circuits being connected in parallel between the internal node and ground, each of said series circuits comprising an P-channel MOS transistor that has the second input signal applied thereto as a gate input and that is driven by a constant-current source, and a switch element turned on and off by the control signal from said control circuit;

a plurality of series circuits being connected in parallel between the internal node and ground, each of said series circuits comprising a switch element and a capacitor;

capacitance applied to the internal node being decided by a cycle control signal connected to a control terminal of said switch element.

44. The clock control circuit according to any one of claims 1 to 3, wherein said phase adjusting interpolator includes:

a NOR gate to which first and second input signals are applied;

a N-channel MOS transistor connected between a power supply and an internal node and having an output signal of said NOR gate applied thereto as a gate input;

a buffer circuit having an input terminal connected to the internal node for inverting an output logic value if a size relationship between potential of the internal node and a threshold value reverses; and a plurality of series circuits being connected in parallel between the internal node and ground, each of said series circuits comprising an P-channel MOS transistor having a signal obtained by inverting the first input signal by a first inverting circuit applied thereto as a gate input and being driven by a constant-current source, and a switch element turned on and off by a control signal from said control circuit;

a plurality of series circuits being connected in parallel between the internal node and ground, each of said series circuits comprising an P-channel MOS transistor having a signal obtained by inverting the second input signal by a second inverting circuit applied thereto as a gate input and being driven by a constant-current source, and a switch element turned on and off by the control signal from said control circuit;

a plurality of series circuits being connected in parallel between the internal node and ground, each of said series circuits comprising a switch element and a capacitor;

capacitance applied to the internal node being decided by a cycle control signal connected to a control terminal of said switch element.

* * * * *